(12) United States Patent
Kim et al.

(10) Patent No.: US 12,349,360 B2
(45) Date of Patent: Jul. 1, 2025

(54) VERTICAL MEMORY DEVICE

(71) Applicant: Samsung Electronics Co., Ltd., Suwon-si (KR)

(72) Inventors: Jun Hyoung Kim, Seoul (KR); Kwang Soo Kim, Hwaseong-si (KR); Seok Cheon Baek, Hwaseong-si (KR); Geun Won Lim, Yongin-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 635 days.

(21) Appl. No.: 17/569,497

(22) Filed: Jan. 5, 2022

(65) Prior Publication Data

US 2022/0130851 A1    Apr. 28, 2022

Related U.S. Application Data

(62) Division of application No. 16/270,570, filed on Feb. 7, 2019, now Pat. No. 11,264,401.

(30) Foreign Application Priority Data

Aug. 16, 2018  (KR) .................. 10-2018-0095582

(51) Int. Cl.
*H10B 43/50* (2023.01)
*H10B 43/10* (2023.01)
(Continued)

(52) U.S. Cl.
CPC ............. *H10B 43/50* (2023.02); *H10B 43/10* (2023.02); *H10B 43/27* (2023.02); *H10B 43/35* (2023.02); *H10B 43/40* (2023.02)

(58) Field of Classification Search
CPC ......... H10B 43/10; H10B 43/27; H10B 43/40
See application file for complete search history.

(56) References Cited

U.S. PATENT DOCUMENTS

| | | | |
|---|---|---|---|
| 7,915,667 B2 | 3/2011 | Knoefler et al. | |
| 8,791,523 B2 | 7/2014 | Iino et al. | |

(Continued)

FOREIGN PATENT DOCUMENTS

| | | |
|---|---|---|
| CN | 107017258 A | 8/2017 |
| CN | 107771356 A | 3/2018 |

(Continued)

*Primary Examiner* — Zandra V Smith
*Assistant Examiner* — Molly K Reida
(74) *Attorney, Agent, or Firm* — Renaissance IP Law Group LLP

(57) ABSTRACT

A vertical memory device includes a substrate having a peripheral circuit structure, first gate patterns having first gate pad regions stacked vertically from the substrate, vertical channel structures penetrating the first gate patterns, first gate contact structures each extending vertically to a corresponding first gate pad region, mold patterns stacked vertically from the substrate, the mold patterns each being positioned at the same height from the substrate with a corresponding gate pattern, peripheral contact structures penetrating the mold patterns to be connected to the peripheral circuit structure, a first, block separation structure disposed between the first gate contact structures and the peripheral contact structures, and a first peripheral circuit connection wiring extending across the first block separation structure to connect one of the first gate contact structures to one of the peripheral contact structures.

20 Claims, 47 Drawing Sheets

(51) Int. Cl.
  *H10B 43/27*     (2023.01)
  *H10B 43/35*     (2023.01)
  *H10B 43/40*     (2023.01)

(56) References Cited

U.S. PATENT DOCUMENTS

| | | |
|---|---|---|
| 8,933,502 B2 | 1/2015 | Higashitani et al. |
| 2011/0018050 A1 | 1/2011 | Fujiwara et al. |
| 2015/0129878 A1 | 5/2015 | Shin et al. |
| 2015/0372005 A1 | 12/2015 | Yon et al. |
| 2016/0163732 A1 | 6/2016 | Lim et al. |
| 2017/0148677 A1 | 5/2017 | Shin |
| 2017/0221813 A1 | 8/2017 | Kim |
| 2017/0250190 A1 | 8/2017 | Tanzawa et al. |
| 2017/0263613 A1 | 9/2017 | Murakoshi et al. |
| 2017/0263618 A1 | 9/2017 | Shimojo |
| 2017/0263625 A1 | 9/2017 | Kikutani |
| 2017/0263638 A1 | 9/2017 | Okada |
| 2017/0323898 A1 | 11/2017 | Oh et al. |
| 2017/0323900 A1 | 11/2017 | Kanamori et al. |

FOREIGN PATENT DOCUMENTS

| | | |
|---|---|---|
| JP | 2017163057 A | 9/2017 |
| KR | 20150053628 A | 5/2015 |
| KR | 20160069903 A | 6/2016 |
| WO | 2017034646 A1 | 3/2017 |

VERTICAL MEMORY DEVICE

CROSS-REFERENCE TO RELATED APPLICATION

This U.S. non-provisional patent application is a divisional of U.S. patent application Ser. No. 16/270,570, filed on Feb. 7, 2019, which claims benefit of priority to Korean Patent Application No. 10-2018-0095582 filed on Aug. 16, 2018 in the Korean Intellectual Property Office, the disclosure of which is incorporated herein by reference in its entirety.

BACKGROUND

1. Field

The present inventive concept relates to a vertical memory device.

2. Description of Related Art

In order to increase the price competitiveness of products, there is growing demand for improvements in the degree of integration of semiconductor devices. In order to improve the degree of integration of semiconductor devices, a semiconductor device having a three-dimensional structure, in which gate patterns are stacked in a vertical direction of a substrate, has been developed. However, as the number of gate patterns to be stacked is gradually increased, unexpected problems may occur.

SUMMARY

According to an exemplary embodiment of the present inventive concept, a vertical memory device includes a substrate having a peripheral circuit structure, first gate patterns having first gate pad regions stacked vertically from the substrate, vertical channel structures penetrating the first gate patterns, first gate contact structures each extending vertically to a corresponding first gate pad region, mold patterns stacked vertically from the substrate, the mold patterns each being positioned at the same height from the substrate with a corresponding gate pattern, peripheral contact structures penetrating the mold patterns to be connected to the peripheral circuit structure, a first block separation structure disposed between the first gate contact structures and the peripheral contact structures, and a first peripheral circuit connection wiring extending across the first block separation structure to connect one of the first gate contact structures to one of the peripheral contact structures.

According to an exemplary embodiment of the present inventive concept, a vertical memory device includes a substrate including a first substrate, a second substrate, a peripheral interconnection structure disposed therebetween, and an intermediate insulating layer positioned at the same height with the second substrate from the first substrate, block separation structures each extending in a first horizontal direction, first stack block structures each including a first side region having multiple extended regions and a second side region having two extended regions, second stack block structures each including a first side region having two extended regions and a second side region having multiple extended regions, peripheral contact structures disposed between the two extended regions of each of the second stack block structures and between the two extended regions of each of the first stack block structures and gate contact structures disposed on the second side region of each of the second stack block structures and on the first side region of each of the first stack block structures. The first stack block structures and the second stack block structures are alternately arranged in a second horizontal direction crossing the first horizontal direction, each of the first stack block structures being disposed between two adjacent block separation structures and each of the second stack block structures being disposed between two adjacent block separation structures.

According to an exemplary embodiment of the present inventive concept, a vertical memory device includes a substrate having a peripheral circuit structure, gate patterns stacked vertically on each other from the substrate, a first block separation structure and a second block separation structure penetrating the gate patterns so that the gate patterns are separated into first gate patterns, third gate patterns and second gate patterns as listed, first gate contact structures each extending vertically to a corresponding first gate pattern of the first gate patterns, second gate contact structures each extending vertically on a corresponding second gate pattern of the second gate patterns, mold patterns stacked vertically from the substrate, peripheral contact structures penetrating the mold patterns to be connected to the peripheral circuit structure, a first peripheral circuit connection wiring extending across the first block separation structure to connect one of the first gate contact structures to one of the peripheral contact structures and a second peripheral circuit connection wiring extending across the second block separation structure to connect one of the second gate contact structures to one of the peripheral contact structures. The third gate patterns and Me mold patterns are disposed between the first block separation structure and the second block separation structure.

BRIEF DESCRIPTION OF DRAWINGS

The above and other aspects, features and other advantages of the present disclosure will be more clearly understood from the following detailed description, taken in conjunction with the accompanying drawings, in which.

DETAILED DESCRIPTION OF EXEMPLARY EMBODIMENTS

Figure 1:
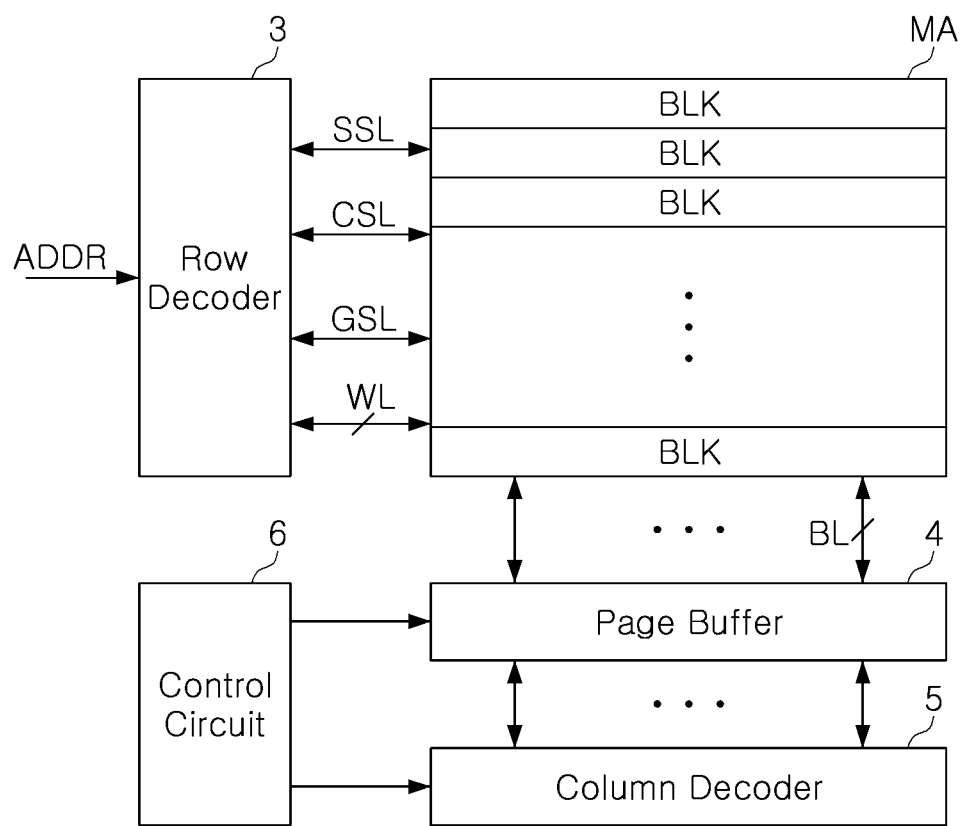
FIG. 1 is a schematic block diagram illustrating a semiconductor device according to an example embodiment.

With reference to FIG. 1, an example of a semiconductor device according to an example embodiment will be described. FIG. 1 is a schematic block diagram illustrating a semiconductor device according to an example embodiment.

Referring to FIG. 1, a semiconductor device 1 according to an example embodiment may include a memory array region MA, a row decoder 3, a page buffer 4, a column decoder 5, and a control circuit 6. The memory array region MA may include memory blocks BLK.

The memory array region MA may include memory cells arranged in a plurality of rows and a plurality of columns. The memory cells, included in the memory array region MA, may be electrically connected to the row decoder 3 through word lines WL, at least one common source line CSL, string select lines SSL, and at least one ground select line GSL, and may be electrically connected to the page buffer 4 and the column decoder 5 through bit lines BL.

In an example embodiment, among the memory cells, memory cells arranged on the same row may be connected to a single word line WL, and memory cells arranged on the same column may be connected to a single bit line BL.

The row decoder 3 may be commonly connected to the memory blocks BLK, and may provide a driving signal to word lines WL of the memory blocks BLK, selected according to a block select signal. For example, the row decoder 3 may receive address information ADDR from an external source, and may decode the address information ADDR, having been received, to determine a voltage provided to at least a portion of the word lines WL, the common source line CSL, the string select lines SSL, and the ground select line GSL, electrically connected to the memory blocks BLK.

The page buffer 4 may be electrically connected to the memory array region MA through the bit lines BL. The page buffer 4 may be connected to a bit line BL selected according to address decoded by the column decoder 5. The page buffer 4 may store data to be stored in memory cells, or may sense data stored in the memory cell according to an operation mode. For example, the page buffer 4 may be operated as a writing driver circuit during a programming mode operation, and may be operated as a sense amplifier circuit during a reading mode operation. The page buffer 4 may receive power (for example, voltage or current) from a control logic, and may provide the power to the bit line BL, having been selected.

The column decoder 5 may provide a data transmission path between the page buffer 4 and an external device (for example, a memory controller). The column decoder 5 may decode address input from an external source, and may thus select one among the bit lines BL.

The column decoder 5 may be commonly connected to the memory blocks BLK, and may provide data information to the bit lines BL of the memory block BLK, selected according to a block select signal.

The control circuit 6 may control the overall operation of the semiconductor device 1. The control circuit 6 may receive a control signal and an external voltage, and may be operated according to a control signal. The control circuit 6 may include a voltage generator for generating voltages (for example, a programming voltage, a reading voltage, an erasing voltage, or the like) required for internal operations using an external voltage. The control circuit 6 may control reading, writing, and/or erasing operations in response to the control signals.

Figure 2:
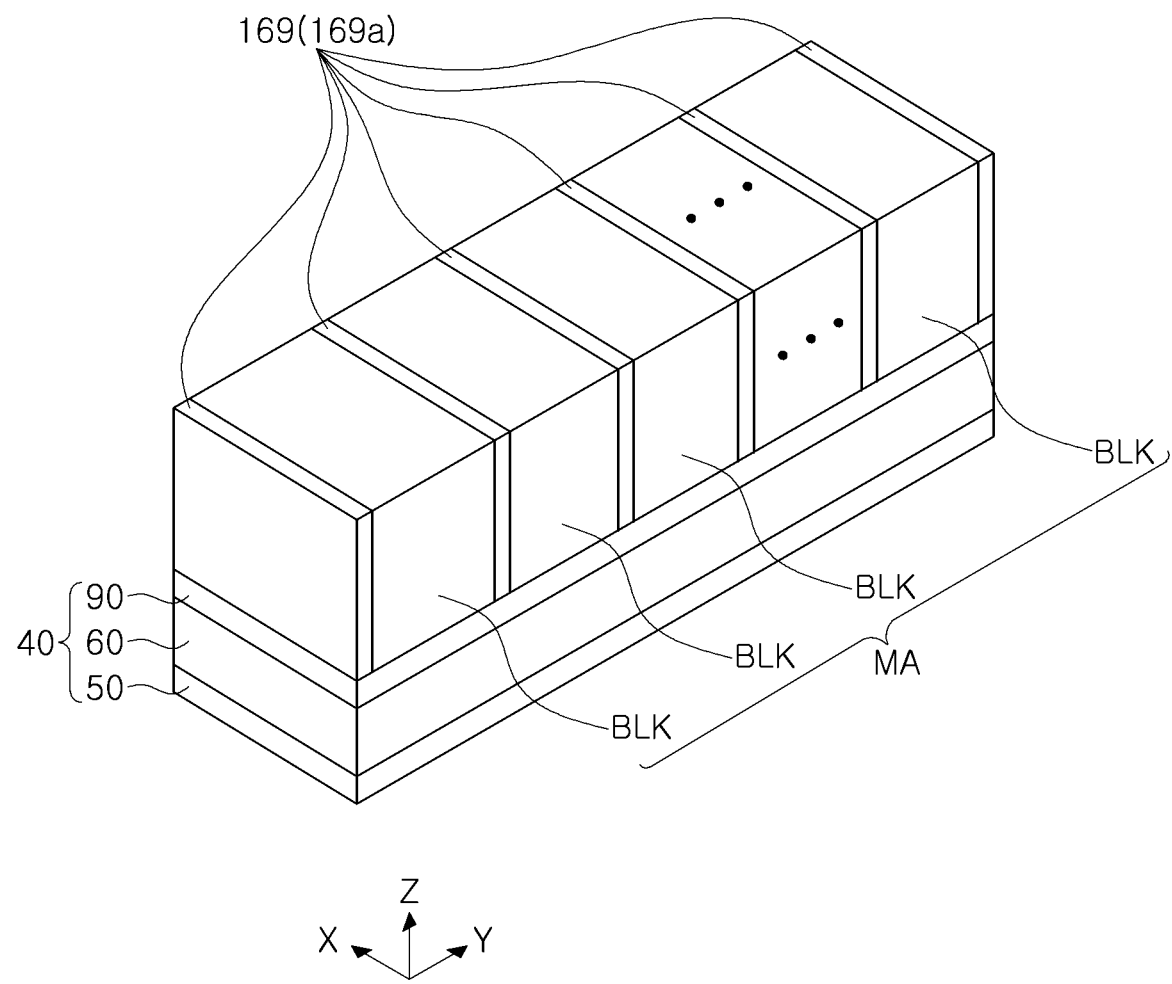
FIG. 2 is a schematic drawing illustrating a semiconductor device according to an example embodiment.

FIG. 2 is a schematic drawing illustrating memory blocks BLK in the memory array region MA illustrated in FIG. 1, in the semiconductor device 1 according to an example embodiment.

Referring to FIG. 2, the plurality of memory blocks BLK of the memory array region MA, illustrated in FIG. 1, may be arranged sequentially to be extended in a first horizontal direction X and to be spaced apart from each other in a second horizontal direction Y. The memory array region MA including the memory blocks BLK may be disposed on a lower structure 40.

The first horizontal direction X and the second horizontal direction Y may be parallel to an upper surface of the lower structure 40, while the second horizontal direction Y may be a direction perpendicular to the first horizontal direction X.

Separation structures 169 may be disposed on the lower structure 40. The separation structures 169 may include block separation structures 169*a* allowing the memory blocks BLK to be spaced apart from each other. Each of the memory blocks BLK may be disposed between a pair of block separation structures 169*a*, adjacent to each other. Thus, the memory blocks BLK may be spaced apart or separated from each other in the second horizontal direction Y by the block separation structures 169*a*.

Figure 3:
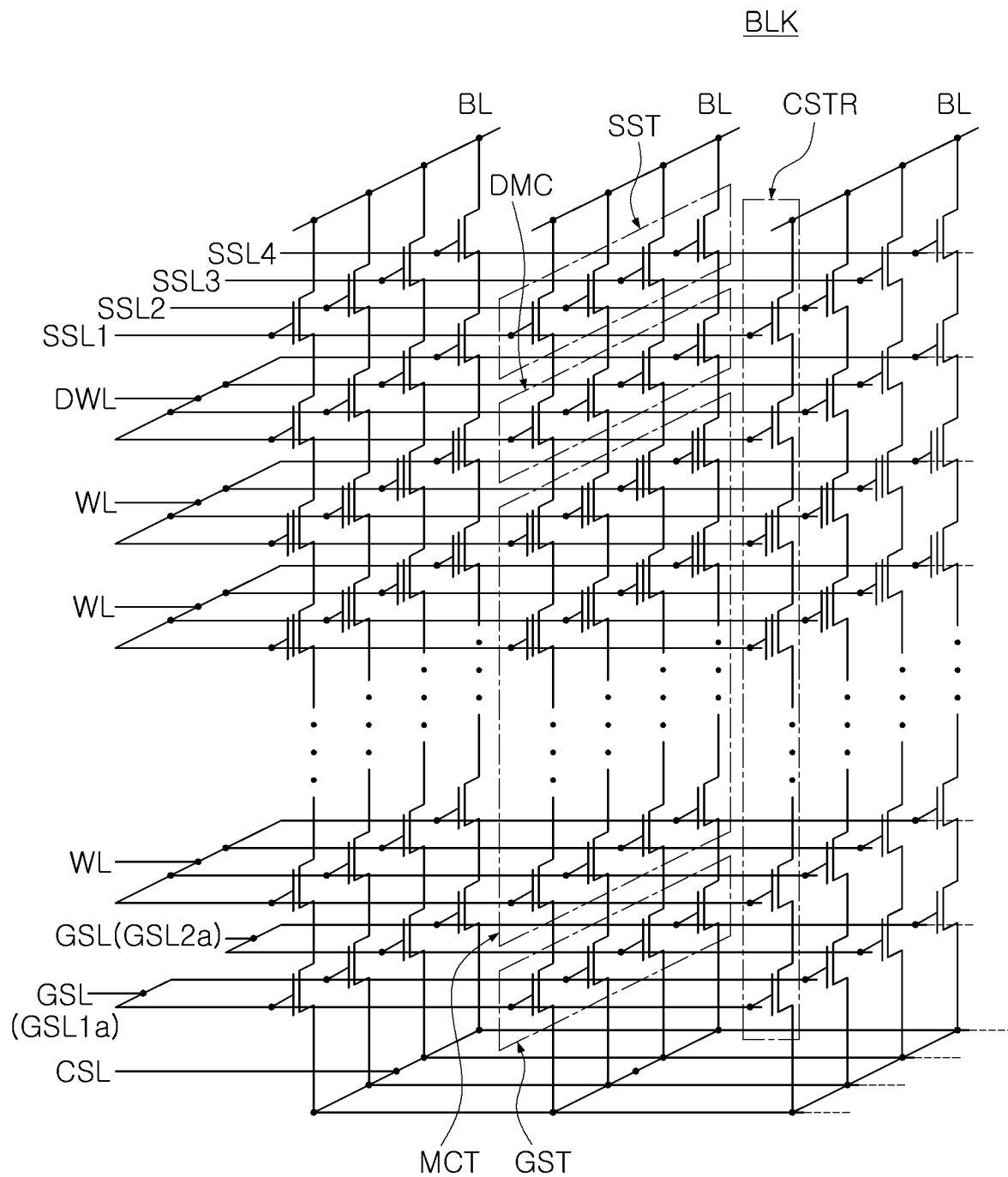
FIG. 3 is a circuit diagram conceptually illustrating a portion of a memory cell array of a semiconductor device according to an example embodiment.

Then, with reference to FIG. 3, an example of a circuit in the memory blocks BLK of the memory array region MA of the semiconductor device 1, illustrated in FIGS. 1 and 2, will be described. FIG. 3 is a circuit diagram illustrating a circuit of a memory block BLK among memory blocks BLK of the memory array region MA.

Referring to FIG. 3, the memory block BLK according to an example embodiment may include a common source line CSL, bit lines BL, and a plurality of cell strings CSTR disposed between the common source line CSL and the bit lines BL. The plurality of cell strings CSTR may be connected to each of the bit lines BL in parallel. The plurality of cell strings CSTR may be commonly connected to the common source line CSL. Each of the plurality of cell strings CSTR may include a lower select transistor GST, a plurality of memory cells MCT, and an upper select transistor SST, connected to in series.

In an example, each of the plurality of cell strings CSTR may include the dummy cell DMC. For example, the dummy cell DMC may be disposed between the upper select transistor SST and the plurality of memory cells MCT.

The memory cells MCT may be connected in series between the lower select transistor GST and the upper select transistor SST. Each of the memory cells MCT may include data storage regions capable of storing data.

The upper select transistor SST may be electrically connected to the bit lines BL, and the lower select transistor GST may be electrically connected to the common source line CSL.

The upper select transistor SST may be provided as a plurality of upper select transistors, and may be controlled by a plurality of string select lines SSL1, SSL2, SSL3, and SSL4. The memory cells MCT may be controlled by a plurality of word lines WL. The dummy cell DMC may be connected to a dummy word line DWL. The lower select transistor GST may be provided as a plurality of lower select transistors, and may be controlled by a ground select line GSL. The ground select line GSL may include a plurality of ground select lines GSL1a and GSL2a. The common source line CSL may be commonly connected to a source of the lower select transistor GST.

In an example, the upper select transistor SST may be a string select transistor, while the lower select transistor GST may be a ground select transistor.

In an example, the number of the plurality of string select lines SSL1, SSL2, SSL3, and SSL4 may be greater than that of a plurality of ground select lines GSL1a and GSL2a.

Figure 4:
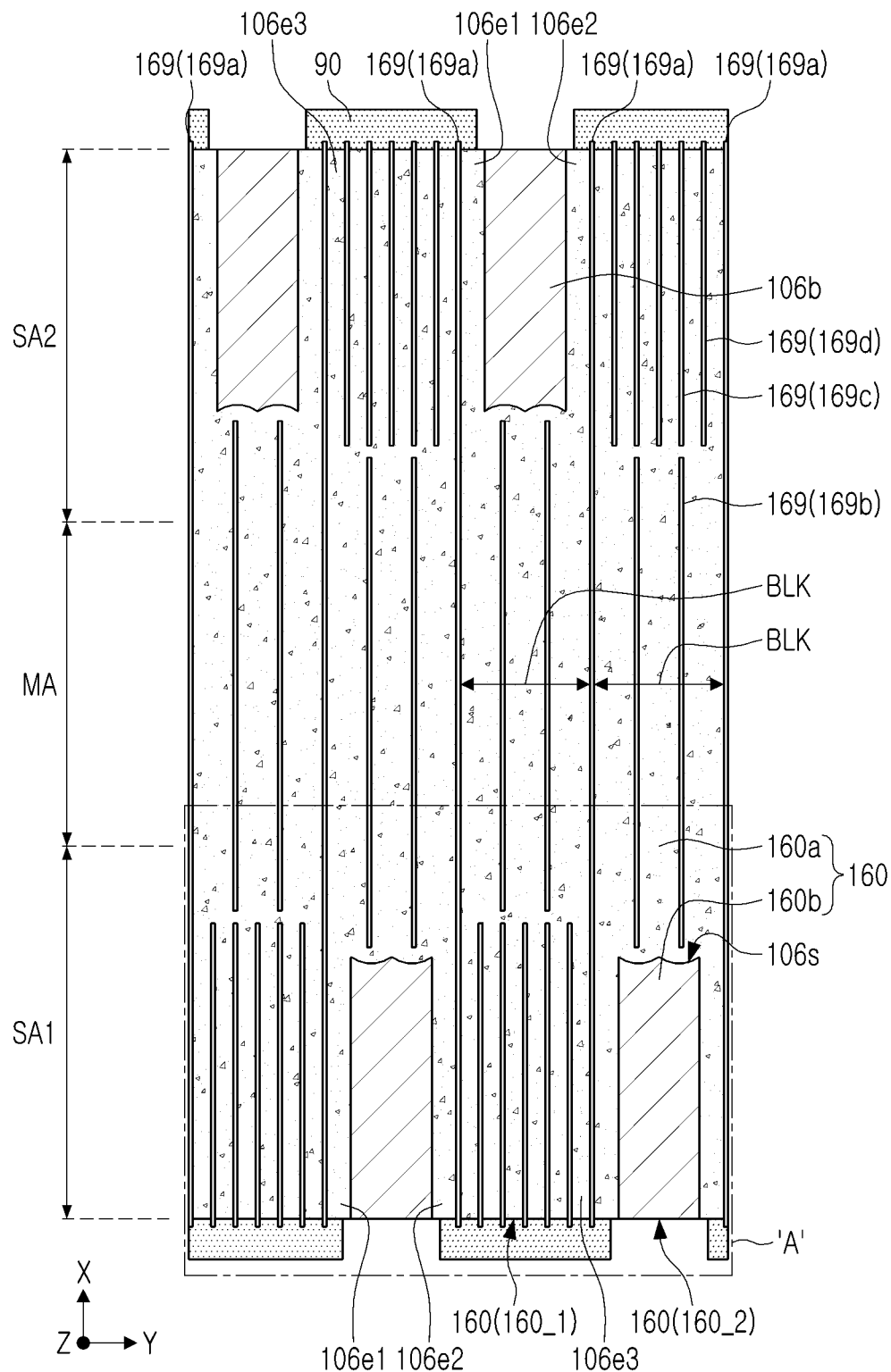
FIGS. 4-6, 7A to 7D and 8 are drawings illustrating a semiconductor device according to an example embodiment.
Figure 5:
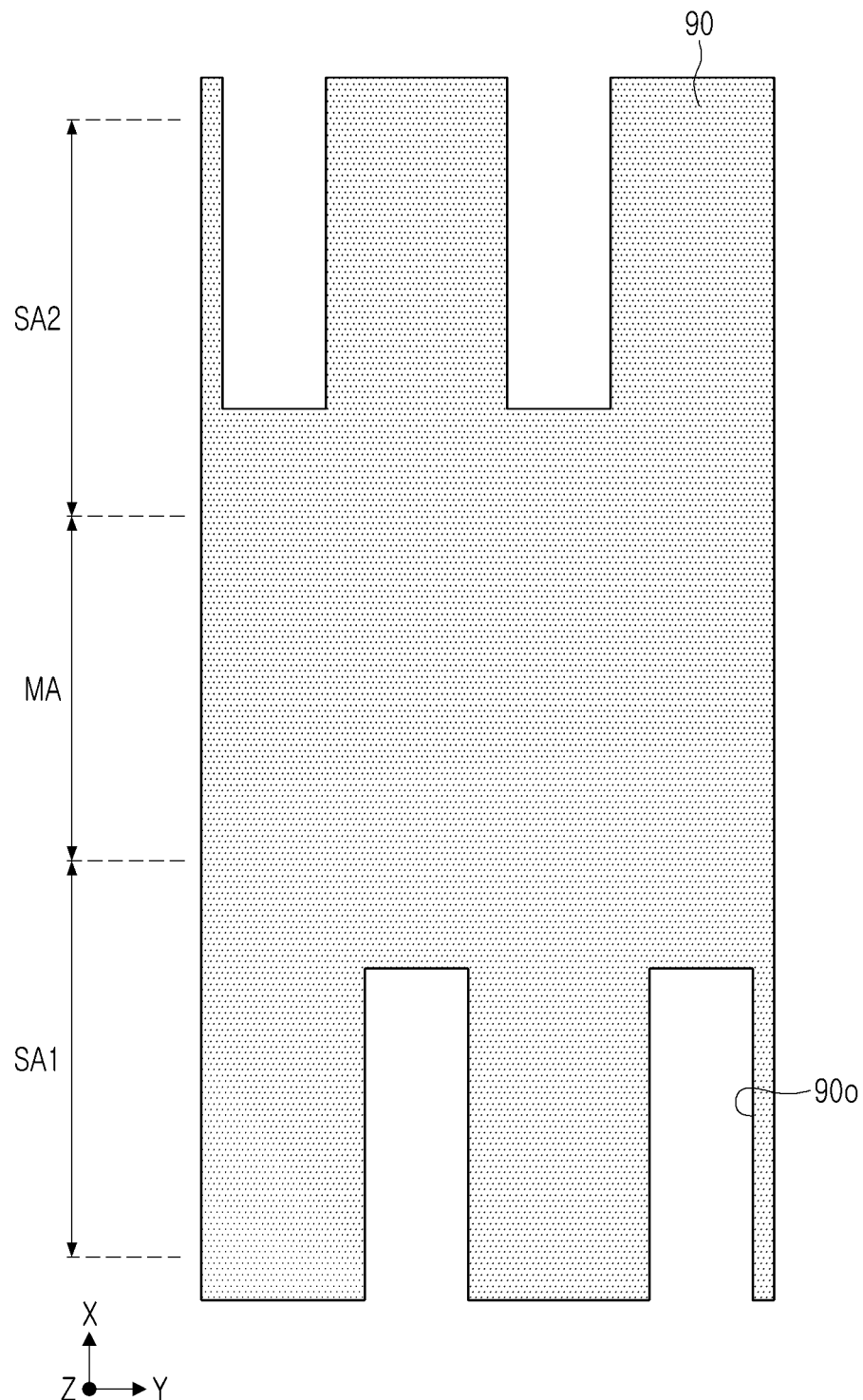
Figure 6:
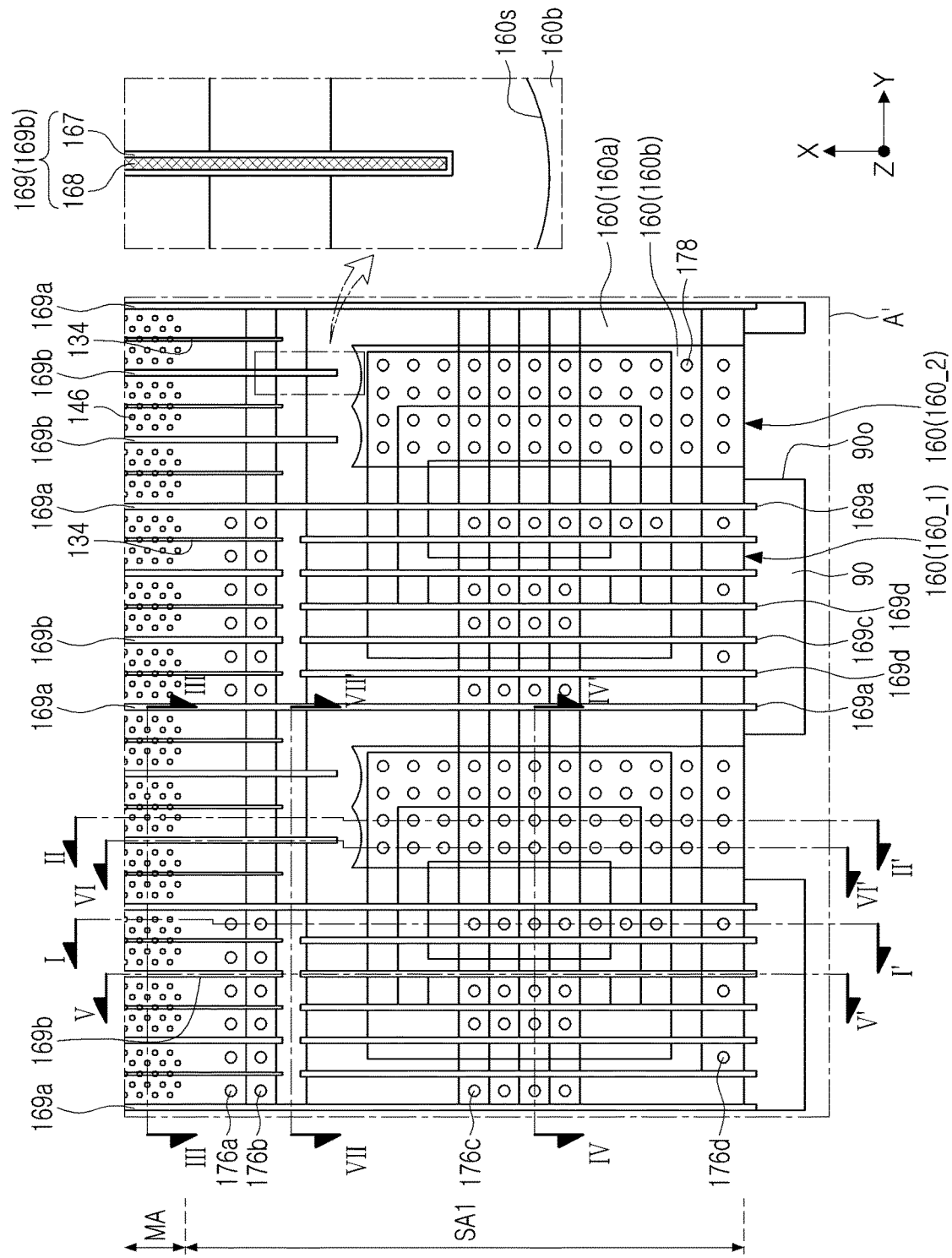
Figure 7A:
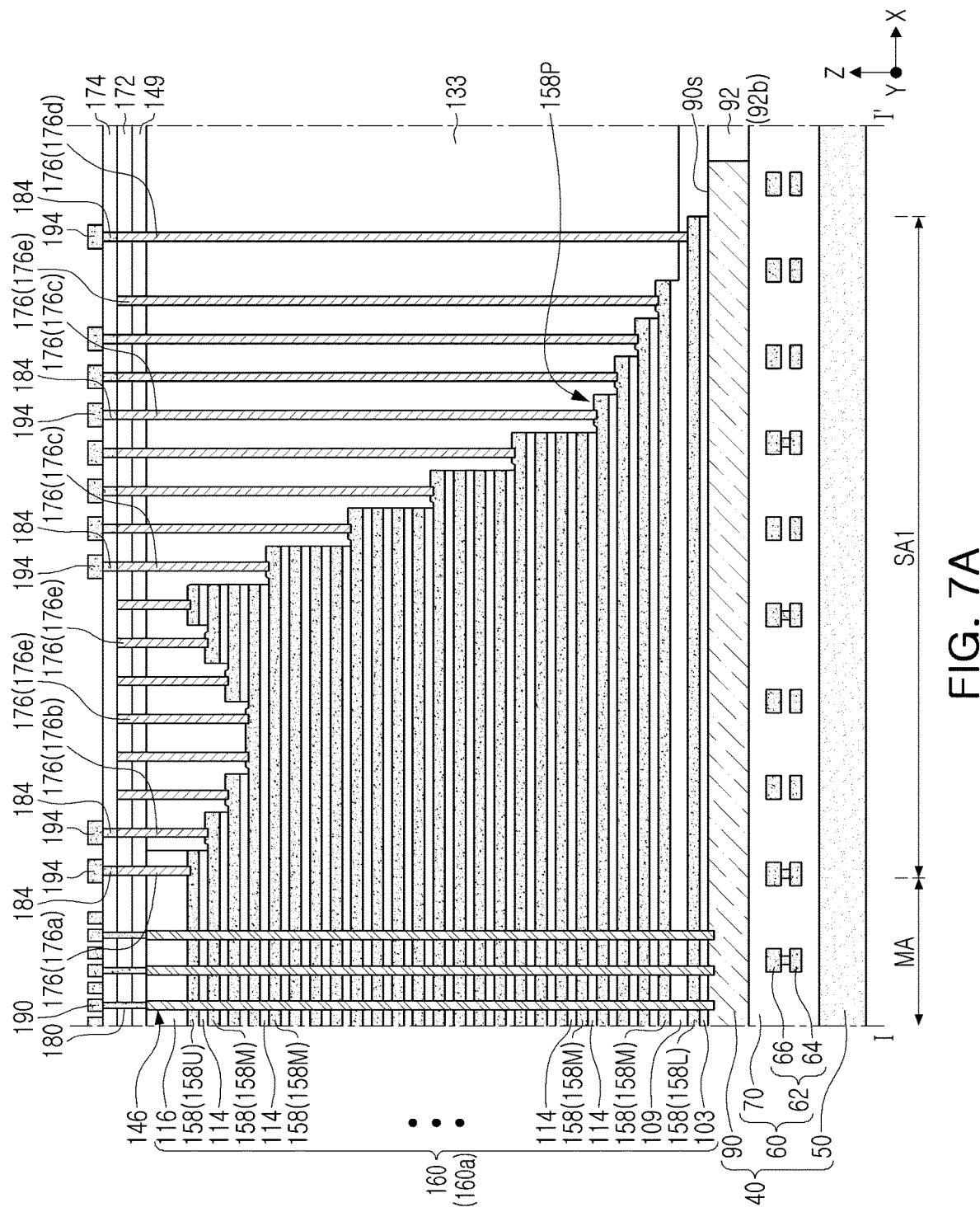
Figure 7B:
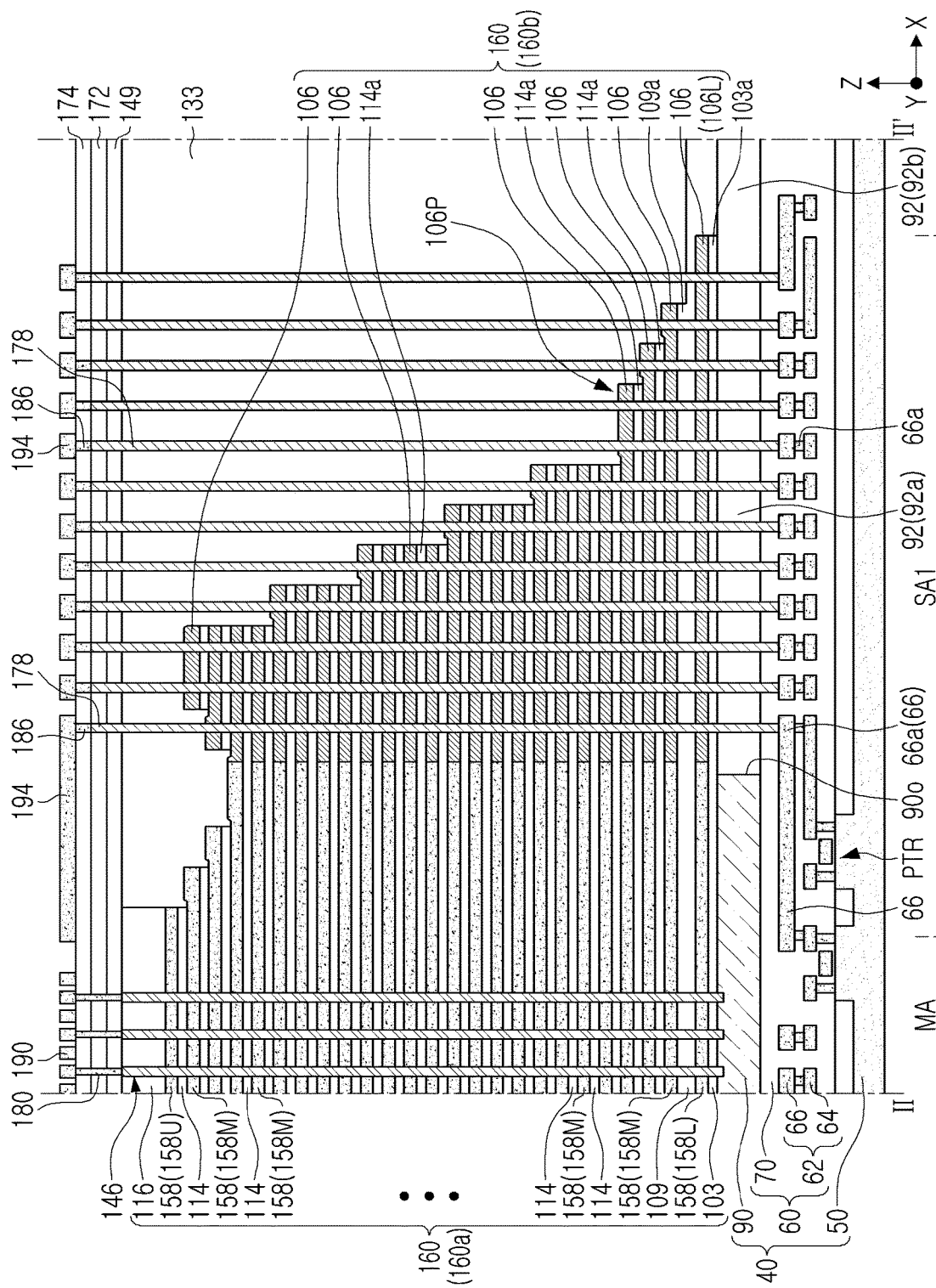
Figure 7C:
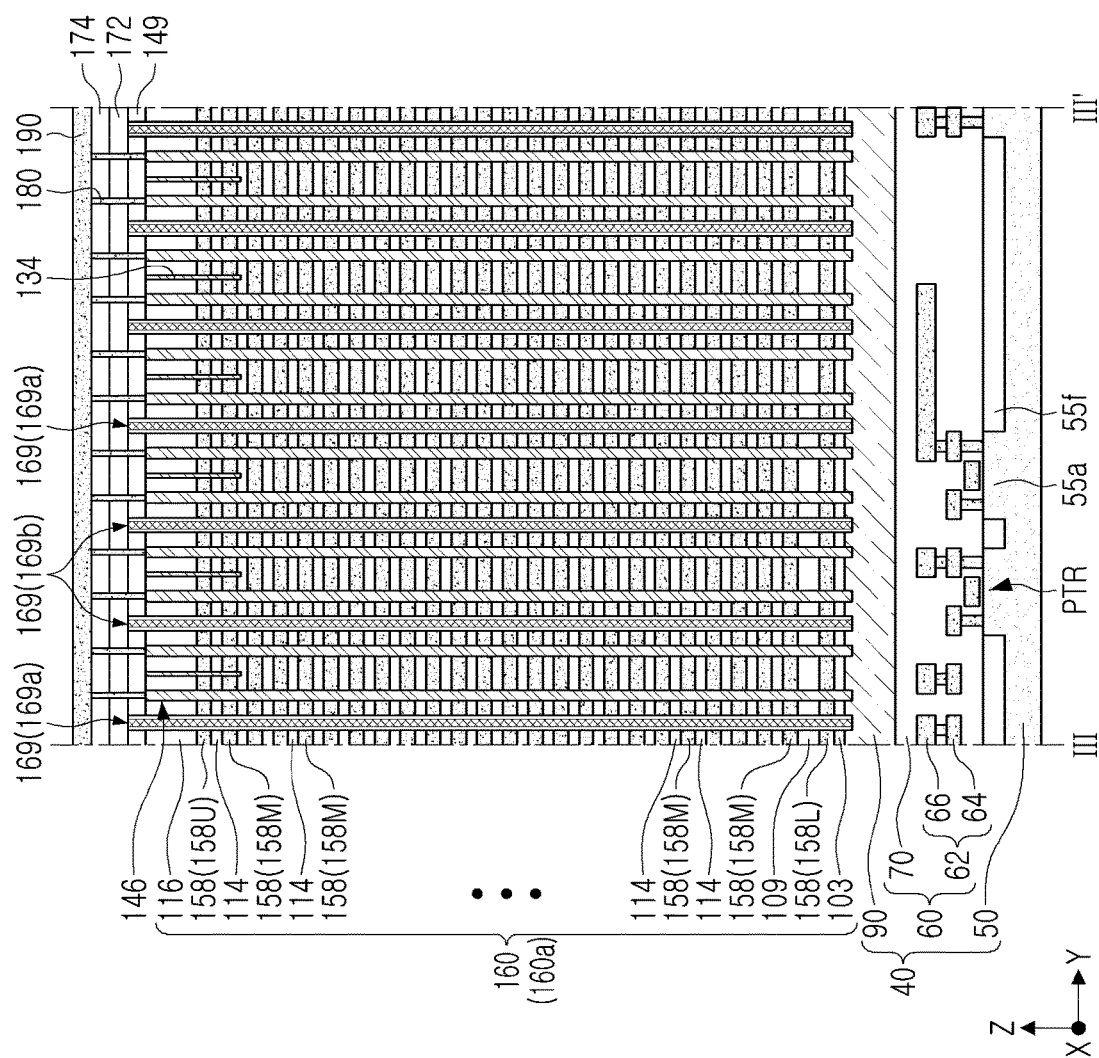
Figure 7D:
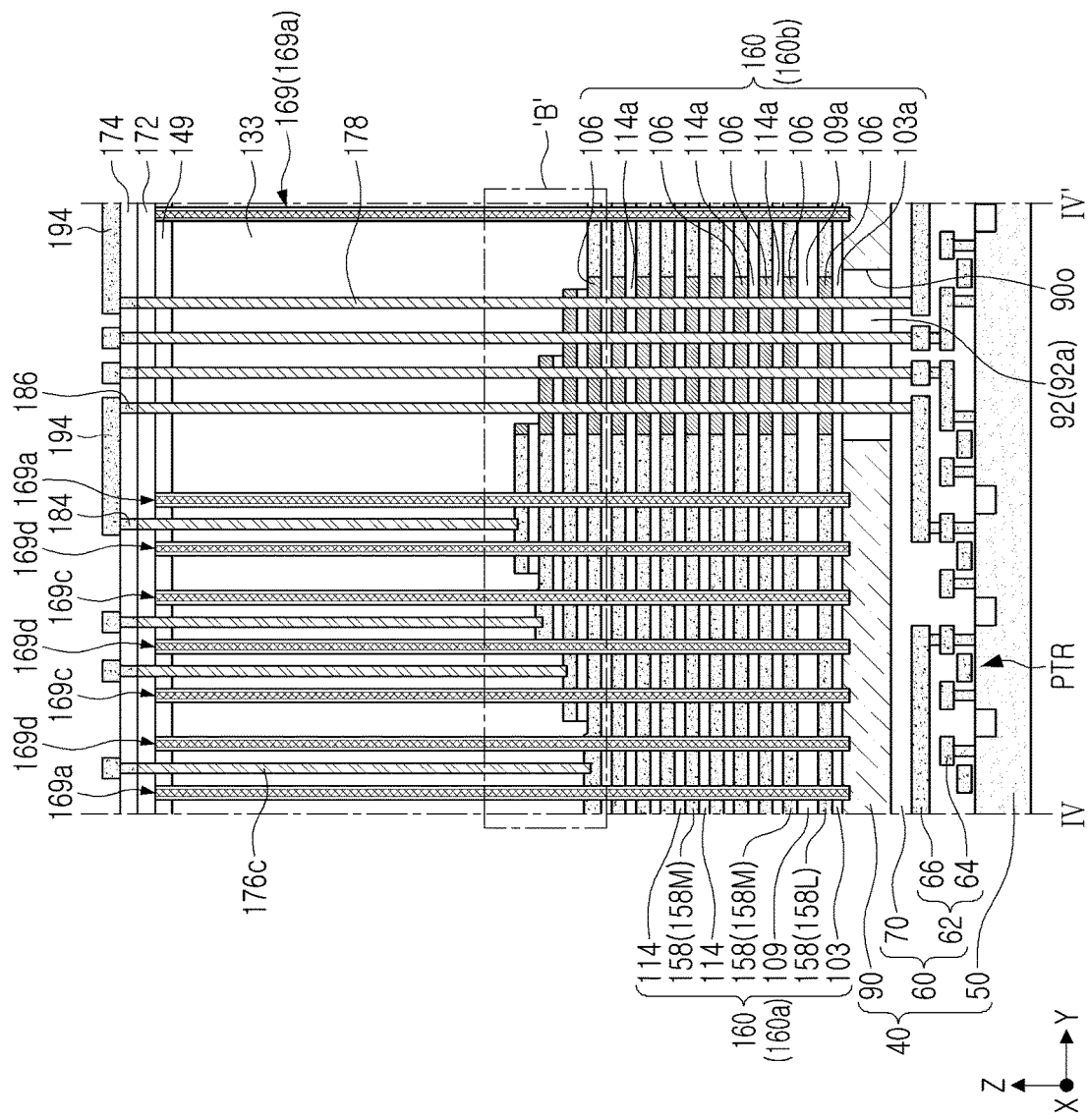
Figure 8:
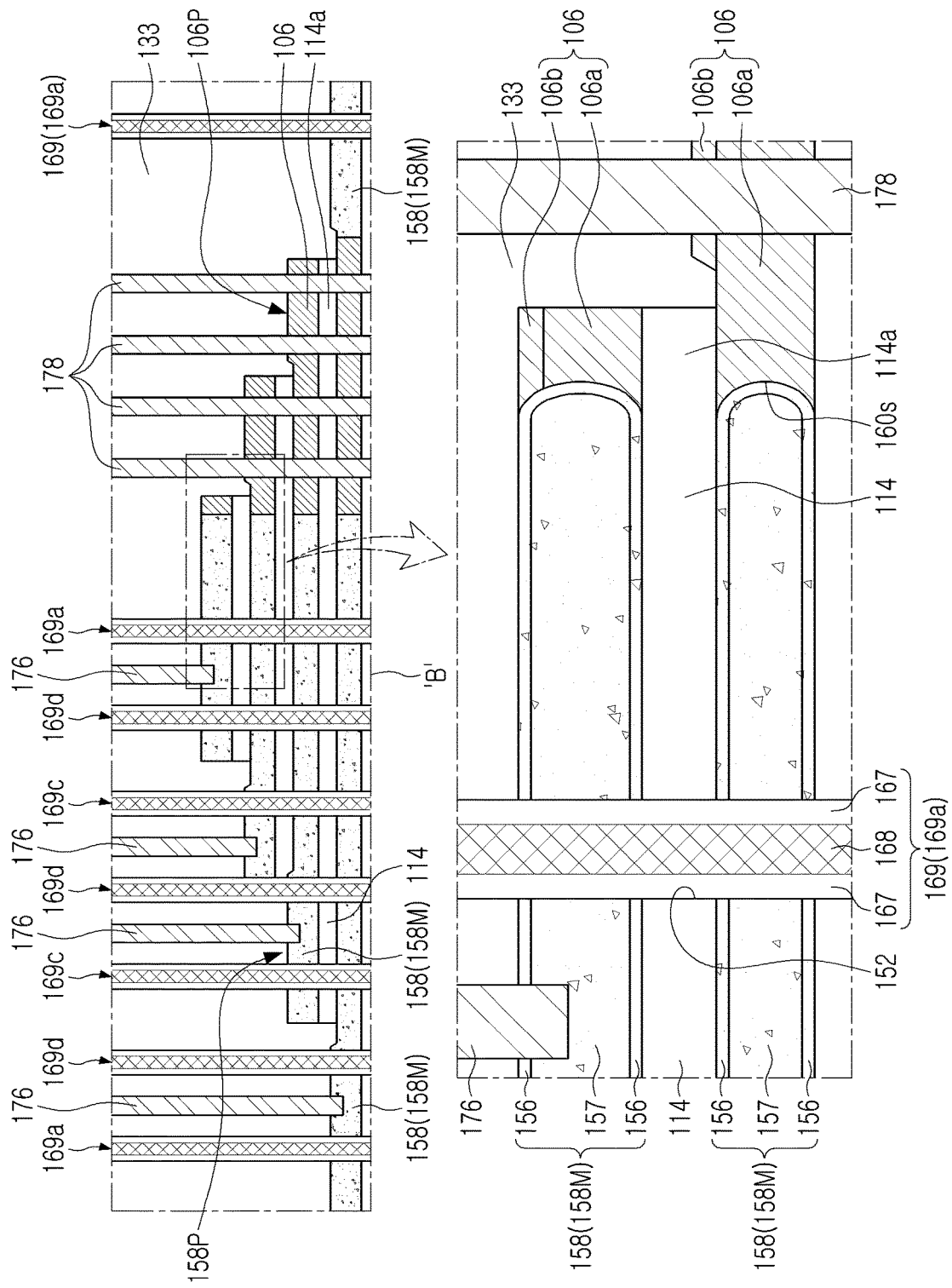

Then, a semiconductor device according to an example embodiment will be described with reference to FIGS. 4 to 8. In FIGS. 4 to 8, FIG. 4 is a plan view illustrating a semiconductor device according to an example embodiment, FIG. 5 is a plan view illustrating a portion of FIG. 4, FIG. 6 is a partially enlarged view enlarging a portion indicated by 'A' of FIG. 4, FIG. 7A is a schematic cross-sectional view illustrating a region taken along line I-I' of FIG. 6, FIG. 7B is a schematic cross-sectional view illustrating a region taken along line II-II' of FIG. 6, FIG. 7C is a schematic cross-sectional view illustrating a region taken along line of FIG. 6, FIG. 7D is a schematic cross-sectional view illustrating a region taken along line IV-IV' of FIG. 6, and FIG. 8 is a partially enlarged cross-sectional view enlarging a portion indicated by 'B' of FIG. 7D.

Referring to FIGS. 4 to 8, a lower structure 40 may be provided. The lower structure 40 may include a semiconductor substrate. For example, the lower structure 40 may include a first substrate 50, a peripheral circuit structure 60 on the first substrate 50, a second substrate 90 on the peripheral circuit structure 60, and an intermediate insulating layer 92.

In an example, the first substrate 50 may be a semiconductor substrate which may be formed of a semiconductor material such as single crystal silicon, or the like.

In an example, the peripheral circuit structure 60 may include the row decoder 3, the page buffer 4, and/or the column decoder 5, illustrated in FIG. 1.

The peripheral circuit structure 60 may include peripheral transistors PTR, a peripheral interconnection structure 62 electrically connected to the peripheral transistors PTR, and a lower insulating layer 70 covering the peripheral transistors PTR and the peripheral interconnection structure 62. The peripheral transistors PTR may be formed on active regions 55a, which may be defined by field areas 55f in the first substrate 50.

The peripheral interconnection structure 62 may include peripheral wirings 64 and 66 having a multilayer structure. For example, the peripheral wirings 64 and 66 may include lower peripheral wirings 64, located relatively low, and upper peripheral wirings 66, located relatively high.

The upper peripheral wirings 66 of the peripheral interconnection structure 62 may further include peripheral contact pads 66a connecting the upper peripheral wirings 66 to the lower peripheral wirings 64. The peripheral wirings 64 and 66 may be formed of a metallic material such as tungsten, copper, or the like.

In an example, the second substrate 90 may be a semiconductor substrate which may be formed of a semiconductor material such as polysilicon, or the like. The second substrate 90 may have openings 90o.

The intermediate insulating layer 92 may be disposed at the same level as that of the second substrate 90. A portion 92a of the intermediate insulating layer 92 may fill the openings 90o of the second substrate 90, and a remaining portion 92b of the intermediate insulating layer 92 may be disposed to surround the second substrate 90.

The portion of the intermediate insulating layer 92, filling the openings 90o of the second substrate 90, is also referred to as a gap fill insulating layer 92a.

The semiconductor device 1 may include the memory array region MA including the memory blocks BLK, illustrated in FIGS. 1 and 2, that are disposed on the lower structure 40. The semiconductor device 1 may also include a first side region SA1 and a second side region SA2 that are disposed on the lower structure 40. The memory array region MA may be disposed between the first side region SA1 and the second side region SA2.

The separation structures 169 may be disposed on the lower structure 40. The separation structures 169 may include block separation structures 169a and auxiliary separation structures 169b, 169c, and 169d. Each of the separation structures 169 may have a line shape extended in the first horizontal direction X. The first horizontal direction X may be a direction parallel to an upper surface 90s of the second substrate 90 of the lower structure 40.

In an example, each of the separation structures 169 may include a separation pattern (168 of FIG. 8) and a separation spacer (167 of FIG. 8) on a side surface of the separation pattern (168 of FIG. 8). The separation pattern 168 may be formed of a conductive material, and the separation spacer 167 may be formed of an insulating material.

The block separation structures 169a may intersect the first side region SA1, the memory array region MA, and the second side region SA2. The block separation structures 169a may allow the memory blocks BLK, illustrated in FIG. 2, to be spaced apart and separated from each other. Thus, a single memory block BLK, illustrated previously, may be disposed between two block separation structures, adjacent to each other, among the block separation structures 169a.

The auxiliary separation structures 169b, 169c, and 169d are disposed between the block separation structures 169a, and may have a length shorter than that of the block separation structures 169a.

The auxiliary separation structures 169b, 169c, and 169d may include first auxiliary separation structures 169b extended to a portion of the first side region SA1 and the second side region SA2 while intersecting the memory array region MA, second auxiliary separation structures 169c located in a region of the first side region SA1 and the second side region SA2 and having an end portion opposing an end portion of the first auxiliary separation structures 169b, and third auxiliary separation structures 169d disposed in both sides of the second auxiliary separation structures 169*c*. The auxiliary separation structures 169*b*, 169*c*, and 169*d* may be spaced apart from each other. The second auxiliary separation structures 169*c* and the third auxiliary separation structure 169*d* may be referred to as a plurality of second auxiliary separation structures 169*c*/169*d* disposed in the first side region SA1 and the second side region SA2.

In an exemplary embodiment, the block separation structures 169*a* may be arranged at a first spacing. The first auxiliary separation structures 169*b* may be arranged between the two adjacent block separation structures 169*a* at a second spacing smaller than the first spacing. The second auxiliary separation structures 169*c*/169*d* may be arranged between the two adjacent block separation structures 169*a* at a third spacing smaller than the second spacing.

A stack structure 160 may be disposed on the lower structure 40. The stack structure 160 may be disposed on the second substrate 90 of the lower structure 40 and the gap fill insulating layer 92*a*. The stack structure 160 is disposed on the memory array region MA and may be extended to an interior of the first side region SA1 and the second side region SA2.

The stack structure 160 may include a plurality of stack block structures spaced apart from each other by the block separation structures 169*a*.

The block separation structures 169*a* may have a length greater than a length of the stack structure 160 in the first horizontal direction X, and may allow the stack structure 160 to be separated in the second horizontal direction Y. The second horizontal direction Y may be a direction parallel to an upper surface 90*s* of the second substrate 90 and perpendicular to the first horizontal direction X. For example, in the stack block structures separated from each other, a first stack block structure 160_1 of FIG. 4 and a second stack block structure 160_2 of FIG. 4 adjacent to each other may be spaced apart and separated from each other by a block separation structure 169*a* passing between the first stack block structure 160_1 and the second stack block structure 160_2. In an example, the first stack block structure 160_1 and the second stack block structure 160_2 may be alternately arranged along the second horizontal direction Y. The separation structures 169 in the first stack block structure 160_1 are arranged in a mirror image of the separation structures 169 in the second stack block structure 160_2. For example, the second stack block structure 160_2 may include two extended regions 106*e*1 and 106*e*2 in the first side region SA1 and a plurality of extended regions 106*e*3 in the second side region SA2. The first stack block structure 16_1 may include a plurality of extended regions 106*e*3 in the first sider region SA1 and two extended regions 106*e*1 and 106*e*2 in the second side region SA2.

Figure 19:
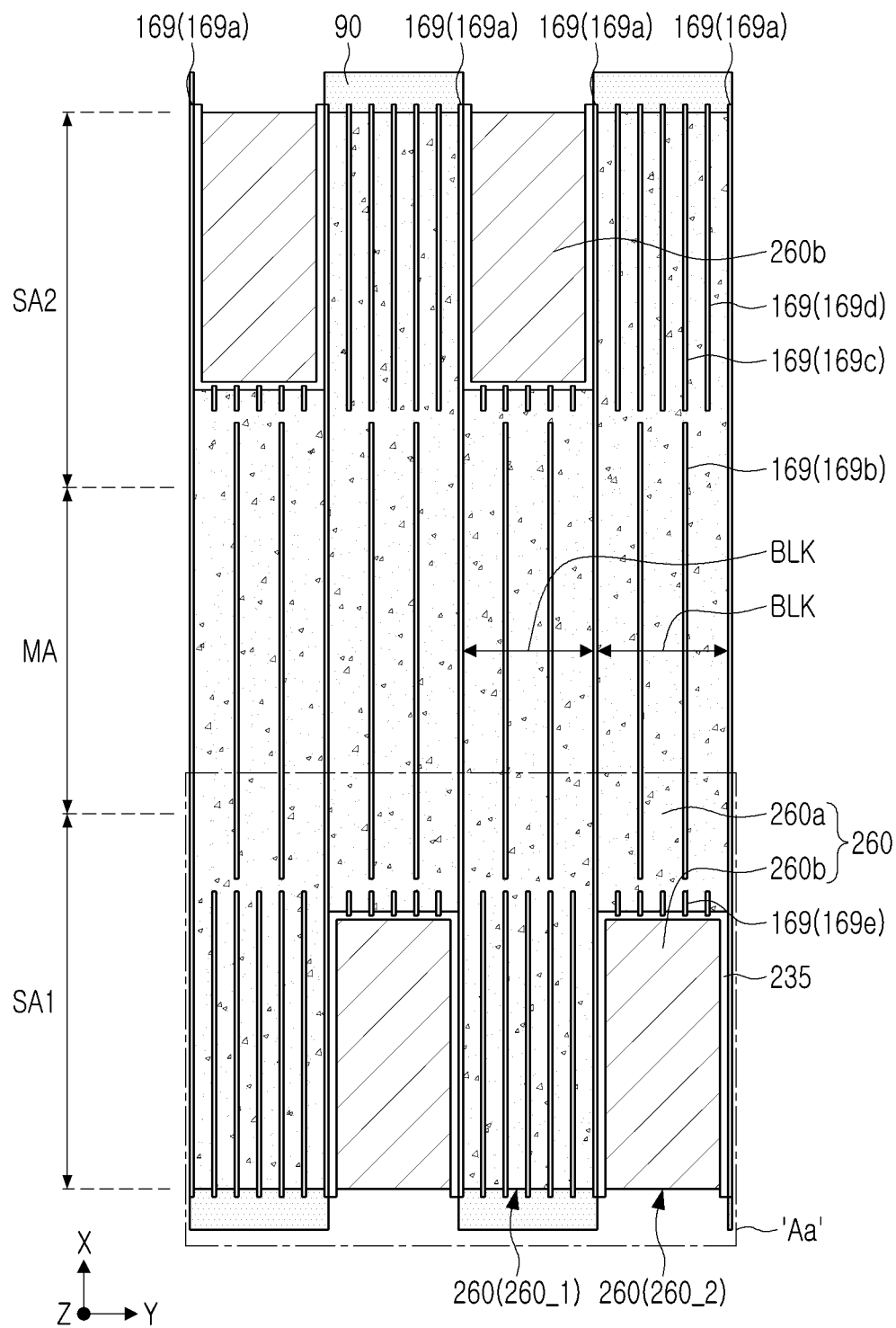
FIGS. 19 to 21, 22A and 22B are drawings illustrating a modified example of a semiconductor device according to an example embodiment.

In an example embodiment, the second stack block structure 160_2 may have a recessed surface 106*s* between the two extended regions 106*e*1 and 106*e*2 of the second stack block structure 160_2. For example, the recessed surface 106*s* may connect the two extended regions 106*e*1 and 106*e*2. The recessed surface 106*s* may be a rippled surface vertically extended. The present inventive concept is not limited thereto. For example, the recessed surface 106*s* may be a flat surface as shown in FIG. 19, for example.

A plurality of gate contact structures (176 in FIG. 6) may be disposed on the extended regions of the first stack block structure 160_1 and the second stack block structures 160_2. A plurality of peripheral contact structures (178 in FIG. 6) may be disposed between the two extended regions of the first stack block structure 160_1 and the second stack block structure 160_2. The gate contact structures and the peripheral contact structures will be described with reference to FIG. 6.

Hereinafter, the stack structure 160 may be separated into a plurality of stack block structures by the block separation structures 169*a*, so the stack structure 160 and the stack block structures 160 will be interchangeably used for the convenience of a description.

The auxiliary separation structures 169*b*, 169*c* and 169*d* may have a length less than a length of the stack structures 160 in the first horizontal direction X, and may pass through the stack structure 160 in a vertical direction Z.

The stack structure 160 may include a first stack region 160*a* and a second stack region 160*b*. The first stack region 160*a* may include first layers 103, 109, 114, and 116 as well as second layers 158, alternately and repeatedly stacked. The second stack region 160*b* may include third layers 103*a*, 109*a*, and 114*a* as well as fourth layers 106, alternately and repeatedly stacked.

In an example, each of the stack block structures 160, separated by the block separation structures 169*a*, may include the first stack region 160*a* and the second stack region 160*b*.

In an example, the second stack regions 160*b* may be arranged in a zigzag form, when viewed in a plane.

In an example, the second stack regions 160*b* may be disposed in a single side region of the first side region SA1 and the second side region SA2.

In an example, the remaining region of the stack structure 160 other than the second stack region 160*b* may be regarded as the first stack region 160*a*. The first stack region 160*a* may be disposed over the entirety of the memory array region MA, extending partially into the first side region SA1 and the second side region SA2.

The first stack region 160*a* may be in contact with the separation structures 169, while the second stack region 160*b* may be spaced apart from the separation structures 169.

Each of the stack block structures 160 may include pad regions 158P and 106P arranged in a staircase in the first side region SA1 and the second side region SA2. The staircase may be referred to as a staircase structure. The first side region SA1 and the second side region SA2 may be a region in which the pad regions 158P and 106P arranged in a staircase are located. The pad regions 158P and 106P may include gate pad regions 158P and dummy pad regions 106P. For example, the first stack block structure 160_1, as shown in FIG. 7A, includes gate pad regions 158P arranged in a staircase in the first side region SA1, and the second stack block structure 160_2, as shown in FIG. 7B, includes dummy pad regions 106P arranged in a staircase in the first side region SAL In this case, the first stack block structure 160_1 includes dummy pad regions 106P arranged in a staircase in the second side region SA2, and the second stack block structure 160_2 includes the gate pad regions 158P arranged in a staircase in the second side region SA2.

When a height of one first layer and one second layer, vertically adjacent to each other, is referred to as a height of a single staircase, a form of a staircase of the pad regions 158P and 106P may include a form of a staircase lowered by a height of a single staircase, a form of a staircase increased by a height of a single staircase, a form of a staircase lowered by a height of a plurality of staircases (e.g., four staircases), and a form of a staircase lowered by a height of a single staircase, in the first horizontal direction X away from the memory array region MA, when viewed on a cross section as illustrated in FIGS. 7A and 7B. A form of a staircase of the pad regions 158P and 106P may be a form of a staircase lowered by a height of a single staircase from a staircase to both sides thereof, when viewed as a cross section, as illustrated in FIG. 7D, that is, in the second horizontal direction Y. In the pad regions 158P and 106P, the gate pad regions 158P and the dummy pad regions 106P may provide the form of a staircase, described previously.

The inventive concept is not limited to the form of a staircase of the pad regions 158P and 106P illustrated in FIGS. 6, 7A, 7B, and 7D. For example, the inventive concept may include all forms of a staircase of the pad regions 158P and 106P which may be provided in various forms.

In an example, the second layers 158 may be gate patterns. For example, the second layers 158 may be stacked while being spaced apart from each other in a vertical direction Z in the memory array region MA on the lower structure 40, and may be extended to an interior of the first side region SA1 and the second side region SA2 on the lower structure 40. The vertical direction Z may be a direction perpendicular to an upper surface of the lower structure 40, that is, an upper surface 90s of the second substrate 90.

In an example, the second layers 158 may include a lowermost layer 158L, an uppermost layer 158U, and intermediate layers 158M between the lowermost layer 158L and the uppermost layer 158U.

The lowermost layer 158L may be referred to as a 'lowermost gate pattern,' the uppermost layer 158U may be referred to as an 'uppermost gate pattern,' and the intermediate layers 158M may be referred to as 'intermediate gate patterns'.

In an example, each of the intermediate gate patterns 158M may have a thickness increased in the gate pad regions 158P. For example, the intermediate gate patterns 158M may have a first thickness in the memory array region MA, may be extended at the first thickness to an interior of the first side region SA1 and the second side region SA2, and may have a second thickness, greater than the first thickness, in the gate pad regions 158P.

In an example, each of the second layers 158 may include a first material layer 156 of FIG. 8 and a second material layer 157 of FIG. 8, different from each other. In an example, the first material layer 156 may be formed of a dielectric material such as aluminum oxide, or the like, while the second material layer 157 may be formed of a conductive material including one or more of doped silicon, a metal nitride (e.g., TiN), and a metal (e.g., W). The first material layer 156 may be extended to a first side surface of a portion of the second material layer 157 while covering an upper surface and a lower surface of the second material layer 157. A second side surface of the second material layer 157, opposing the separation structures 169, may not be covered by the first material layer 156.

The first layers 103, 109, 114, and 116 may be interlayer insulating layers. For example, the first layers 103, 109, 114, and 116, which may be interlayer insulating layers, may include a lowermost interlayer insulating layer 103, a lower interlayer insulating layer 109, intermediate interlayer insulating layers 114, and an upper interlayer insulating layer 116. The first layers 103, 109, 114, and 116 may be formed of silicon oxide.

The lowermost interlayer insulating layer 103 may be disposed on the lower structure 40 and may be disposed below the lowermost gate pattern 158L. The lower interlayer insulating layer 109 is disposed on the lowermost interlayer insulating layer 103 while covering the lowermost gate pattern 158L, and may be disposed below an intermediate gate pattern in a lowermost portion among the intermediate gate patterns 158M. Each of the intermediate interlayer insulating layers 114 may be disposed between two gate patterns spaced apart from each other in the vertical direction Z among intermediate gate patterns 158M and the uppermost gate pattern 158U located above the lowermost gate pattern 158L. The upper interlayer insulating layer 116 may be disposed on the uppermost gate pattern 158U.

In an example as shown in FIG. 8, each of fourth layers 106 may include a base 106a and a protruding portion 106b. The fourth layers 106 may also be referred to as mold patterns 106. The protruding portion 106b may be disposed on the base 106a in the dummy pad regions 106P of the fourth layers 106 arranged in the form of a staircase. Thus, the protruding portions 106b of the fourth layers 106 may be disposed in the pad regions 106P, and thus need not overlap each other. The fourth layers 106 may be formed of an insulating material such as silicon nitride. For example, the base 106a and the protruding portion 106b may be formed of silicon nitride.

In an example, among the second layers 158 and the fourth layers 106, second layers 158 and fourth layers 106, positioned at the same height and opposing each other, may be in contact with each other and form a boundary surface 160s.

In an example, among the second layers 158 and the fourth layers 106, second layers 158 and fourth layers 106, positioned at the same height and opposing each other, may have the same thickness.

In an example, the second layers 158 and the fourth layers 106 may be formed of different materials.

In an example, among the first layers 103, 109, 114, and 116 as well as the third layers 103a, 109a, and 114a, the first layers 103, 109, and 114 as well as the third layers 103a, 109a, and 114a, positioned at the same height and opposing each other, may be continuously connected without a boundary surface and integrally provided. Thus, the first layers 103, 109, 114, and 116 as well as the third layers 103a, 109a, and 114a may be formed of the same material, for example, silicon oxide. Each of the first layers 103, 109, 114 and 116 and each of the third layers 103a, 109a and 114a positioned at the same height may be of the same layer.

In an example, among the first layers 103, 109, 114, and 116 as well as the third layers 103a, 109a, and 114a, the first layers 103, 109, and 114 as well as the third layers 103a, 109a, and 114a, positioned at the same height and opposing each other, may have the same thickness.

A first capping insulating layer 133, coplanar with the upper interlayer insulating layer 116 and covering the stack structure 160 of the first side region SA1 and the second side region SA2, may be provided.

A second capping insulating layer 149, a third capping insulating layer 172, and a fourth capping insulating layer 174, sequentially stacked on the upper interlayer insulating layer 116 and the first capping insulating layer 133, may be provided. The first to fourth capping insulating layers 133, 149, 172, and 174 may be formed of silicon oxide.

Insulating patterns 134 passing through and intersecting the uppermost gate pattern 158U of the second layers 158 may be provided as shown in FIGS. 6 and 7C. In an example, the insulating patterns 134 may be extended downwardly while passing through the uppermost gate pattern 158U, and may pass through and intersect an intermediate gate pattern located directly below the uppermost gate pattern 158U of the intermediate gate patterns 158M. Thus, the uppermost gate pattern 158U and an intermediate gate pattern 158M directly below the uppermost gate pattern 158U may be spaced apart and separated from each other in the second horizontal direction Y by the separation structures 169 and the insulating patterns 134. As described above, the uppermost gate pattern 158U and the intermediate gate pattern 158M directly below the uppermost gate pattern 158U, separated by separation structures 169 and the insulating patterns 134, may be the string select lines SSL, described previously.

When an intermediate gate pattern located in an uppermost portion among the intermediate gate patterns 158M is the string select line described above, the remaining intermediate gate patterns 158M may include the word lines WL and the dummy word line DWL, described above. For example, among the intermediate gate patterns 158M, an intermediate gate pattern directly below an intermediate gate pattern, which is located in an uppermost portion and may be a string select line, as well as an intermediate gate pattern located in a lowermost portion, may be a dummy word line DWL, while the remaining intermediate gate patterns may be the word lines WL, described above. The lowermost gate pattern 158L may be a ground select line GSL, described above.

Thus, the uppermost gate pattern 158U among the second layers 158 may form the string select line SSL, the intermediate gate patterns 158M among the second layers 158 may form the word lines WL, and the lowermost gate pattern 158L of the second layers 158 may form the ground select line GSL.

Figure 9:
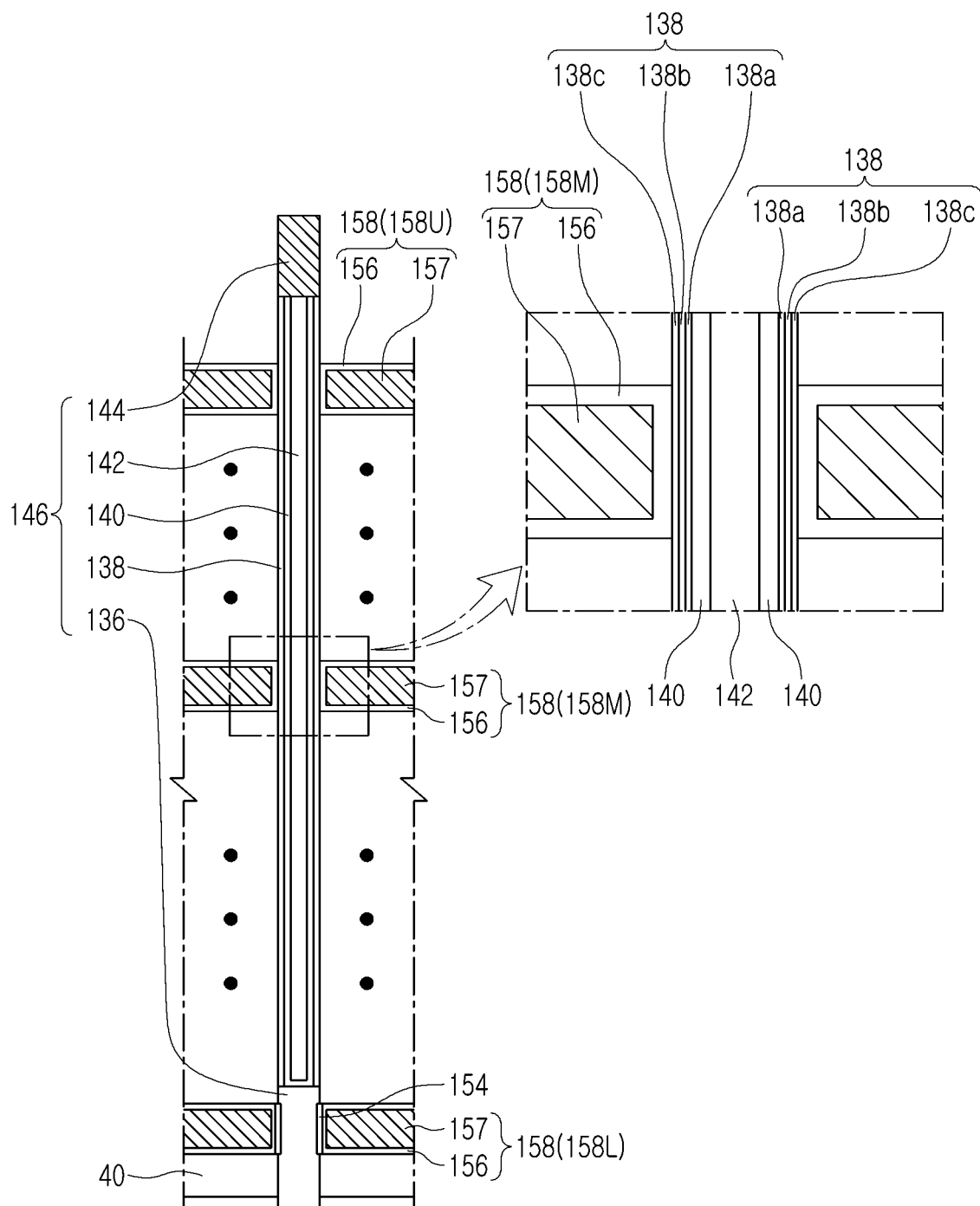
FIG. 9 is a cross-sectional view conceptually illustrating a portion of a semiconductor device according to an example embodiment.

Vertical channel structures 146, passing through the first stack region 160a of the stack structure 160 in the memory array region MA, may be provided. For example, the vertical channel structures may penetrate the memory array region MA of the first stack region 160a. The vertical channel structures 146 may pass through the second capping insulating layer 149 while passing through the first stack region 160a. The vertical channel structures 146 will be described with reference to FIG. 9. FIG. 9 is a schematic cross-sectional view illustrating a single vertical channel structure 146 and the second layers 158 to describe a vertical channel structure 146. Hereinafter, for easier understanding, the second layers 158 will be referred to as gate patterns 158 and described.

Referring to FIG. 9, the vertical channel structure 146 may include a channel semiconductor layer 140 and a gate dielectric structure 138 disposed between the channel semiconductor layer 140 and the gate patterns 158.

In an example, the vertical channel structure 146 may further include a semiconductor pattern 136, a vertical core pattern 142 on the semiconductor pattern 136, and a pad pattern 144 on the vertical core pattern 142.

The channel semiconductor layer 140 may be disposed to surround an outer side surface of the vertical core pattern 142 while being in contact with the semiconductor pattern 136. The gate dielectric structure 138 may be disposed to surround the outer side surface of the channel semiconductor layer 140. The semiconductor pattern 136 may be an epitaxial material layer which may be formed using a selective epitaxial growth (SEG) process. The vertical core pattern 142 may be formed of an insulating material (e.g., a silicon oxide). The pad pattern 144 may be formed of polysilicon having N-type conductivity. The pad pattern 144 may be disposed on a level higher than a level of the uppermost gate pattern 158U. The pad pattern 144 of the vertical channel structure 146 may be electrically connected with the bit line contact plug 180 described above. In an example, the vertical channel structure 146 may be in direct contact with the bit line contact plug 180.

In an example, the channel semiconductor layer 140 may have a side surface opposing the intermediate gate patterns 158M and the uppermost gate patterns 158U. The channel semiconductor layer 140 may pass through the gate patterns 158L, 158M, and 158U. When the vertical channel structure 146 further includes the semiconductor pattern 136, the semiconductor pattern 136 may pass through the lower gate pattern 158L, and the channel semiconductor layer 140 may pass through the intermediate gate patterns 158M and the uppermost gate patterns 158U. The channel semiconductor layer 140 may be formed of a polysilicon layer.

In an example, the semiconductor pattern 136 may be referred to as a channel semiconductor layer. For example, the semiconductor pattern 136 may be referred to as a lower channel semiconductor layer, located in a relatively lower portion, and the channel semiconductor layer 140 may be referred to as an upper channel semiconductor layer, located in a relatively higher portion. Thus, the semiconductor pattern 136 may be referred to as a channel semiconductor layer, together with the channel semiconductor layer 140 described above.

The gate dielectric structure 138 may include a tunnel dielectric layer 138a, a data storage layer 138b, and a blocking dielectric layer 138c.

The data storage layer 138b may be disposed between the tunnel dielectric layer 128c and the blocking dielectric layer 138c. The data storage layer 138b may be disposed between the gate pattern 158 and the channel semiconductor layer 140.

The blocking dielectric layer 138c may be disposed between the data storage layer 138b and the stack structure 160. The tunnel dielectric layer 138a may be disposed between the data storage layer 138b and the channel semiconductor layer 140. The tunnel dielectric layer 138a may include a silicon oxide and/or an impurity-doped silicon oxide. The blocking dielectric layer 138c may include a silicon oxide and/or a high dielectric material. The data storage layer 138b may be formed of a material which may store data, for example, a silicon nitride.

The data storage layer 138b may include regions which may store data, between the channel semiconductor layer 140 and the intermediate gate patterns 158M, which may be word lines (WL of FIGS. 1 and 3). For example, depending on operating conditions of a non-volatile memory device such as a flash memory device, an electron injected from the channel semiconductor layer 140 into the data storage layer 138b through the tunnel dielectric layer 138a may be trapped to be retained, or the electron trapped in the data storage layer 138b may be erased.

Thus, as described previously, among the intermediate gate patterns 158M, regions of the data storage layer 138b located between intermediate gate patterns, which may be the word lines (WL of FIGS. 1 and 3), and the channel semiconductor layer 140 may be defined as data storage regions, and the data storage regions may form the memory cells (MCT of FIG. 3) illustrated in FIG. 3.

Again, referring to FIGS. 4 to 8, in the stack structure 160, gate contact structures 176 may be disposed on the pad regions 158P of the first stack region 160a located in the first side region SA1 and the second side region SA2, in which the second stack region 160b is not located. The gate contact structures 176 may sequentially pass through the third capping insulating layer 172 and the second capping insulating layer 149 to be extended downwardly, and the gate contact structures 176 may be in contact with a conductive material layer (157 of FIG. 8) of the second layers 158, which may be gate patterns. The gate contact structures 176 may be formed of a conductive material including one or more of doped silicon, a metal nitride (e.g., TiN), and a metal (e.g., W).

The gate contact structures 176 may include string select gate contact structures 176a and 176b, word line contact structures 176c, and ground select contact structures 176d, in contact with gate patterns, used for an operation of a semiconductor device, among the second layers 158 which may be gate patterns, and may include dummy contact structures 176e, in contact with gate patterns, not used for an operation of a semiconductor device.

The string select gate contact structures 176a and 176b may include a first string select gate contact structure 176a in contact with an uppermost gate pattern 158U which may be a string select line (SSL of FIG. 1), and a second string select gate contact structure 176b in contact with an intermediate gate pattern 158M directly below the uppermost gate pattern 158U. The word line contact structures 176c may be in contact with intermediate gate patterns, among the intermediate gate patterns 158M, which may be the word lines (WL of FIG. 1) described above. The ground select contact structures 176d may be in contact with the lowermost gate pattern 158L, which may be a ground select line (GSL of FIGS. 1 and 3).

Peripheral contact structures 178, extended upwardly while being in contact with the peripheral contact pads 66a, sequentially passing through the gap fill insulating layer 92a and the second stack region 160b, and passing through the second capping insulating layer 149 and the third capping insulating layer 172, may be provided. The peripheral contact structures 178 may be formed of a conductive material including one or more of doped silicon, a metal nitride (e.g., TiN), and a metal (e.g., W).

Interconnection structures may be disposed on the fourth capping insulating layer 174. The interconnection structures may include bit lines 190 and peripheral circuit connection wirings 194. The interconnection structures may be formed of a conductive material including such as tungsten (W) or copper (Cu).

Bit line contact plugs 180, allowing the bit lines 190 and the vertical channel structures 146 to be electrically connected to each other, may be provided. Gate contact plugs 184 and peripheral contact plugs 186 may be disposed below the peripheral circuit connection wirings 194. The gate contact plugs 184 may allow the string select gate contact structures 176a and 176b, the word line contact structures 176c, and the ground select contact structures 176d, of the gate contact structures 176, to be electrically connected to the peripheral circuit connection wirings 194. The peripheral contact plugs 186 may allow the peripheral contact structures 178 and the peripheral circuit connection wirings 194 to be electrically connected to each other.

Figure 10:
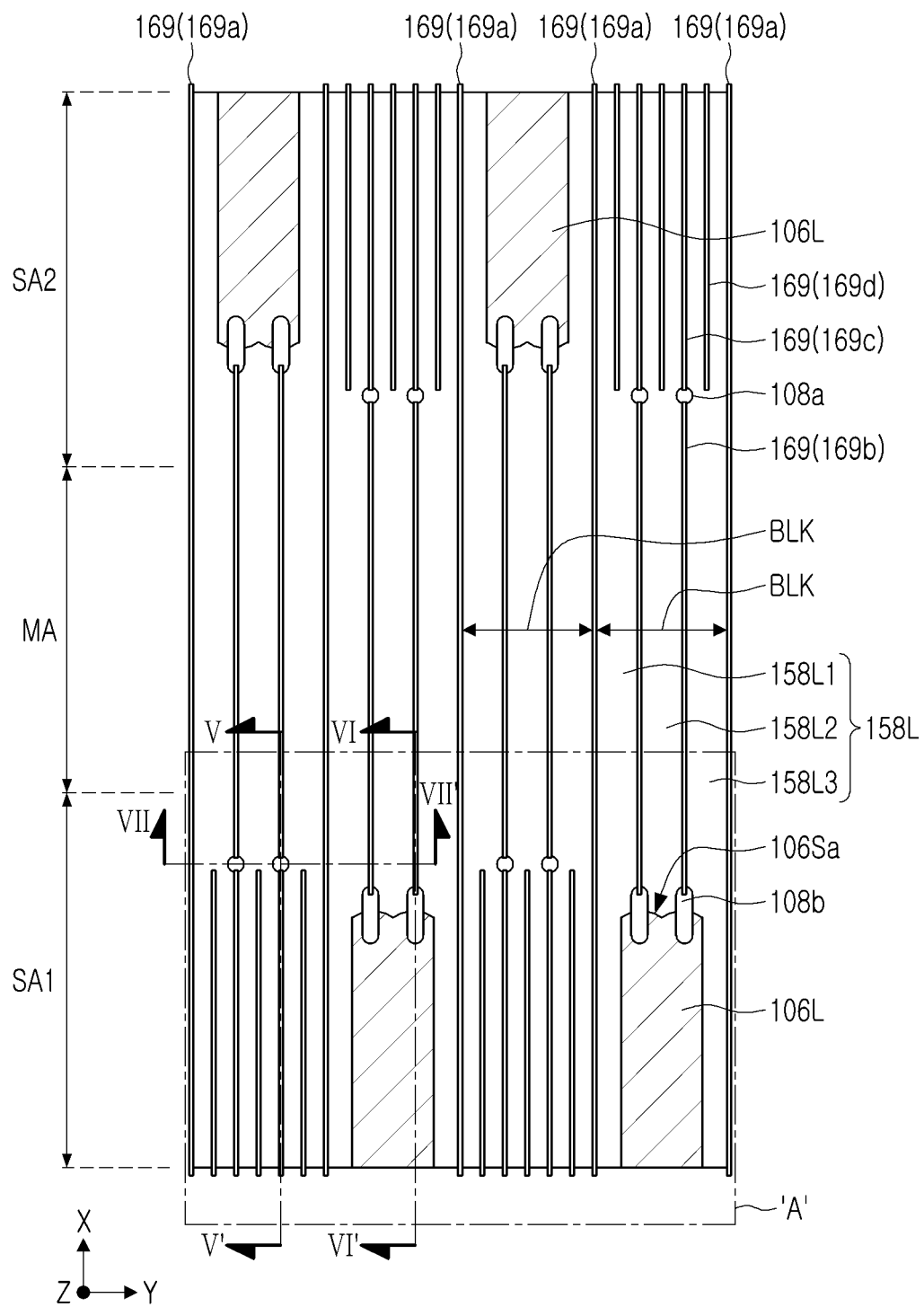
FIGS. 10 and 11A to 11C are drawings illustrating an example of a semiconductor device according to an example embodiment.
Figure 11A:
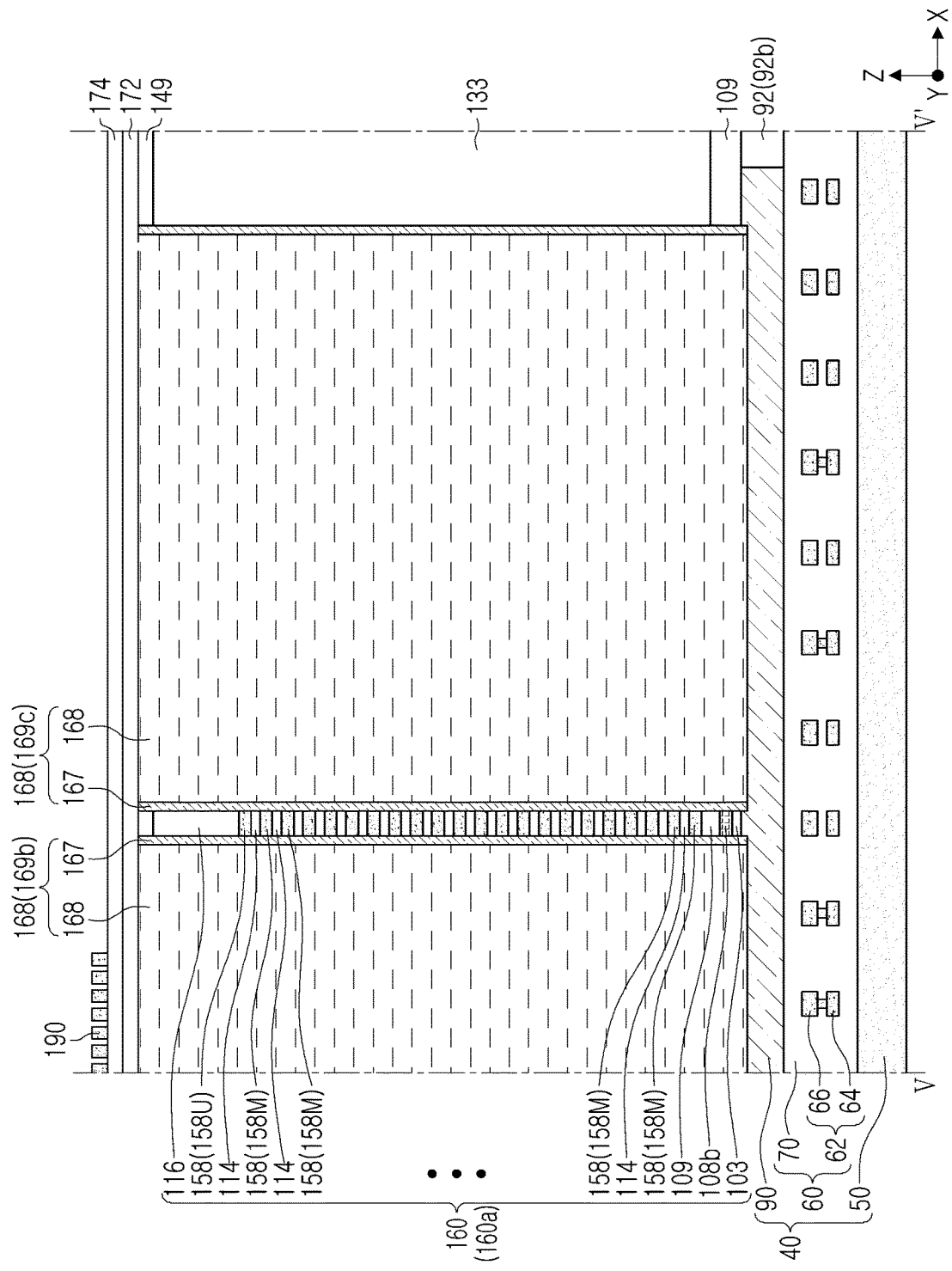
Figure 11B:
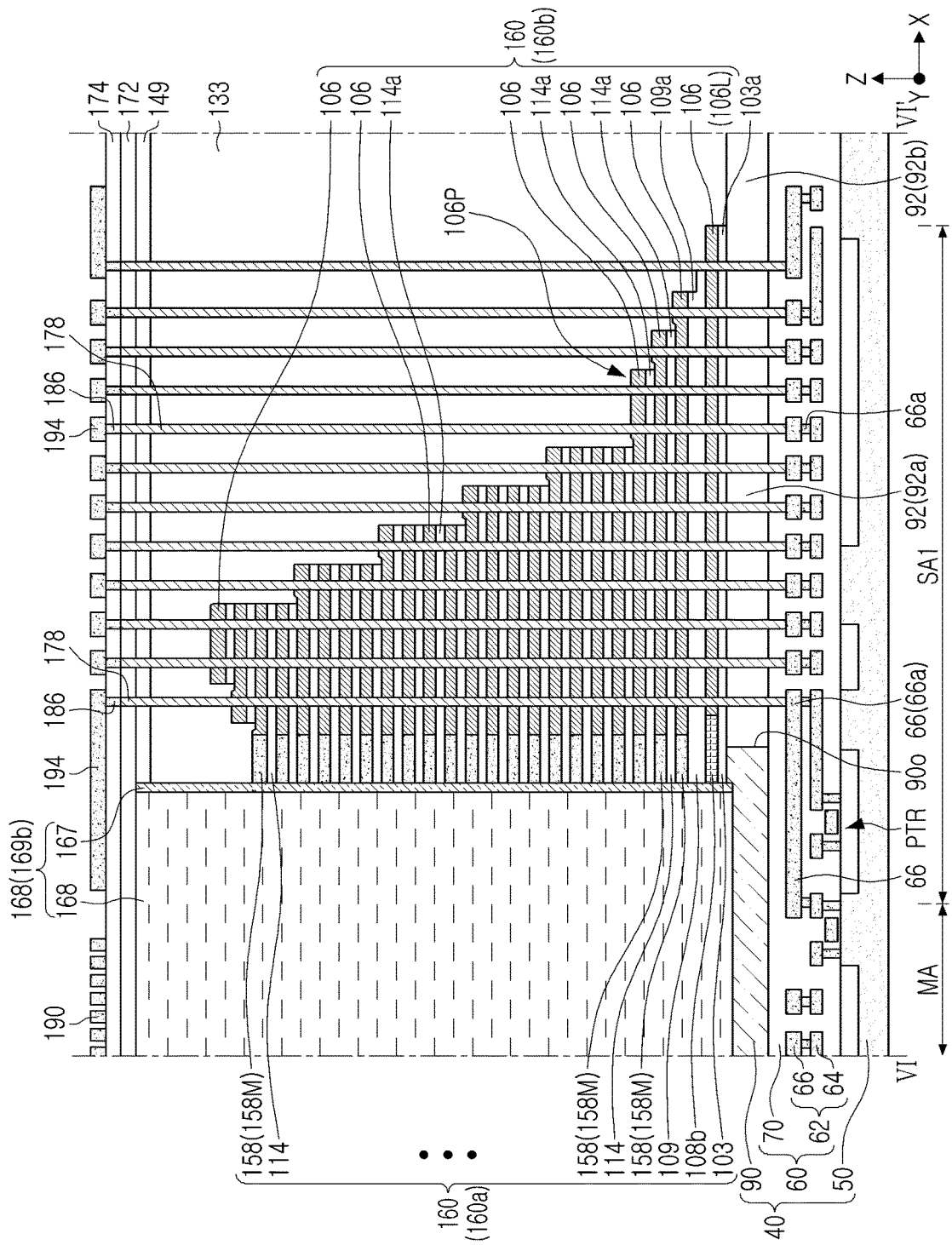
Figure 11C:
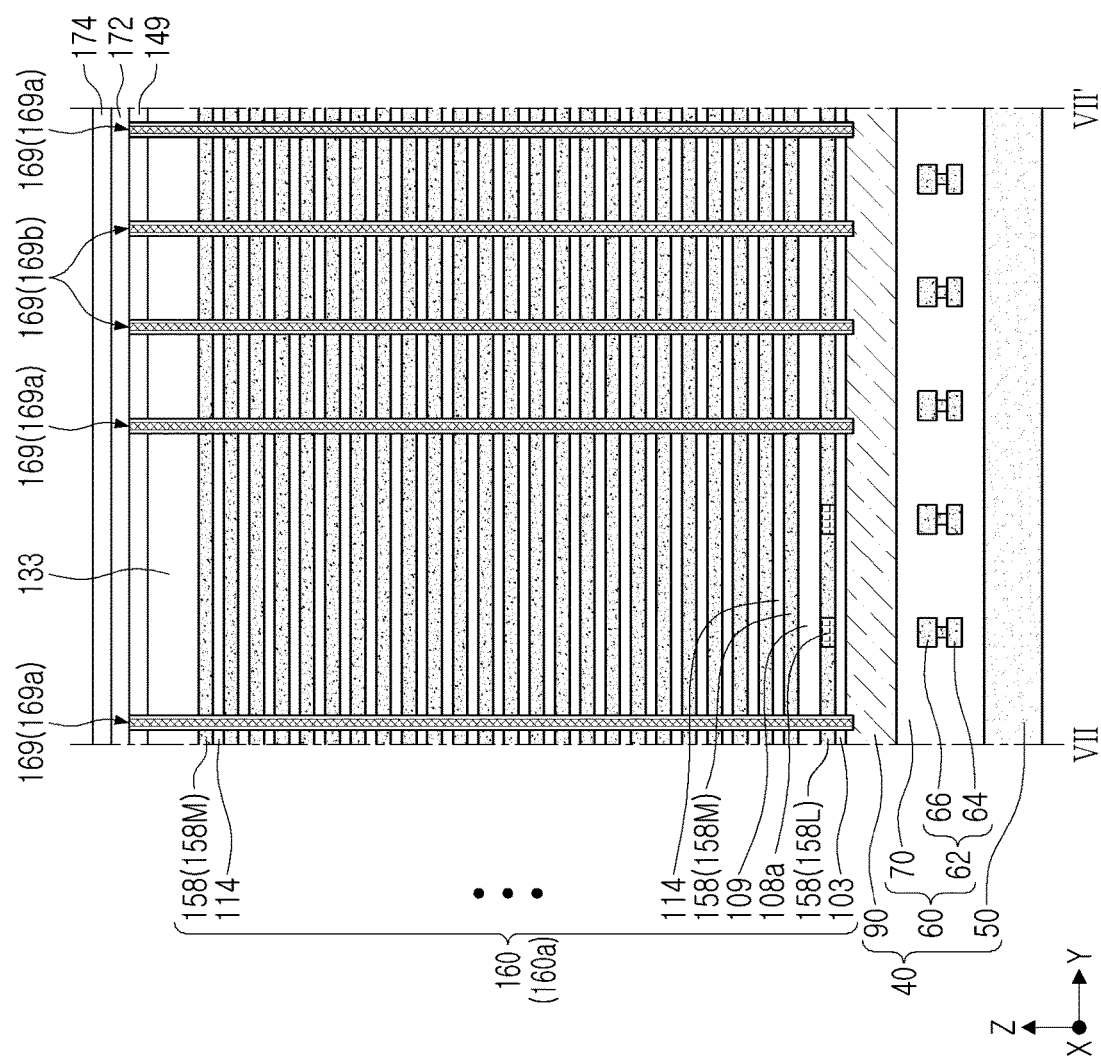

Next, the lowermost gate pattern 158L and the lowermost fourth layer 106L located in a lowermost portion among the fourth layers 106, described above, will be described with reference to FIGS. 6, 10, and 11A to 11C. FIG. 10 is a plan view illustrating a plane of a portion located on a level the same as a level of the lowermost gate pattern 158L, FIG. 11A is a cross-sectional view illustrating a region taken along line V-V' of FIGS. 6 and 10, FIG. 11B is a cross-sectional view illustrating a region taken along line VI-VI' of FIGS. 6 and 10, and FIG. 11C is a cross-sectional view illustrating a region taken along line VII-VII' of FIGS. 6 and 10.

Referring to FIGS. 4 to 6 and FIGS. 10 to 11C, between two adjacent block separation structures 169a, the lowermost gate pattern 158L may be separated into a plurality of lowermost gate patterns 158L1, 158L2, and 158L3.

As described above, between the two adjacent block separation structures 169a, the first auxiliary separation structures 169b and the second auxiliary separation structures 169c may have end portions opposing each other.

A first isolation insulating layer 108a may be disposed between end portions of the first auxiliary separation structures 169b and the second auxiliary separation structures 169c. A second isolation insulating layer 108b may be disposed between the first auxiliary separation structures 169b and the lowermost fourth layer 106L of the second stack region 160b. The lowermost fourth layer 106L may be referred to as the lowermost mold pattern.

The first auxiliary separation structures 169b and the second auxiliary separation structures 169c, as well as the first isolation insulating layer 108a and the second isolation insulating layer 108b, may allow the plurality of lowermost gate patterns 158L1, 158L2, and 158L3 to be spaced apart and electrically isolated from each other.

Between two adjacent block separation structures 169a, the first auxiliary separation structures 169b and the second auxiliary separation structures 169c electrically isolated from each other by the first isolation insulating layer 108a and the second isolation insulating layer 108b may define the lowermost gate patterns 158L1, 158L2 and 158L3 which may correspond to ground select lines (GSL of FIGS. 1 and 3).

The first isolation insulating layer 108a and the second isolation insulating layer 108b may be located below the intermediate gate patterns 158M. Thus, the intermediate gate patterns 158M are not separated by the first isolation insulating layer 108a and the second isolation insulating layer 108b, and thus may not be electrically isolated from each other by the first auxiliary separation structures 169b and the second auxiliary separation structures 169c. Thus, between the two adjacent block separation structures 169a, each of the intermediate gate patterns 158M may include a single conductive material layer (157 of FIG. 8), not electrically isolated from each other.

Thus, between the two adjacent block separation structures 169a, a portion of the intermediate gate patterns 158M may be word lines (WL of FIG. 1), and the first auxiliary separation structures 169b and the second auxiliary separation structures 169c, as well as a plurality of ground select lines (GSL of FIGS. 1 and 3) electrically isolated from each other by the first isolation insulating layer 108a and the second isolation insulating layer 108b may be disposed below a word line WL among the word lines WL described above. The first isolation insulating layer 108a and the second isolation insulating layer 108b may be formed of a material the same as that of the lower interlayer insulating layer 109.

Figure 12:
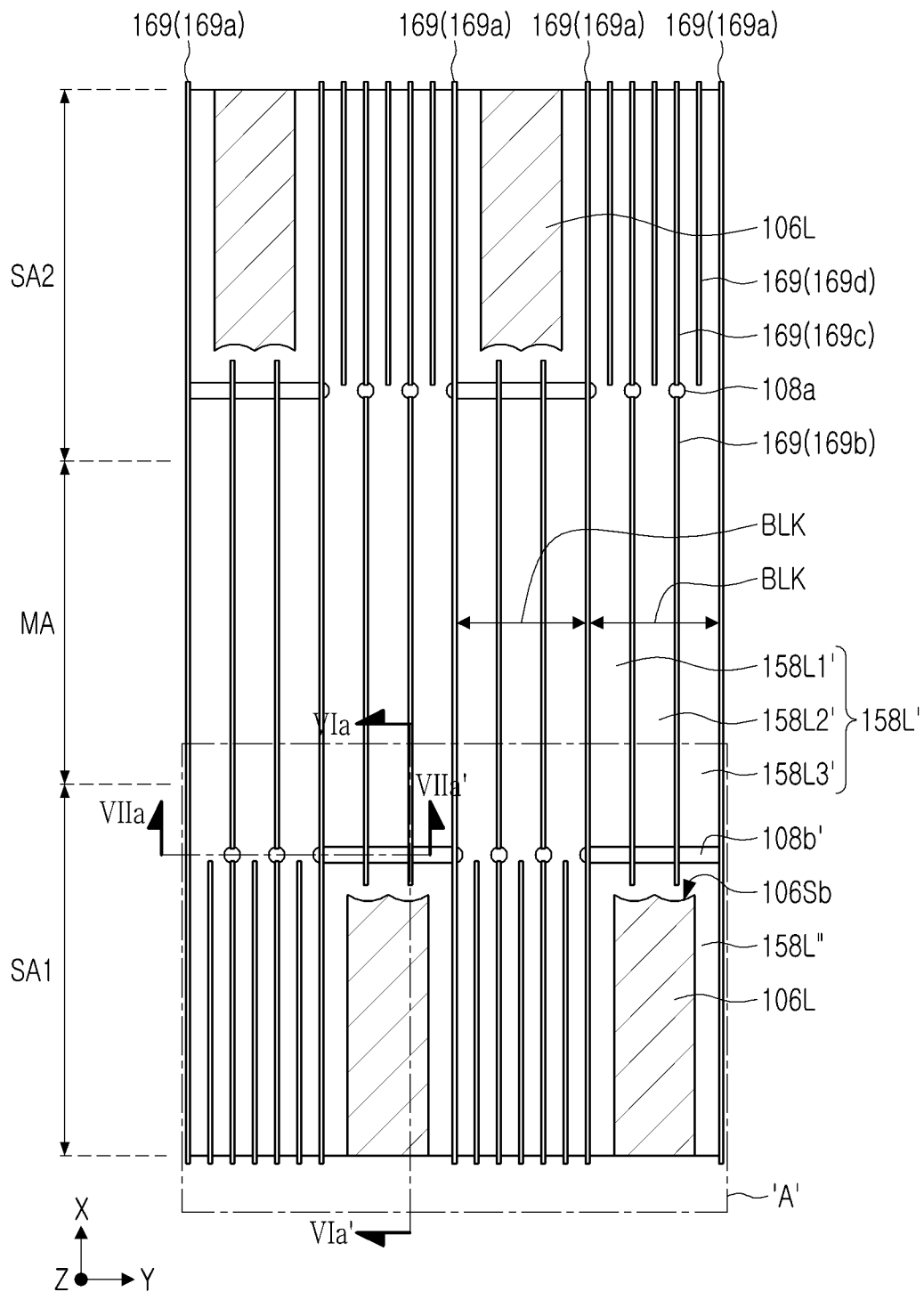
FIGS. 12, 13A and 13B are drawings illustrating a modified example of a semiconductor device according to an example embodiment.
Figure 13A:
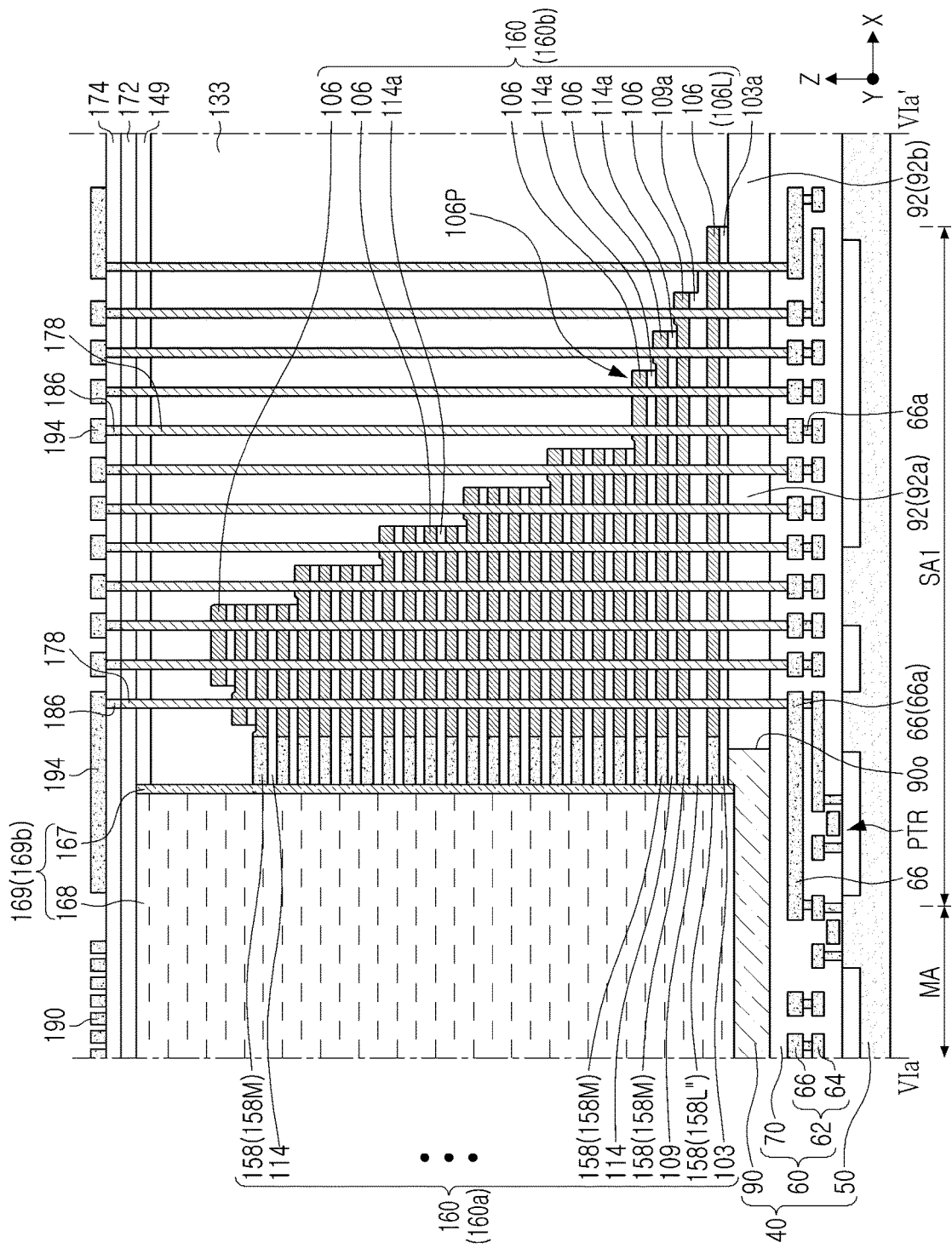
Figure 13B:
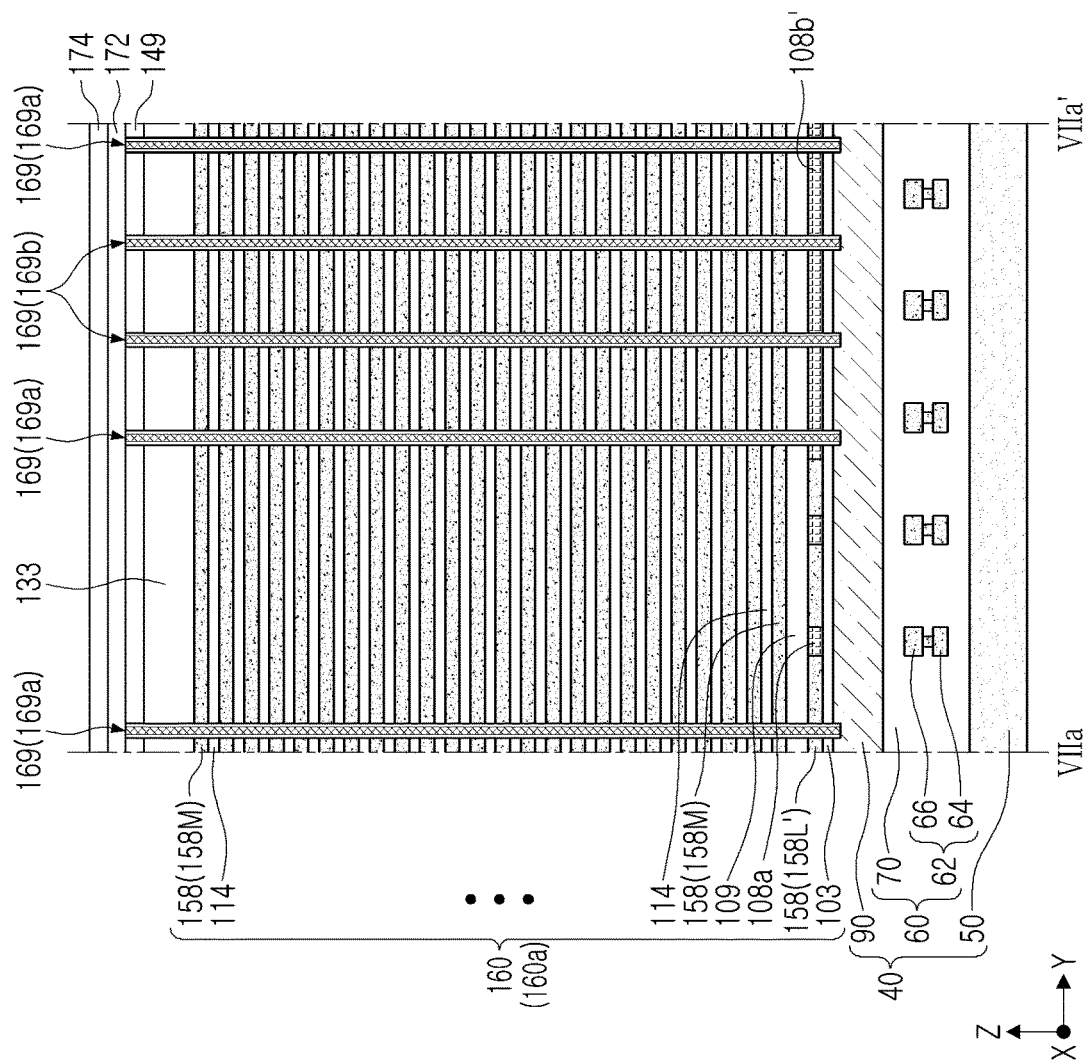

In an example, the second isolation insulating layer 108b may be disposed between the lowermost fourth layer 106L of the second stack region 160b and the first auxiliary separation structures 169b. However, the inventive concept is not limited thereto, and the second isolation insulating layer 108b may be modified as a second isolation insulating layer 108b' in FIGS. 12 to 13B. The second isolation insulating layer 108b' will be described with reference to FIGS. 12 to 13B. In FIGS. 12 to 13B, FIG. 12 is a plan view illustrating a plane of a portion located on a level the same as a level of a lowermost gate pattern 158L', having been modified, FIG. 13A is a cross-sectional view illustrating a region taken along line VIa-VIa' of FIG. 12, and FIG. 13B is a cross-sectional view illustrating a region taken along line VIIa-VIIa' of FIG. 12.

Referring to FIGS. 4 to 6, as well as FIGS. 12 to 13B, the second isolation insulating layer 108b' may be disposed in the second stack region 160b of the first side region SA1 and the second side region SA2, between two adjacent block separation structures 169a and may be in contact with the first auxiliary separation structures 169b while being in contact with the two adjacent block separation structures 169a.

Thus, the second isolation insulating layer 108b' may allow the lowermost gate pattern 158L' to be separated into a plurality of lowermost gate patterns 158L1', 158L2' and 158L3' that are spaced apart and electrically isolated from each other, together with the first auxiliary separation structures 169b and the second auxiliary separation structures 169c described above with reference to FIGS. 10 to 11C, as well as the first isolation insulating layers 108a. End portions of the plurality of lowermost gate patterns 158L1', 158L2' and 158L3' which may be electrically isolated from each other as described above, may be in contact with the second isolation insulating layer 108b'.

A lowermost floating gate pattern 158L" may be separated from the lowermost gate pattern 158L' by the second isolation insulating layer 108b' and in contact with the second stack region 160b. For example, the lowermost floating gate pattern 158L" may be in contact with the lowermost fourth layer 106L located in the second stack region 160b. The lowermost floating gate pattern 158L" may be spaced apart from the plurality of lowermost gate patterns 158L1', 158L2' and 158L3'. The first isolation insulating layer 108a and the second isolation insulating layer 108b' may be formed of a material the same as that of the lower interlayer insulating layer 109.

Figure 14:
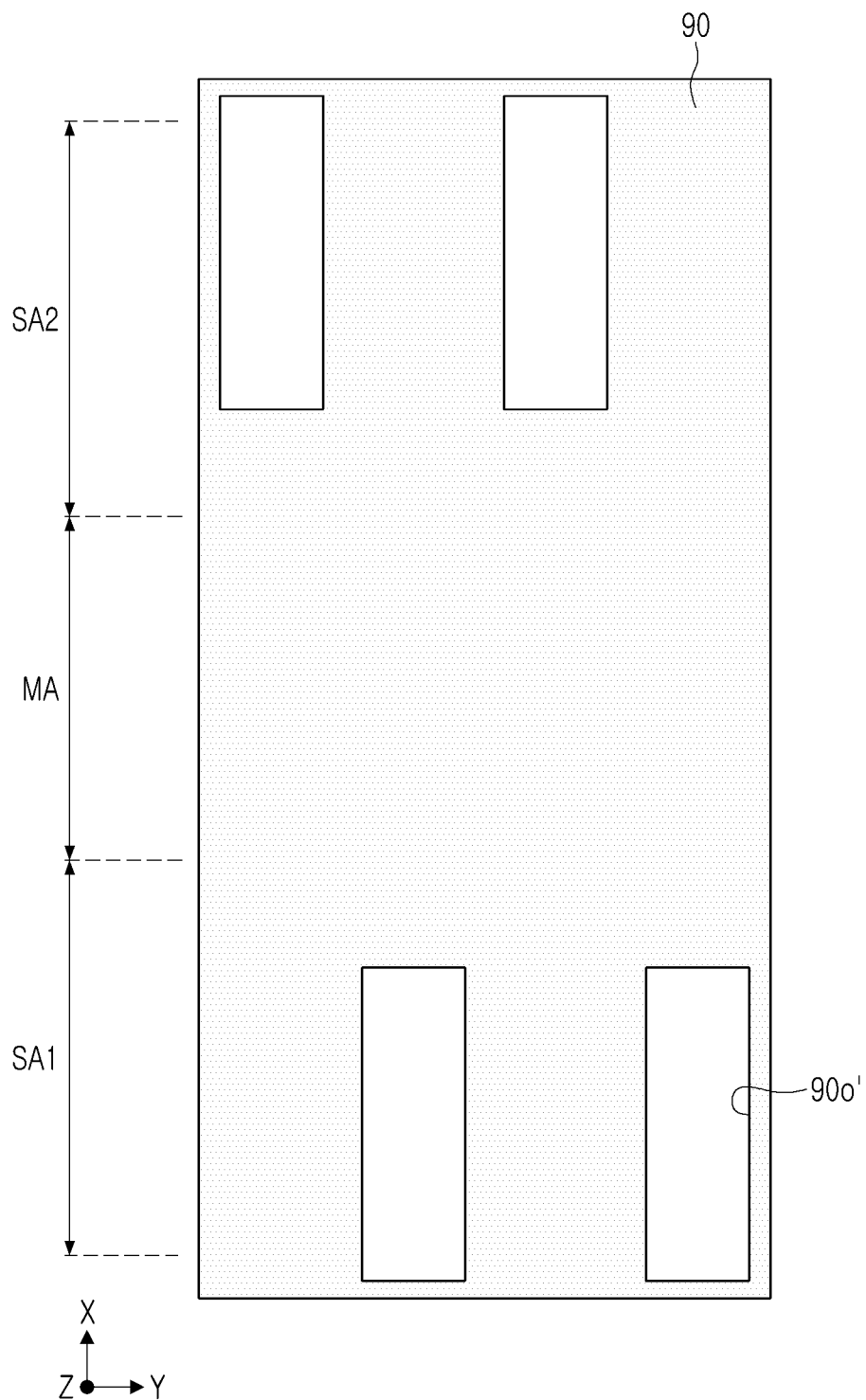
FIG. 14 is a plan view illustrating a modified example of a semiconductor device according to an example embodiment.

Again, referring to FIGS. 4 to 8, the opening 90o of the second substrate 90, described above, may be provided in the form in which one side is open. However, the inventive concept is not limited thereto, and the opening 90o of the second substrate 90 may be modified as an opening 90o' in the isolated form as illustrated in FIG. 14. Here, FIG. 14 is a plan view illustrating the second substrate 90. As described above, the second substrate 90 has the opening 90o' in the isolated form, so the gap fill insulating layer (92a of FIG. 7B) in the opening 90o' may be formed to have a more uniform thickness. For example, forming the gap fill insulating layer (92a of FIG. 7B) may include forming the opening 90o' by patterning the second substrate 90, depositing an insulating material layer, and performing a chemical mechanical polishing (CMP) process. In this case, the opening 90o' in the isolated form may prevent a dishing phenomenon caused by the CMP process from occurring, so the gap fill insulating layer (92a of FIG. 7B) in the opening 90o' may be provided to have a more uniform thickness.

Figure 15:
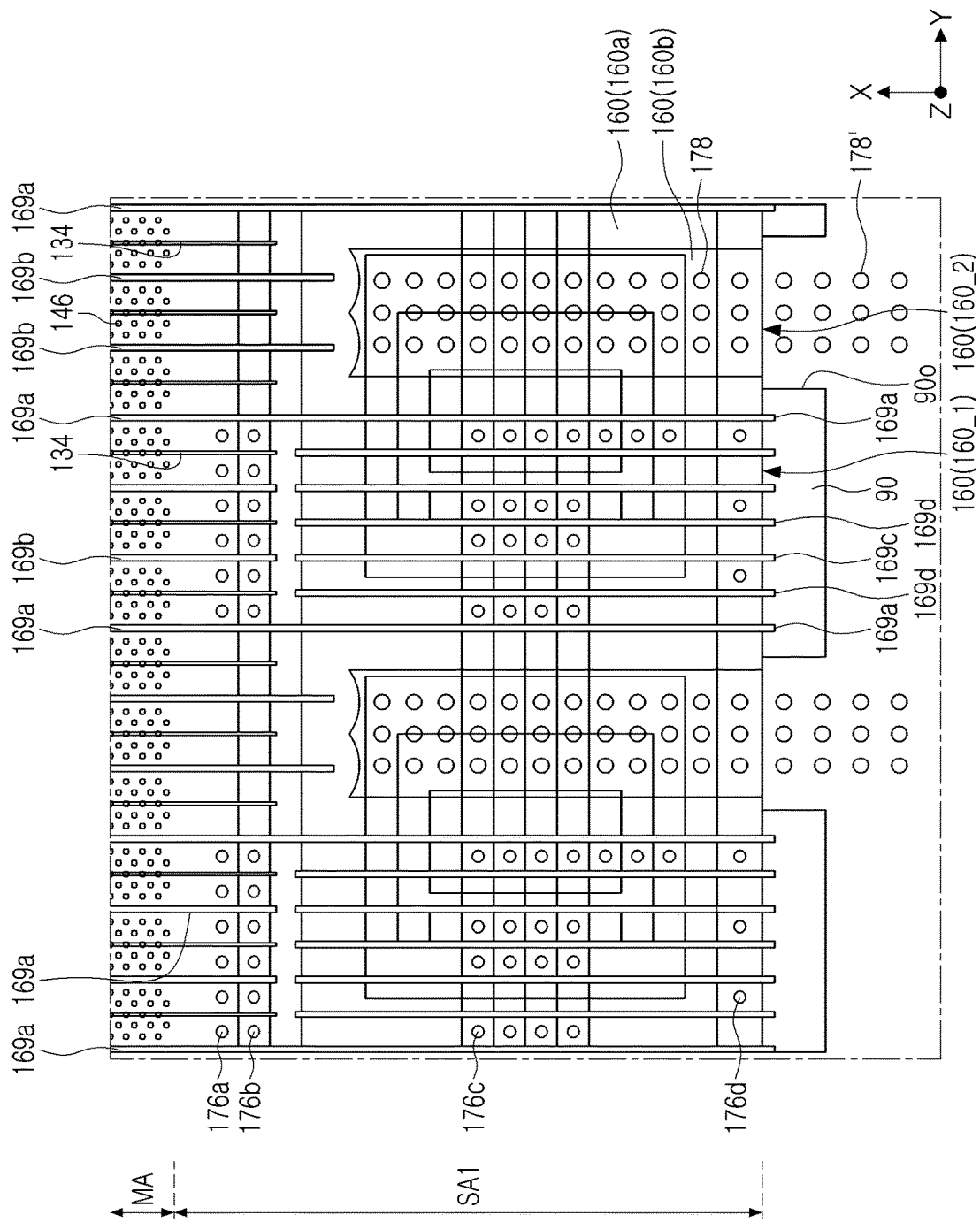
FIG. 15 is a plan view illustrating a modified example of a semiconductor device according to an example embodiment.

Again, referring to FIGS. 4 to 8, when viewed in a plane, all of the peripheral contact structures 178 may be disposed in the second stack region 160b. However, the inventive concept is not limited thereto. For example, as illustrated in FIG. 15, a portion of peripheral contact structures 178' of the peripheral contact structures 178 may be disposed in an outer region outside of the second stack region 160b. Here, FIG. 15 is a plan view illustrating a portion of a semiconductor device according to an example embodiment. Peripheral contact structures, disposed in the second stack region 160b, may be referred to as inner peripheral contact structures 178, and peripheral contact structures, disposed in an outer region outside of the second stack region 160b, may be referred to as outer peripheral contact structures 178'. With the outer peripheral contact structures 178', the number of the inner peripheral contact structures 178 disposed in the second stack region 160b may be reduced. The peripheral contact structures 178 and 178' are disposed as described above, thereby increasing a distance between two adjacent peripheral contact structures 178 and 178', or increasing a width of each of the peripheral contact structures 178 and 178'. Thus, electrical characteristics of a semiconductor device may be improved.

In the example embodiments described previously, as described with reference to FIGS. 4 to 15, the second layers 158, which may be gate patterns, and peripheral contact pads 66a of the peripheral circuit structure 60 may be electrically connected to each other through peripheral contact structures 178 passing through the second stack region 160b. The inventive concept may include an example embodiment in which the bit lines 190 and peripheral contact pads 66a of the peripheral circuit structure 60 are connected to each other, in addition to the example embodiments described with reference to FIGS. 4 to 15. The example embodiment in which the bit lines 190 and the peripheral contact pads 66a are connected to each other will be described with reference to FIG. 16A to 18B.

Figure 16A:
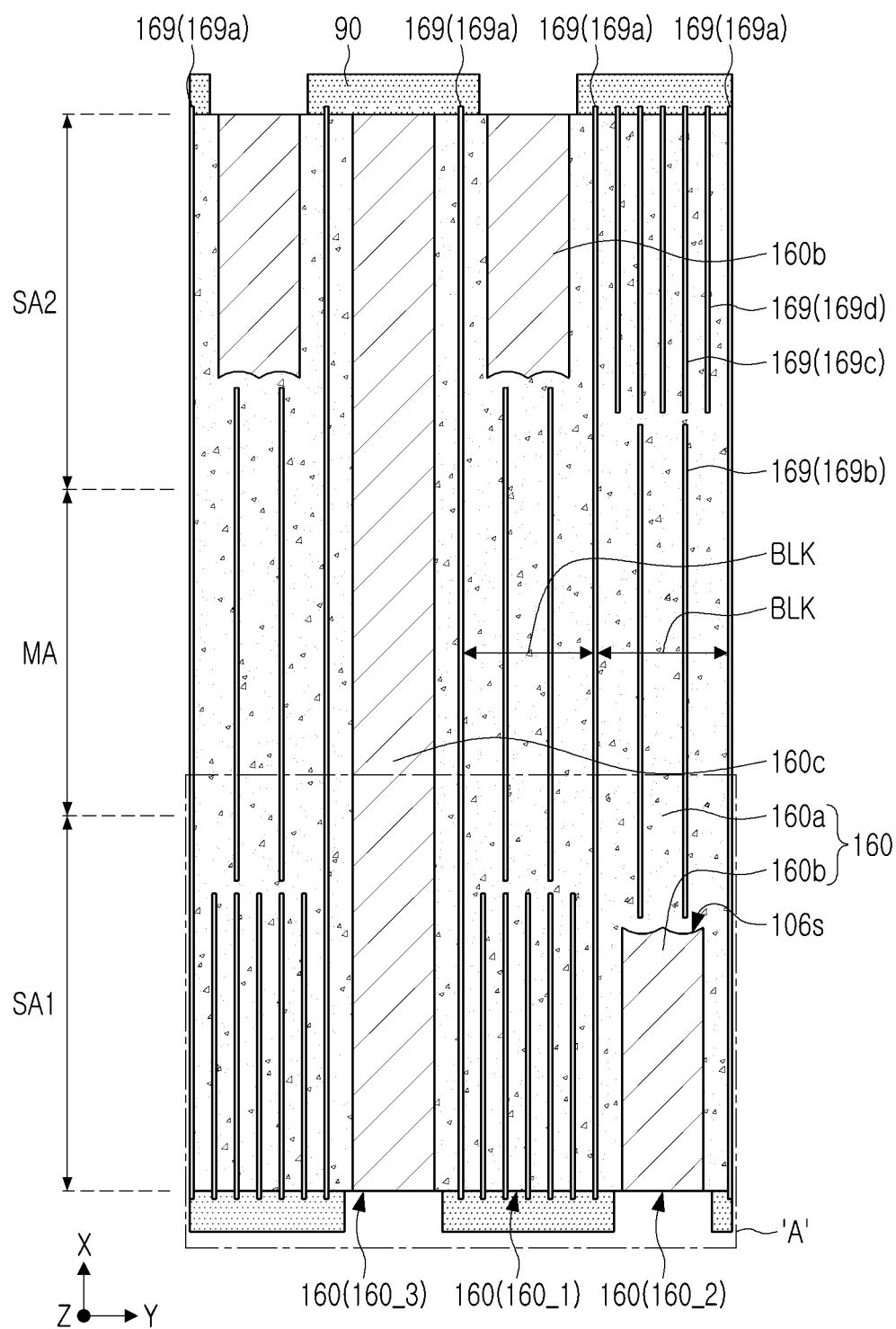
FIGS. 16A, 16B, 17, 18A and 18B are drawings illustrating a modified example of a semiconductor device according to an example embodiment.
Figure 16B:
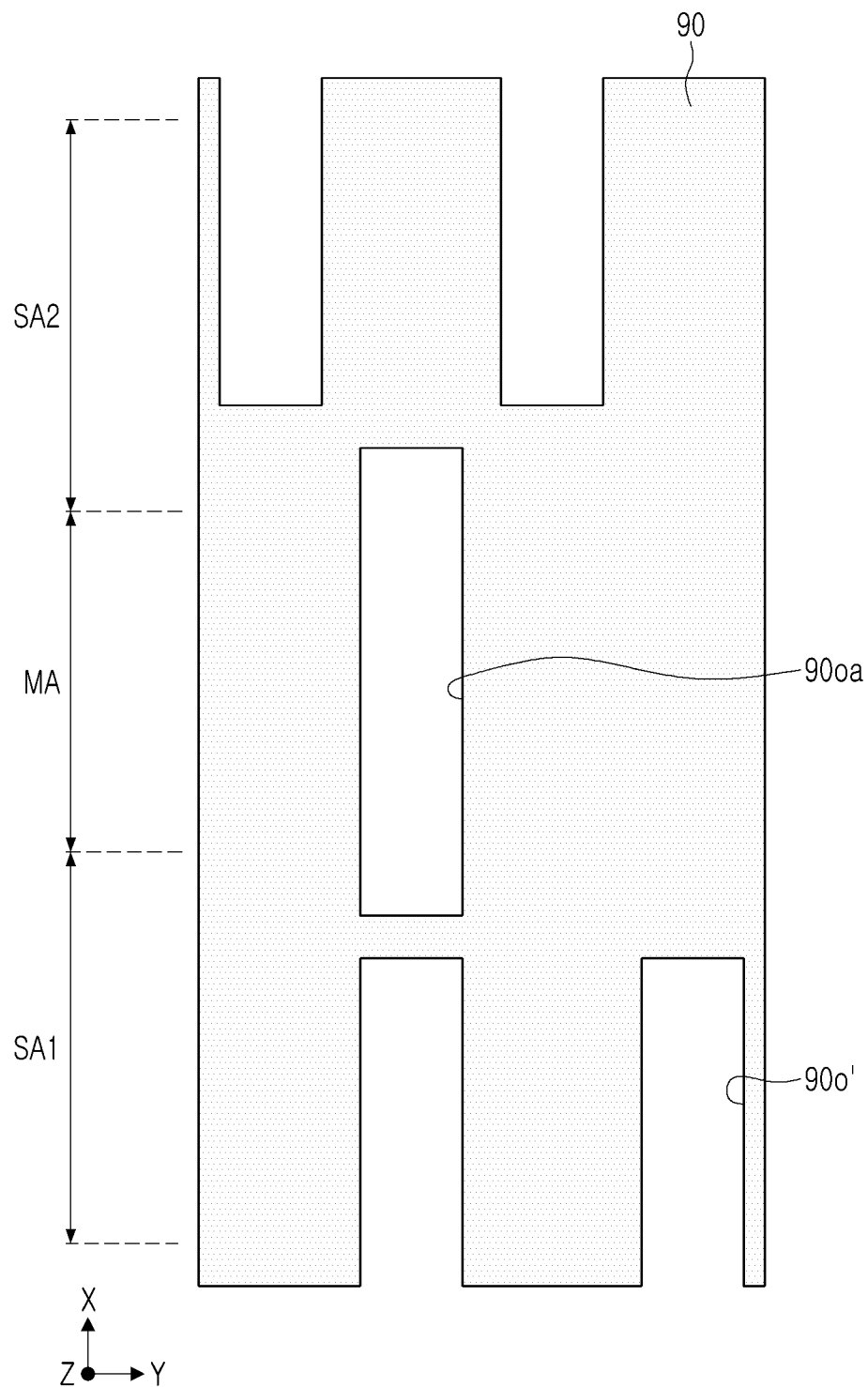
Figure 17:
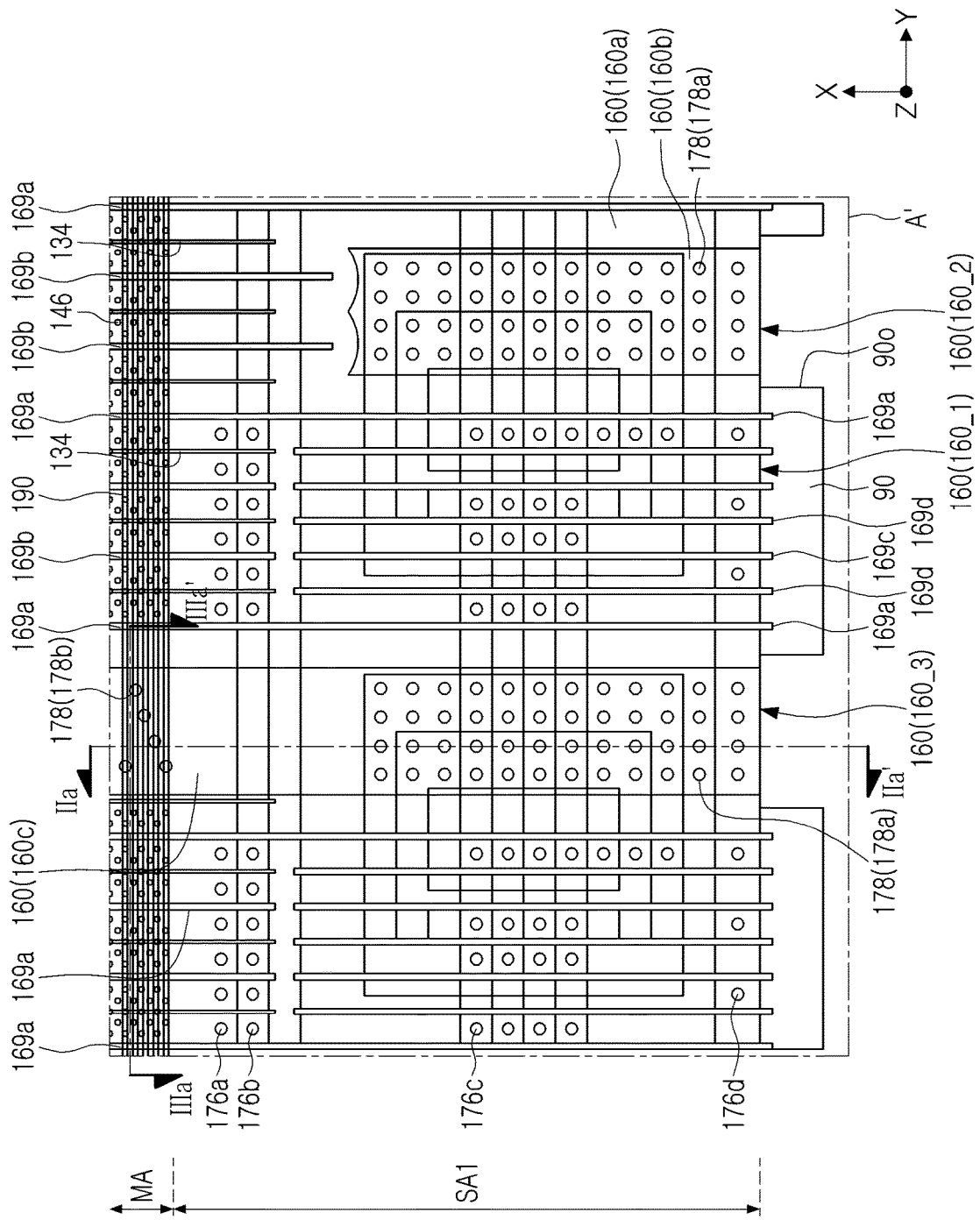
Figure 18A:
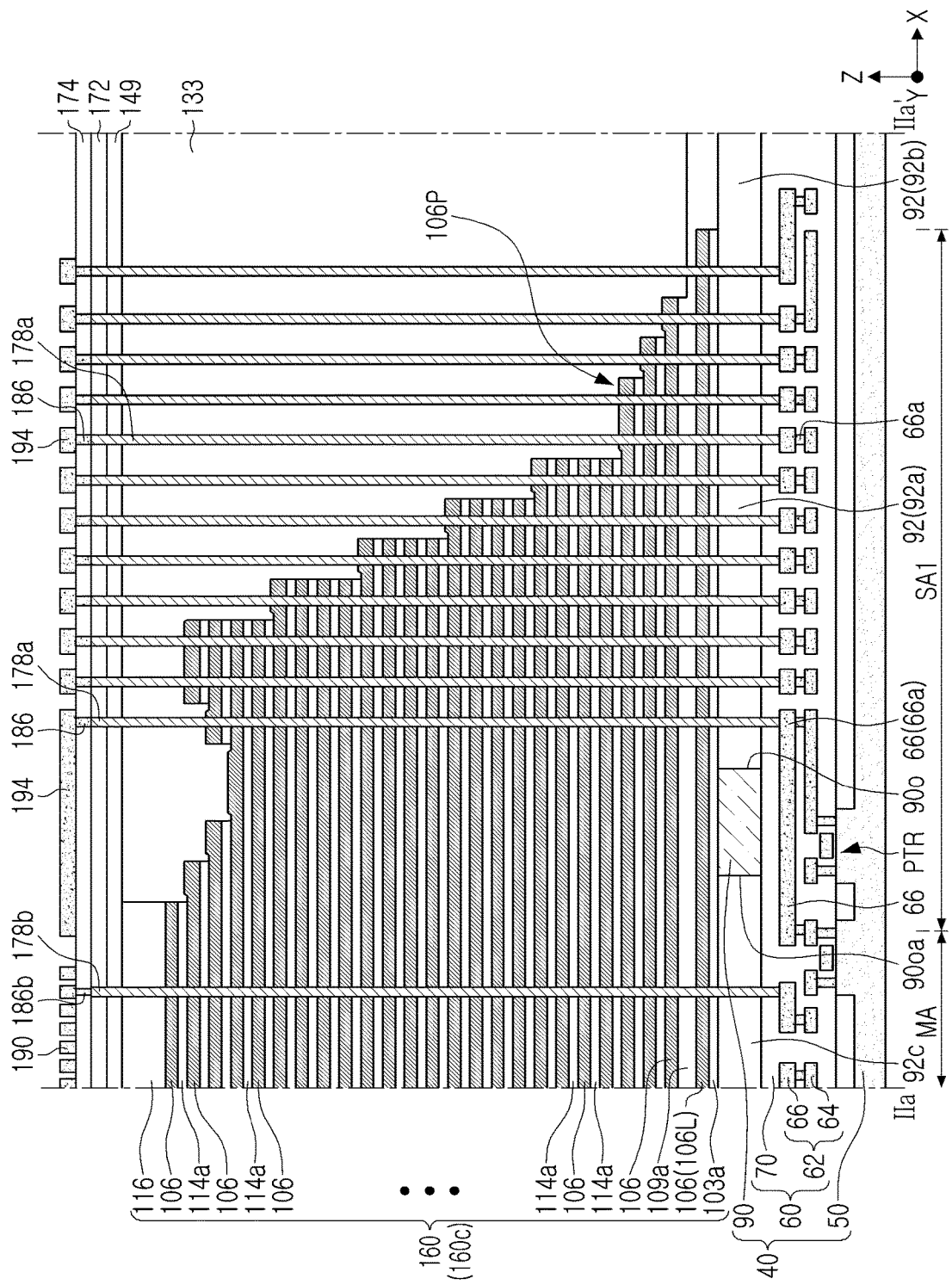
Figure 18B:
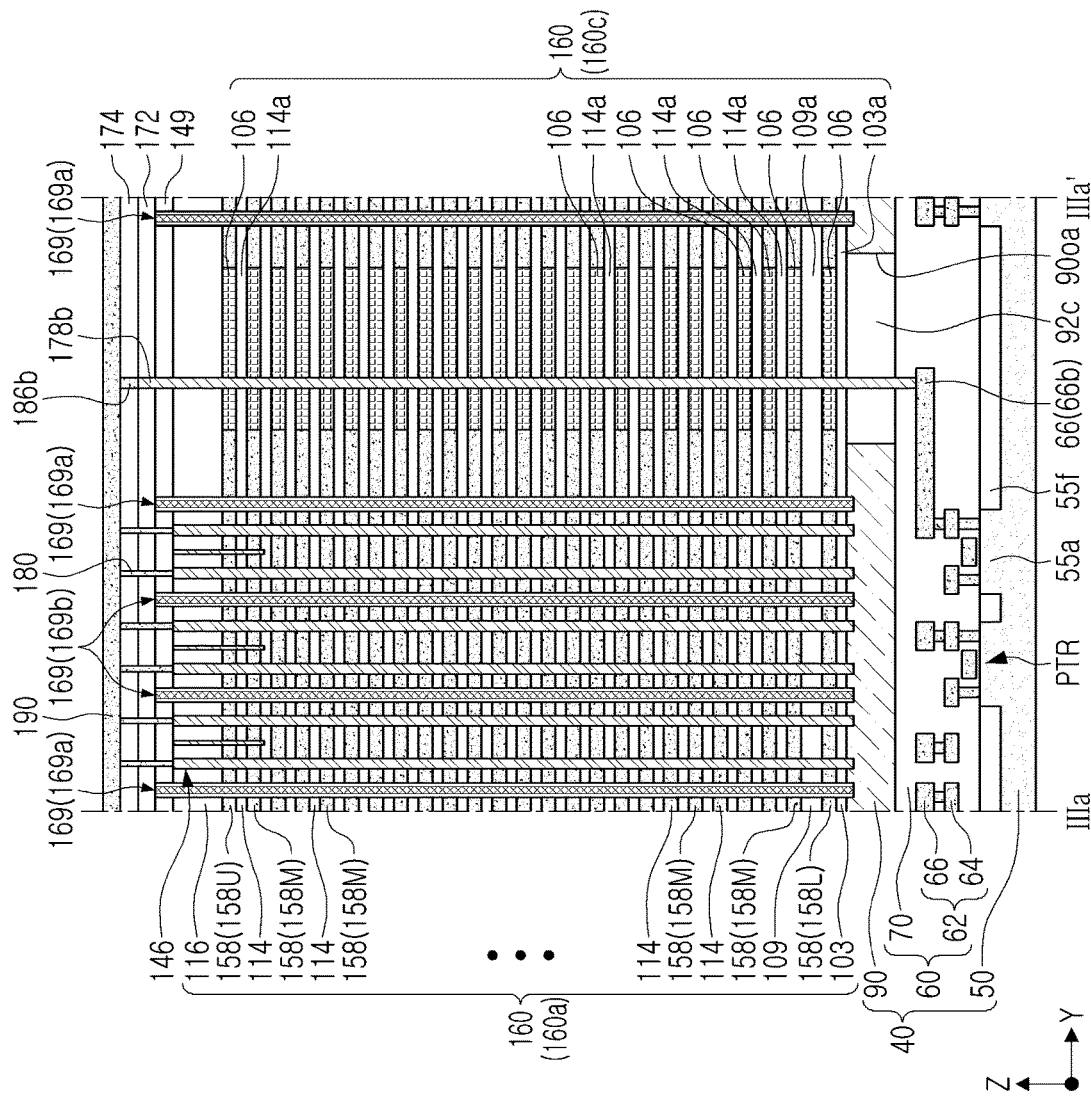

In FIGS. 16A to 18B, FIG. 16A is a plan view illustrating a semiconductor device according to an example embodiment, FIG. 16B is a plan view of the second substrate according to an example embodiment, FIG. 17 is a partially enlarged view enlarging a portion indicated by 'A' of FIG. 16A, FIG. 18A is a schematic cross-sectional view illustrating a region taken along line IIa-IIa' of FIG. 17, and FIG. 18B is a schematic cross-sectional view illustrating a region taken along line IIIa-IIIa' of FIG. 17. When described with reference to FIGS. 16A to 18B, the components described with reference to FIGS. 4 to 15 will be described directly without any explanation, or a description thereof will be omitted.

Referring to FIGS. 16A to 18B, together with FIGS. 4 to 15, the stack structure 160, described above, may include the first stack block structure 160_1 and the second stack block structure 160_2 of FIGS. 4 and 6, described with reference to FIGS. 4 to 15.

Each of the first stack block structure 160_1 and the second stack block structure 160_2 of FIGS. 4 and 6 may be disposed between two adjacent block separation structures 169a as described previously.

In an example, the stack structure 160 may further include a third stack block structure 160_3, together with the first stack block structure 160_1 and the second stack block structure 160_2, described above. The third stack block structure 160_3 may be located between two adjacent block separation structures 169a.

The third stack block structure 160_3 may include a third stack region 160c, together with the first stack region 160a. The first stack region 160a may include the first layers 103, 109, 114, and 116 as well as the second layers 158, alternately and repeatedly stacked, as described above.

The third stack region 160c may intersect the memory array region MA. In an example, the third stack region 160c may be extended in the first horizontal direction X to intersect the first side region SA1 and the second side region SA2. The third stack region 160c may be formed of material layers the same as that of the second stack region 160b. For example, the third stack region 160c may include the third layers 103a, 109a, and 114a as well as the fourth layers 106, alternately and repeatedly stacked.

Thus, the third stack block structure 160_3 may include the first stack region 160a that is adjacent to or in contact with two adjacent block separation structures 169a and the third stack region 160c spaced apart from the two adjacent block separation structures 169a.

A peripheral contact structure 178 may include a gate peripheral contact structure 178a disposed in the first side region SA1 and the second side region SA2 and a bit line peripheral contact structure 178b.

The second substrate 90 may have an inner opening 90oa below the memory array region MA. A gap fill insulating layer 92c may fill the inner opening 90oa.

The bit line peripheral contact structure 178b may pass through the third stack region 160c in the memory array region MA and the gap fill insulating layer 92c below the memory array region MA to be extended, and may be in contact with a peripheral contact pad 66b of the peripheral circuit structure 60. A bit line peripheral contact plug 186b, allowing the bit line peripheral contact structure 178b and the bit line 190 to be electrically connected to each other, may be provided.

In an example embodiment, the third stack region 160c may be extended from the memory array region MA to the first side region SA1. Thus, in the third stack region 160c, a region located in the first side region SA1 may be the same as the second stack region 160b, described above. Thus, in the third stack region 160c, the gate peripheral contact structure 178a may pass through the region located in the first side region SA1 as shown in FIG. 18A.

The third stack region 160c may be formed over the memory array region MA and the first side region SA1. In this case, the bit lines 190 may be electrically connected to a peripheral circuit in the peripheral circuit structure 60 including, for example, a page buffer (4 of FIG. 1), through the bit line peripheral contact structure 178b passing through a portion of the third stack region 160c located in the memory array region MA as shown in FIG. 18B. A portion of the second layers 158, which may be gate patterns, may be electrically connected to a peripheral circuit in the peripheral circuit structure 60, for example, a row decoder (3 of FIG. 1) through the gate peripheral contact structure 178a passing through a portion of the third stack region 160c located in the first side region SA1 as shown in FIG. 18A.

Figure 20:
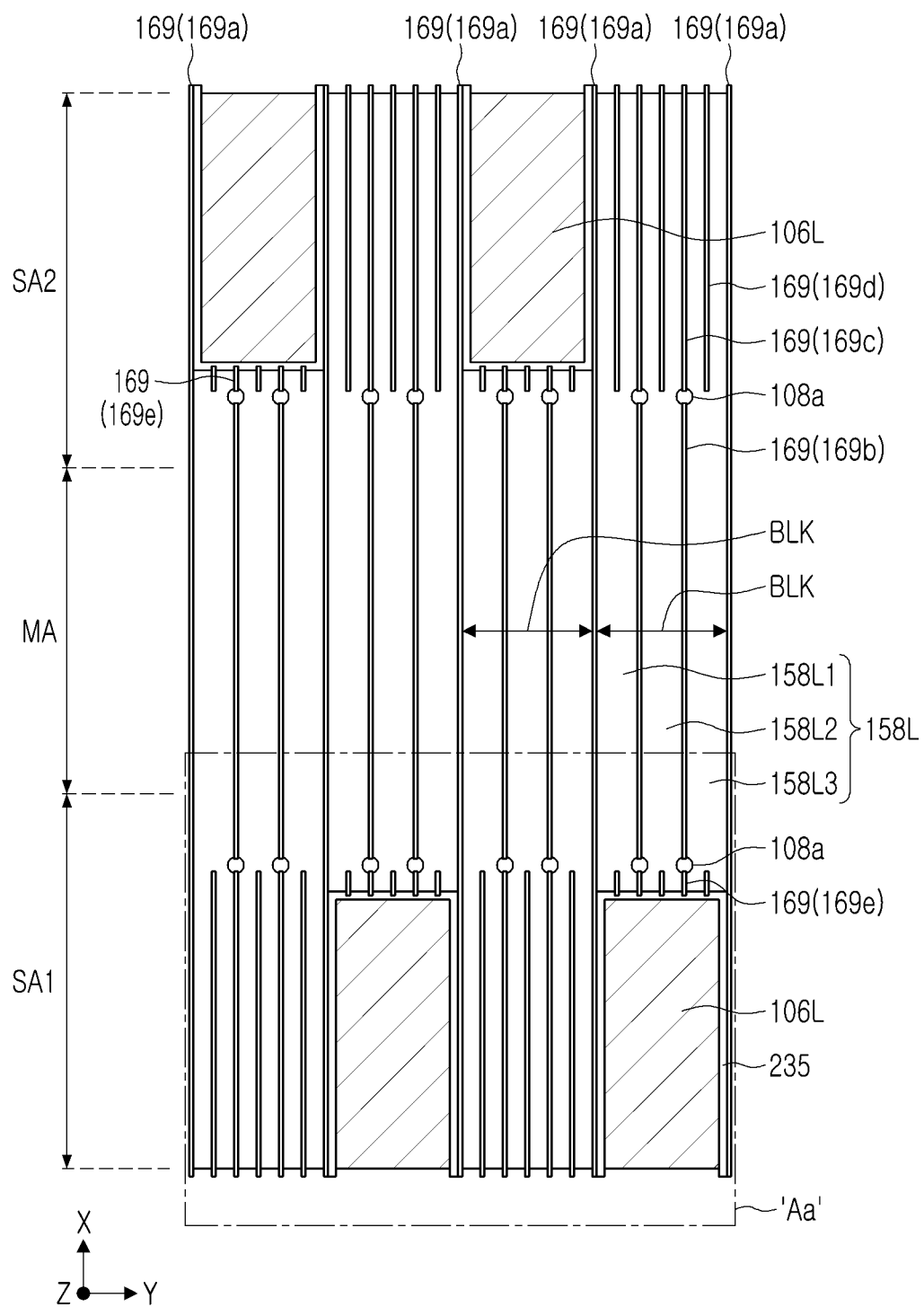
Figure 21:
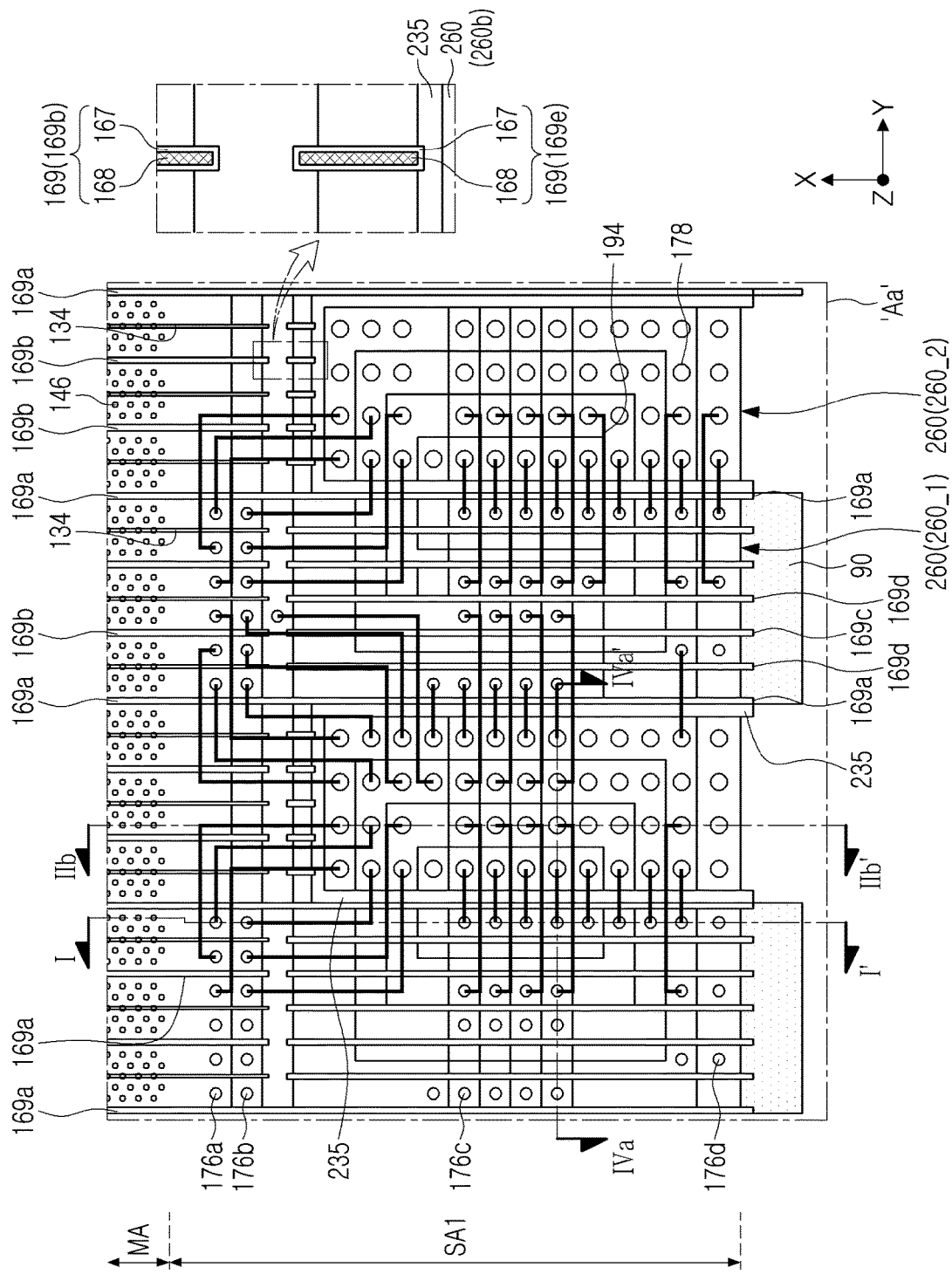
Figure 22A:
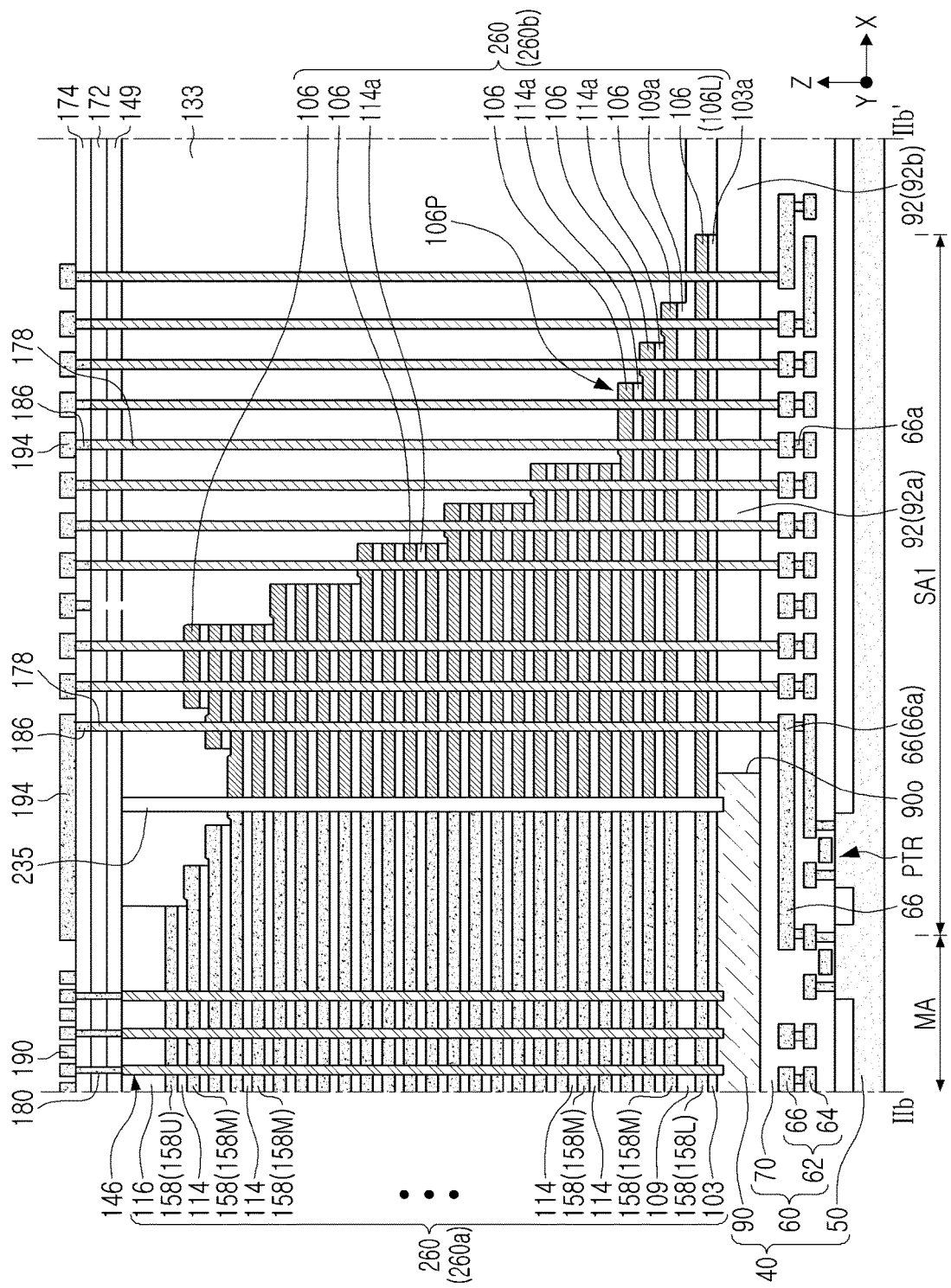
Figure 22B:
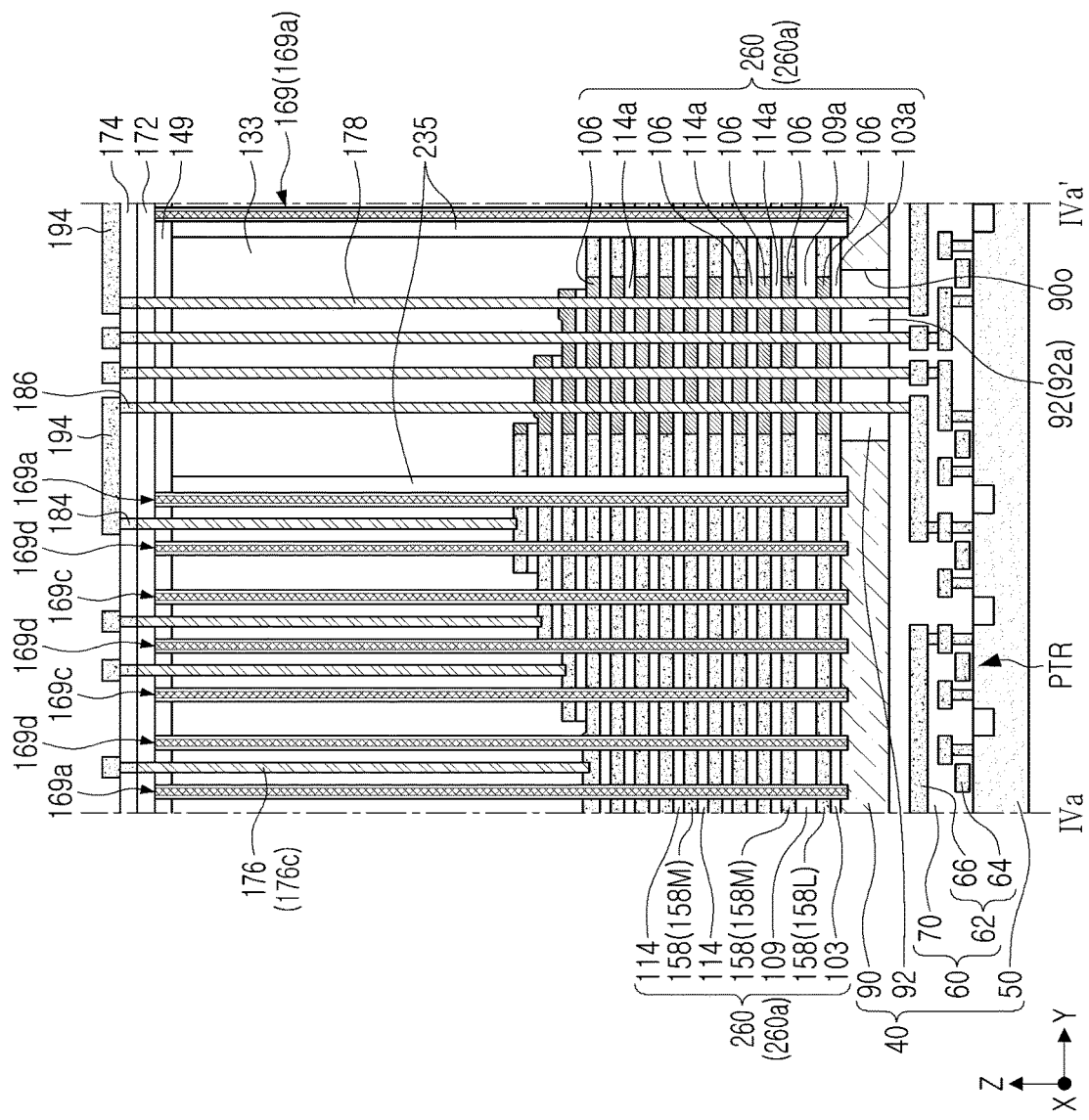

Next, a modified example of the semiconductor device according to an example embodiment will be described with reference to FIGS. 19, 20, 21, 22A, and 22B. In FIGS. 19 to 22B, FIG. 19 is a plan view illustrating a modified example of a semiconductor device according to an example embodiment, FIG. 20 is a partially enlarged view enlarging a portion indicated by 'Aa' of FIG. 19, FIG. 22A is a schematic cross-sectional view illustrating a region taken along line IIb-IIb' of FIG. 21, and FIG. 22B is a schematic cross-sectional view illustrating a region taken along line IVa-IVa' of FIG. 21. Hereinafter, when a modified example of a semiconductor device according to an example embodiment is described with reference to FIGS. 19 to 22B, among the components described above with reference to FIGS. 4 to 18B, redundant components will be described directly, without any explanation, and only modified portions of the modified components will be described. Therefore, when the components described in FIGS. 4 to 18B are directly described below without further explanation, these components may be understood as being described in the foregoing FIGS. 4 to 18B.

Referring to FIGS. 19 to 22B, the lower structure 40 may be provided as described above.

The stack structures 260 may be disposed on the lower structure 40. Each of the stack structures 260 may be provided as a first stack region 260a and a second stack region 260b.

The first stack region 260a may include the first layers 103, 109, 114, and 116 as well as the second layers 158, alternately and repeatedly stacked, in the same manner as the first stack region 160a.

The second stack region 260b may include the third layers 103a, 109a, and 114a, as well as the fourth layers 106, alternately and repeatedly stacked, in the same manner as the second stack region 160b.

The first stack region 160a and the second stack region 160b, described previously with reference to FIGS. 4 to 18B, may be in contact with each other. However, in an example embodiment, the first stack region 260a and the second stack region 260b may be separated from each other by a dam 235.

Thus, each of the stack structures 260 may include the first stack region 260a and the second stack region 260b, spaced apart from each other. The dam 235 may be in contact with the second stack region 260b, and may allow the second stack region 260b to be spaced apart and separated from the separation structures 169.

In an example, a planar shape of the peripheral circuit connection wirings 194 illustrated in FIGS. 6 and 17 may be similarly applied to the plan view of FIG. 21. Thus, the peripheral circuit connection wirings 194 may be electrically connected to the string select gate contact structures 176a and 176b, the word line contact structures 176c, as well as the ground select contact structures 176d.

The separation structures 169 may be disposed on the lower structure 40. Each of the separation structures 169 may include the separation pattern 168 and the separation spacer 167 on a side surface of the separation pattern 168, as described above.

The separation structures 169 may include the block separation structures 169a, as described above. The separation structures 169 may include auxiliary separation structures. The auxiliary separation structures may include first auxiliary separation structures 169b, second auxiliary separation structures 169c, third auxiliary separation structures 169d, and fourth auxiliary separation structures 169e.

The first auxiliary separation structures 169b may be extended to an interior of a portion of the first side region SA1 and the second side region SA2 while intersecting the memory array region MA. The second auxiliary separation structures 169c are disposed in a region in which the second stack region 260b is not located, of the first side region SA1 and the second side region SA2, and may have an end portion opposing an end portion of the first auxiliary separation structures 169b. The third auxiliary separation structures 169d may be disposed on both sides of the second auxiliary separation structures 169c. The fourth auxiliary separation structures 169e may be disposed in the first stack region 260a of the first side region SA1 and the second side region SA2. The fourth auxiliary separation structures 169e may be in contact with the dam 235 that is disposed between the first stack region 260a and the second stack region 260b. The dam 235 may be in contact with the second stack region 260b and may be spaced apart from the second stack region 260b.

In the first stack region 260a, first isolation insulating layers 108a may be disposed below the intermediate gate patterns 158M of the second layers 158 which may be gate patterns as described above. The first isolation insulating layers 108a may be disposed between end portions of the first auxiliary separation structures 169b and the second auxiliary separation structures 169c in a side region in which the second stack region 260b is not located, of the first side region SA1 and the second side region SA2, and may be disposed between end portions of the first auxiliary separation structures 169b and the fourth auxiliary separation structures 169e, opposing each other, in a side region in which the second stack region 260b is located.

Thus, in a manner similar to that described with reference to FIGS. 4 to 6 and FIGS. 10 to 11C, between two adjacent block separation structures 169a, the lowermost gate pattern 158L may be separated into a plurality of lowermost gate patterns by the first auxiliary separation structures 169b, the second auxiliary separation structures 169c, and the fourth auxiliary separation structures 169e, as well as the first isolation insulating layers 108a.

Figure 23:
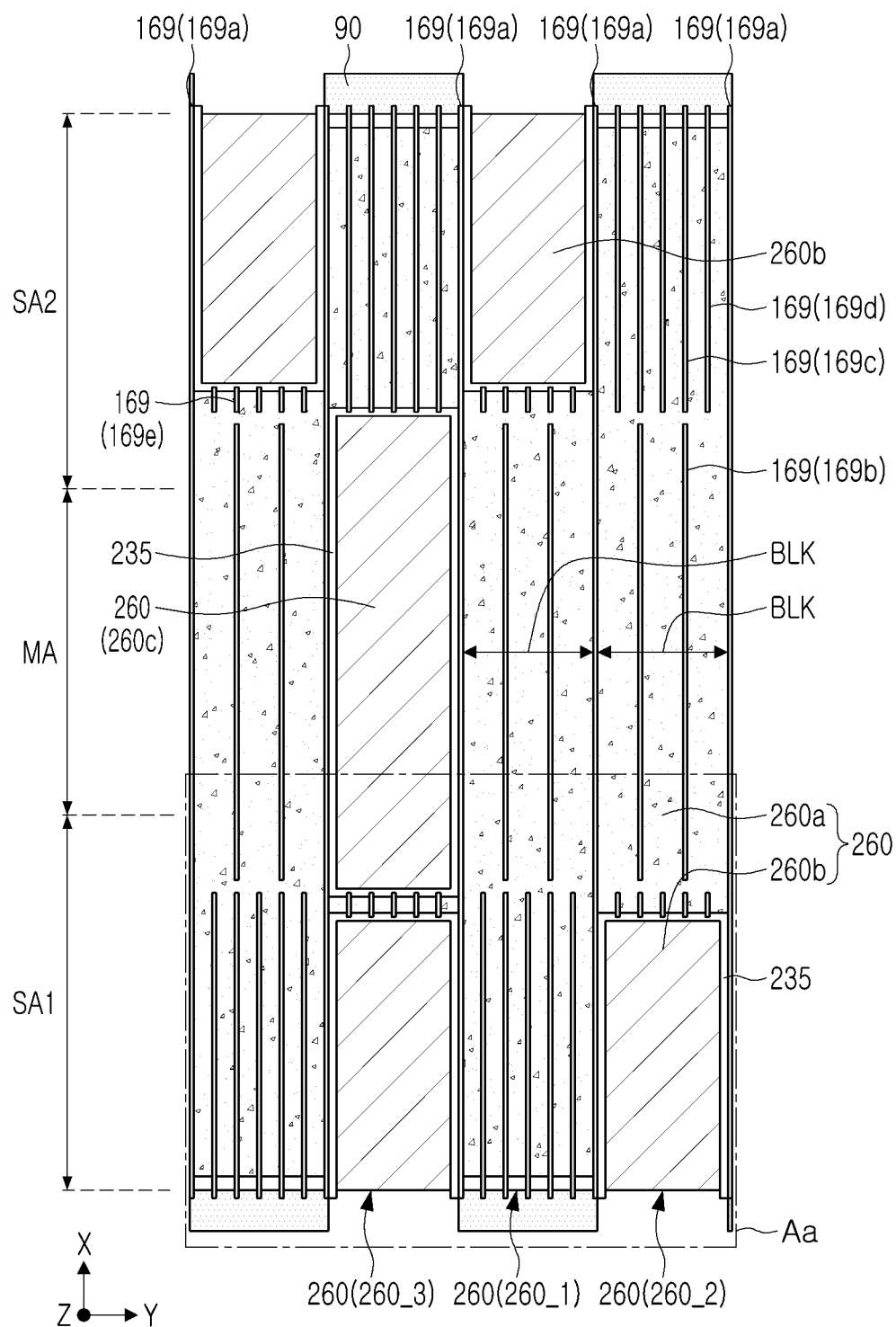
FIGS. 23, 24, 25A and 25B are drawings illustrating a modified example of a semiconductor device according to an example embodiment.
Figure 24:
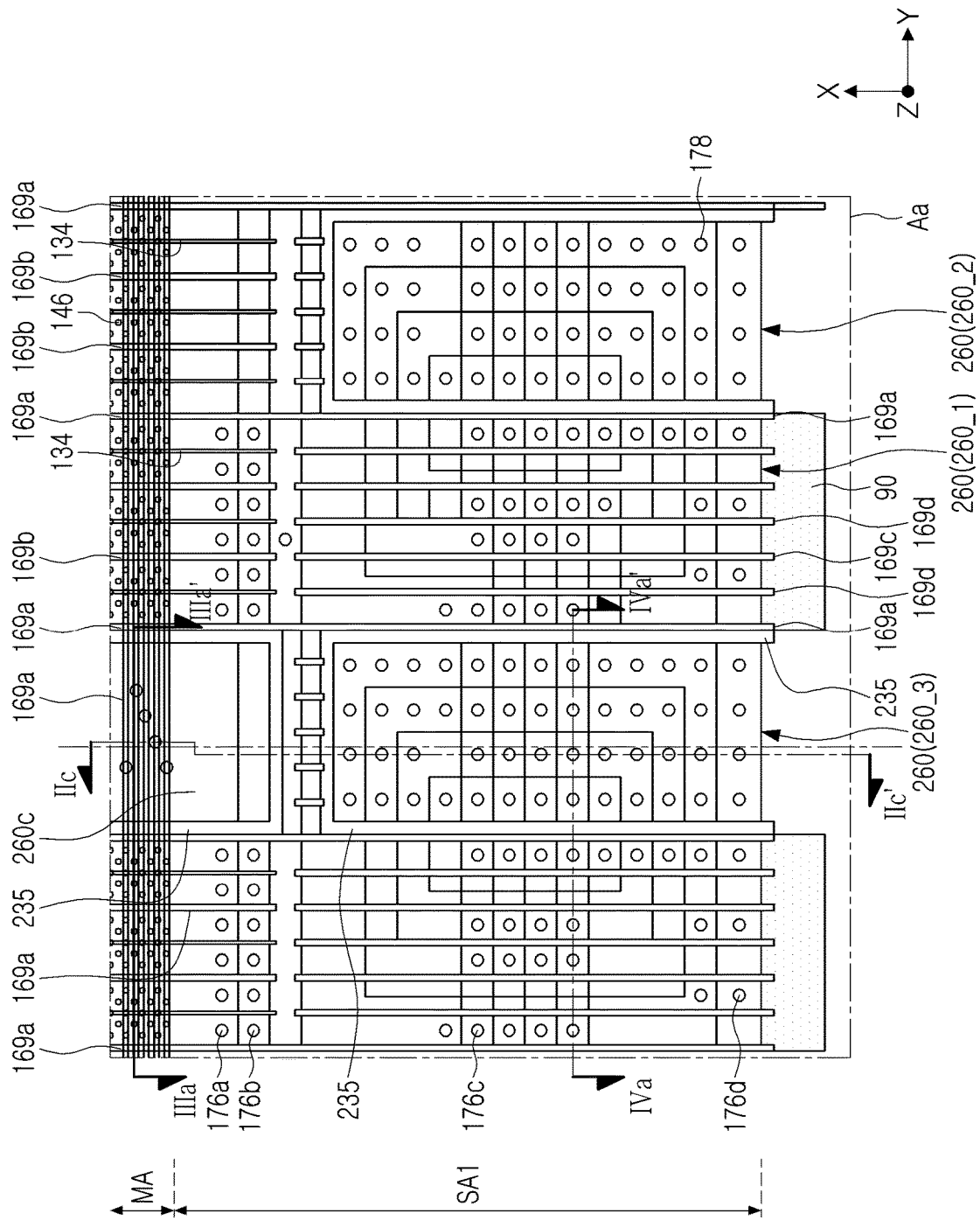
Figure 25A:
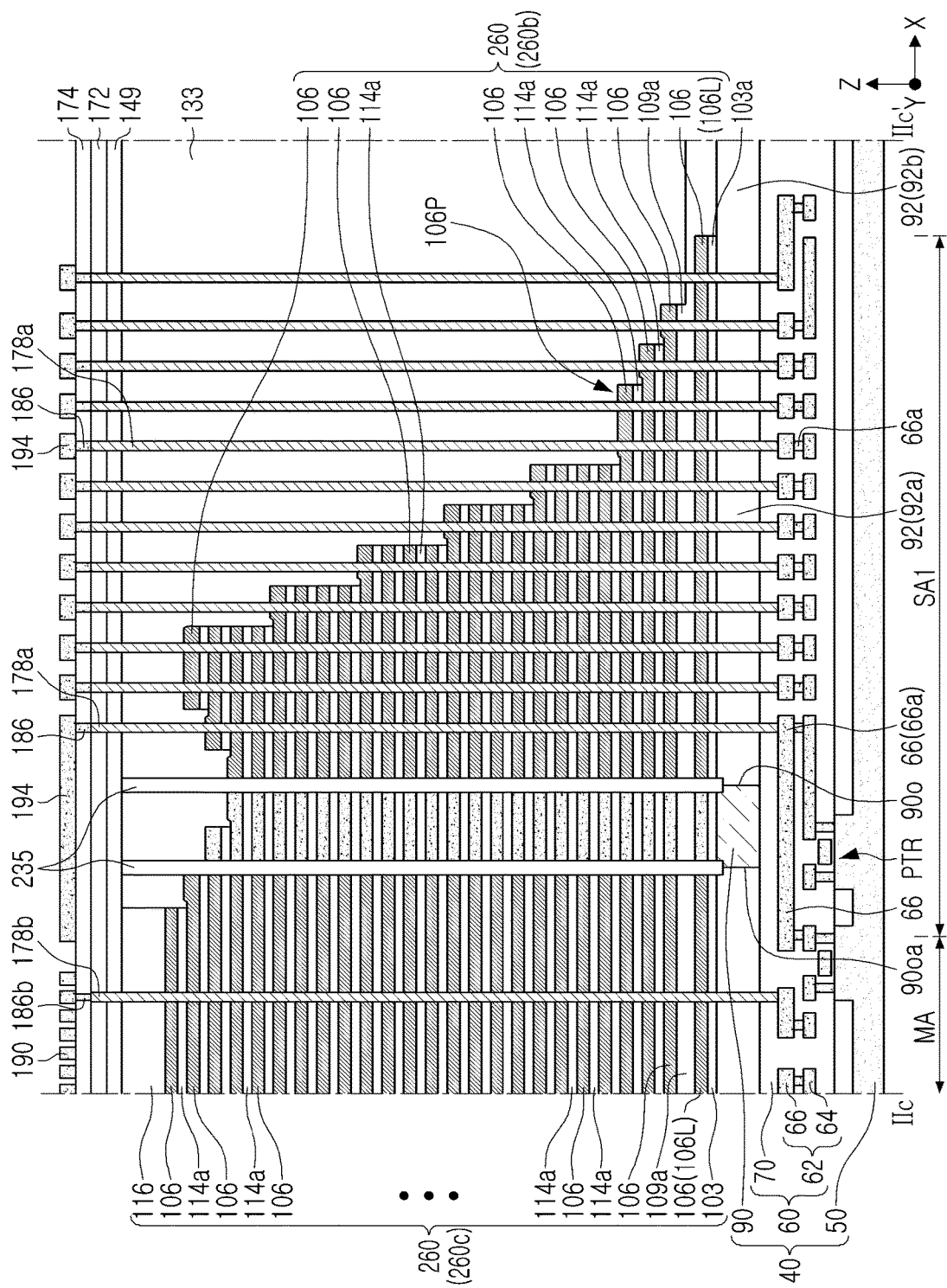
Figure 25B:
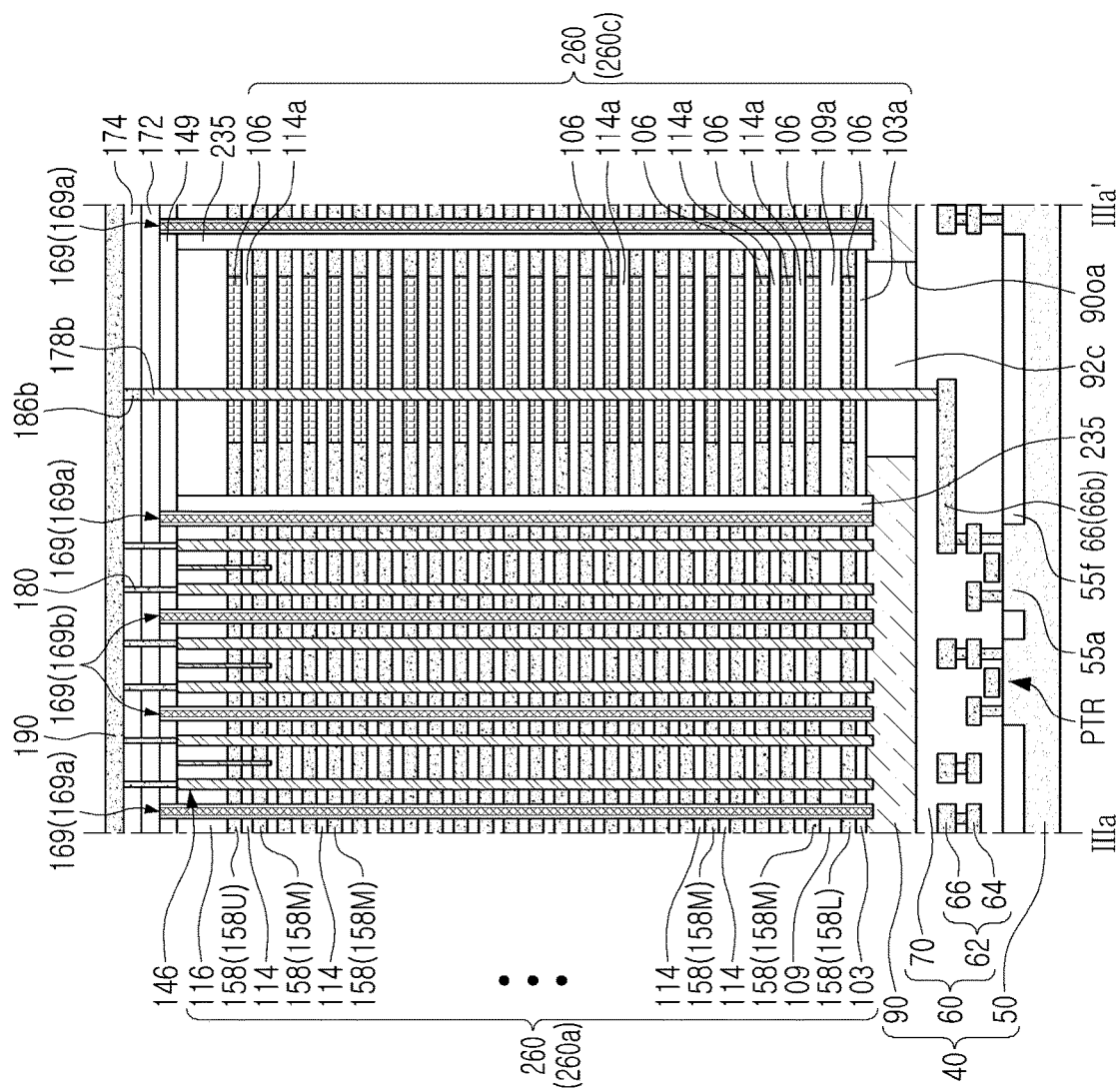

In an example embodiment, the stack structure 260 may further include third stack block structures, in a manner different from the first stack block structures 260_1 and the second stack block structures 260_2. The third stack block structures may include third stack regions. The third stack block structures will be described above with reference to FIGS. 23 to 25B. FIG. 23 is a plan view illustrating a semiconductor device according to an example embodiment, FIG. 24 is a partially enlarged view enlarging a portion indicated by 'Aa' of FIG. 23, FIG. 25A is a schematic cross-sectional view illustrating a region taken along line IIc-IIc' of FIG. 24, and FIG. 25B is a schematic cross-sectional view illustrating a region taken along line of FIG. 24. The components described above may be directly cited and described without further explanation.

Referring to FIGS. 23 to 25B, the stack structure 260 may further include a third stack block structure 260_3, together with the first stack block structure 260_1 and the second stack block structure 260_2, described above.

The third stack structure 260_3 may be located between two adjacent block separation structures 169a. The third stack block structure 260_3 may include a third stack region 260c, together with the first stack region 260a and the second stack region 260b. The third stack region 260c may intersect the memory array region MA. The third stack region 260c may include the third layers 103a, 109a, and 114a as well as the fourth layers 106, alternately and repeatedly stacked as described above.

Side surfaces of the third stack region 260c may be surrounded by a dam 235. Thus, the third stack region 260c may be spaced apart from the first stack region 260a and the block separation structures 169a by the dam 235. The dam 235 may be formed of silicon oxide. The separation structures 169 need not be disposed in the third stack region 260c, and may be spaced apart from the separation structures 169.

A bit line peripheral contact structure 178b, the same as that illustrated in FIGS. 16A to 18B, may be provided. The bit line peripheral contact structure 178b may pass through the third stack region 260c in the memory array region MA. Thus, as described with reference to FIGS. 16A to 18B, the bit line peripheral contact structure 178b may pass through the third stack region 260c in the memory array region MA and a gap fill insulating layer 92c below the memory array region MA, and may be in contact with a peripheral contact pad 66b of the peripheral circuit structure 60. A bit line peripheral contact plug 186b, allowing the bit line peripheral contact structure 178b and the bit line 190 to be electrically connected to each other, may be provided.

Figure 26:
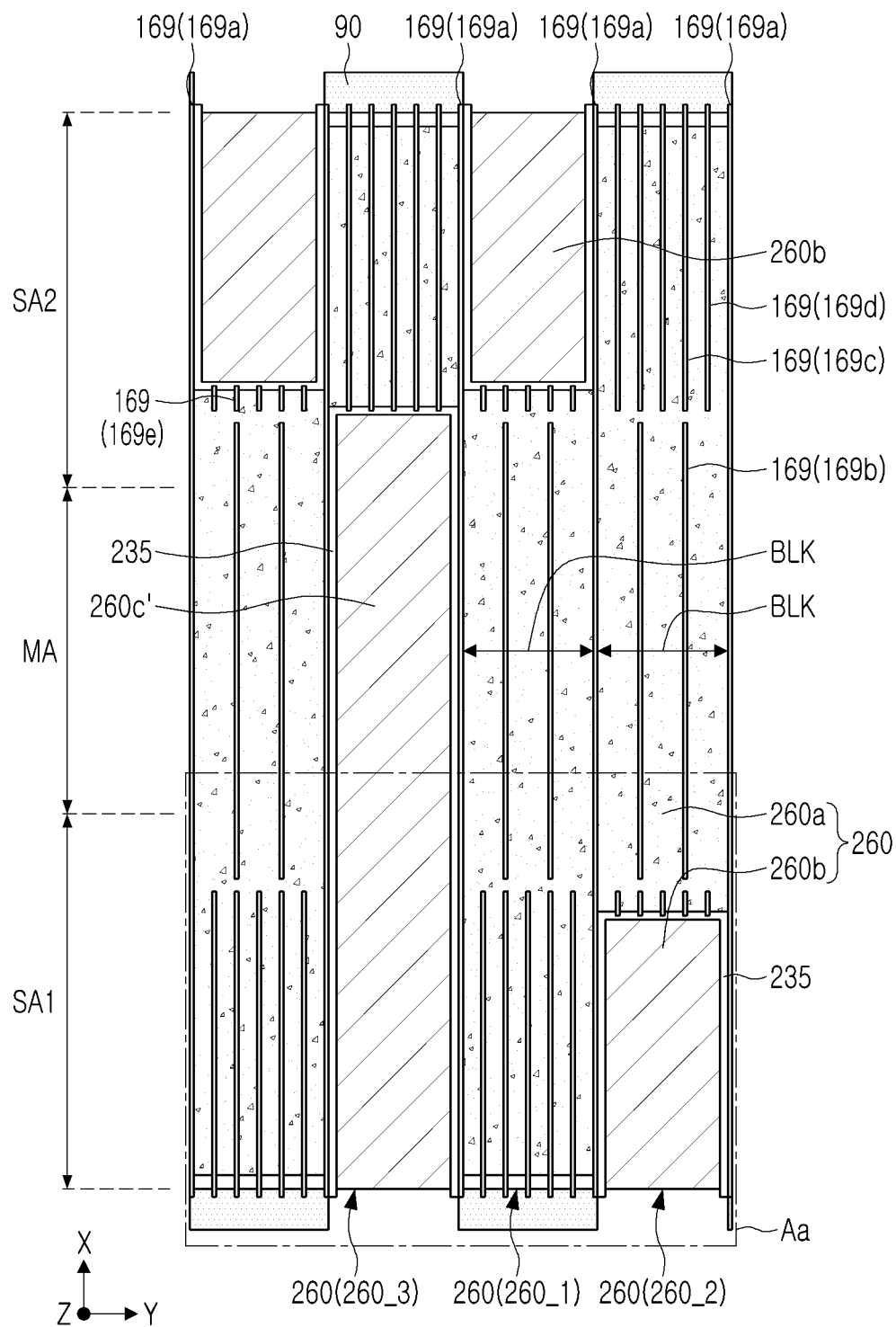
FIGS. 26 and 27 are plan views illustrating a modified example of a semiconductor device according to an example embodiment.
Figure 27:
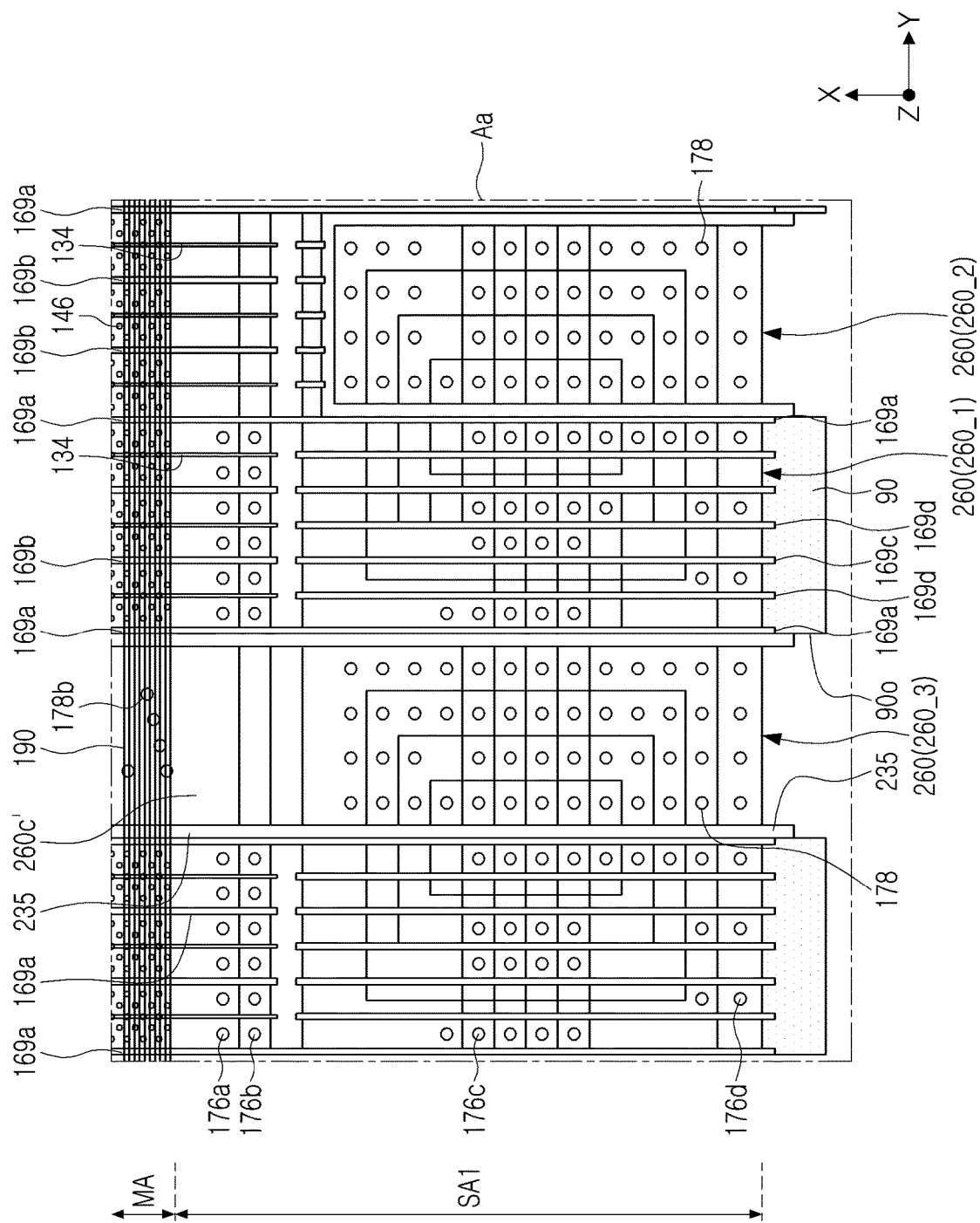

In the third stack block structure 260_3 described above, the second stack region 260b and the third stack region 260c may be spaced apart from each other. However, the inventive concept is not limited thereto. As illustrated in FIGS. 26 and 27, the second stack region and the third stack region (260b and 260c of FIGS. 23 to 25B) are merged into a third stack region 260c'. Here, FIG. 26 is a plan view illustrating a semiconductor device including the third stack region 260c' and FIG. 27 is a partially enlarged view enlarging a portion indicated by 'Aa' of FIG. 26. A dam 235 may be disposed between the third stack region 260c' and the first stack region 260a, and the third stack region 260c' and the block separation structures 169a.

Figure 28:
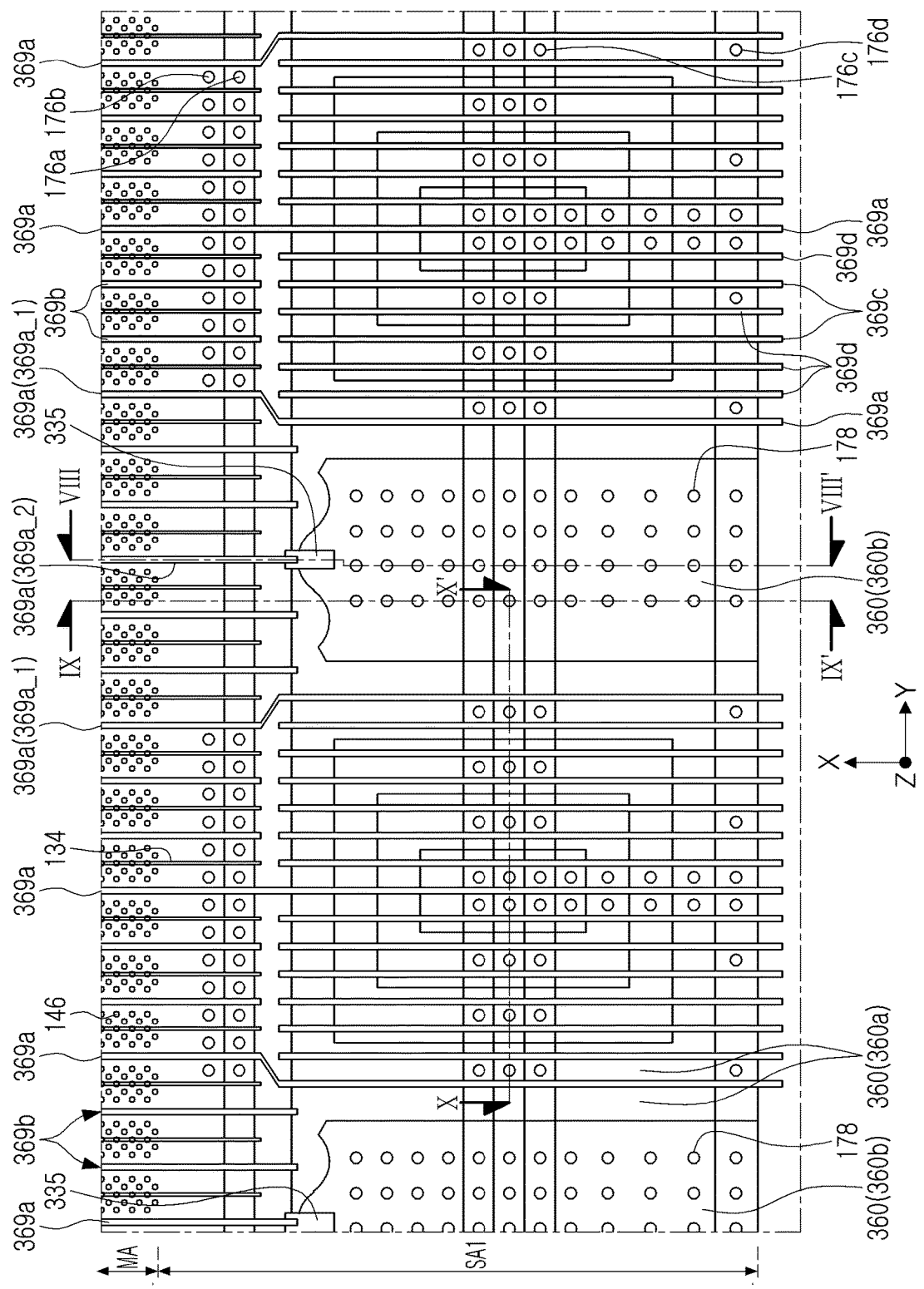
FIGS. 28 and 29A to 29C are drawings illustrating a modified example of a semiconductor device according to an example embodiment.
Figure 29A:
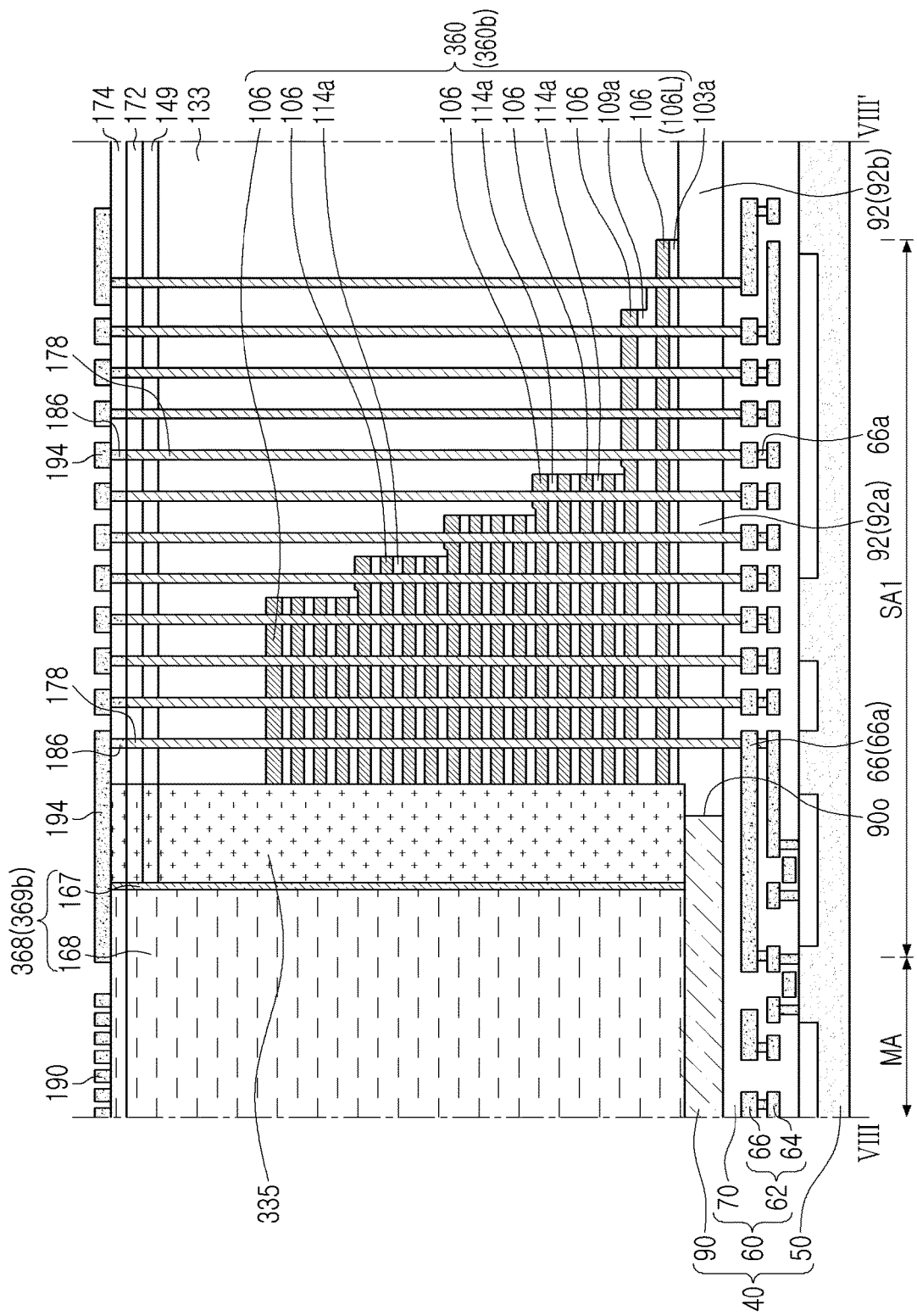
Figure 29B:
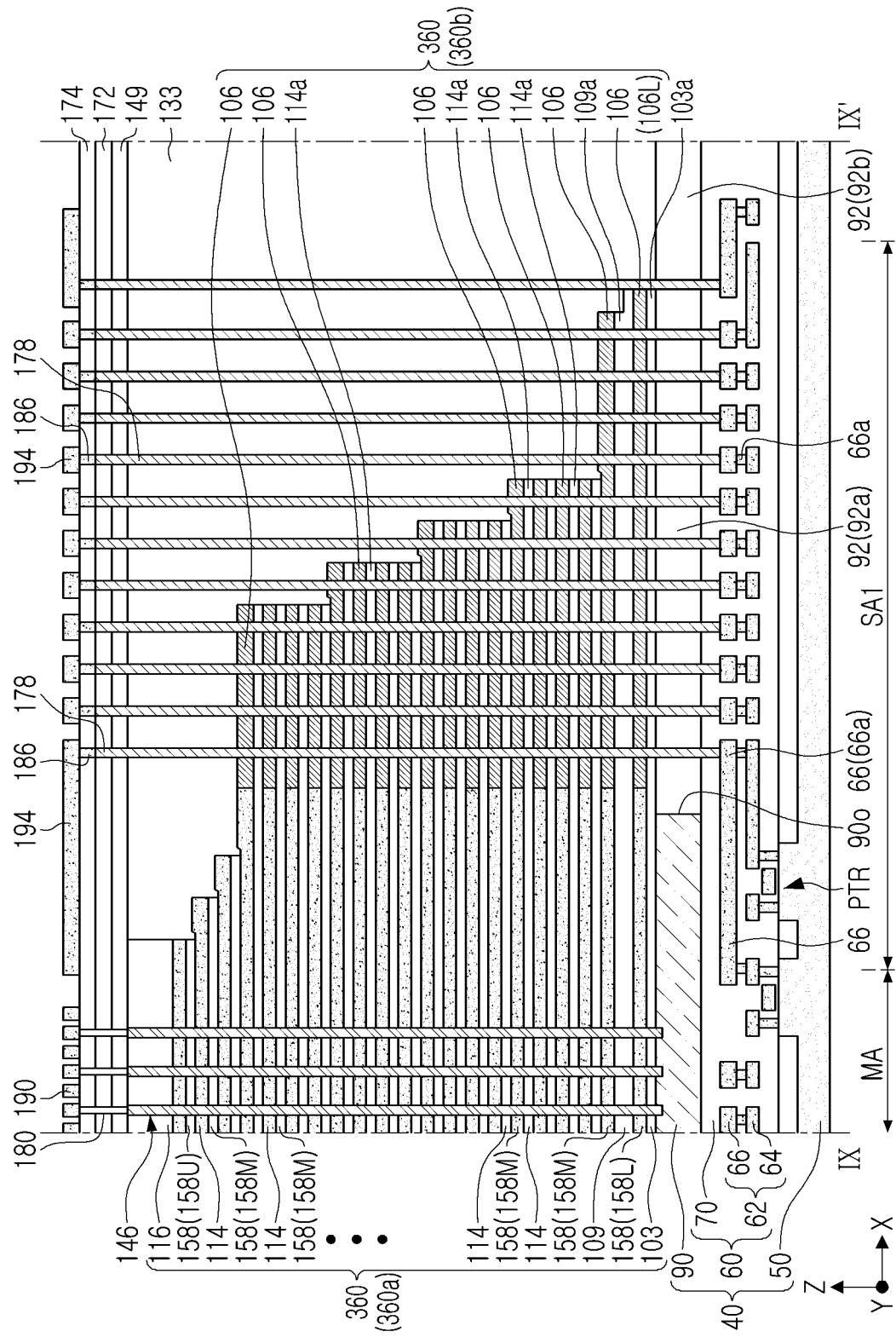
Figure 29C:
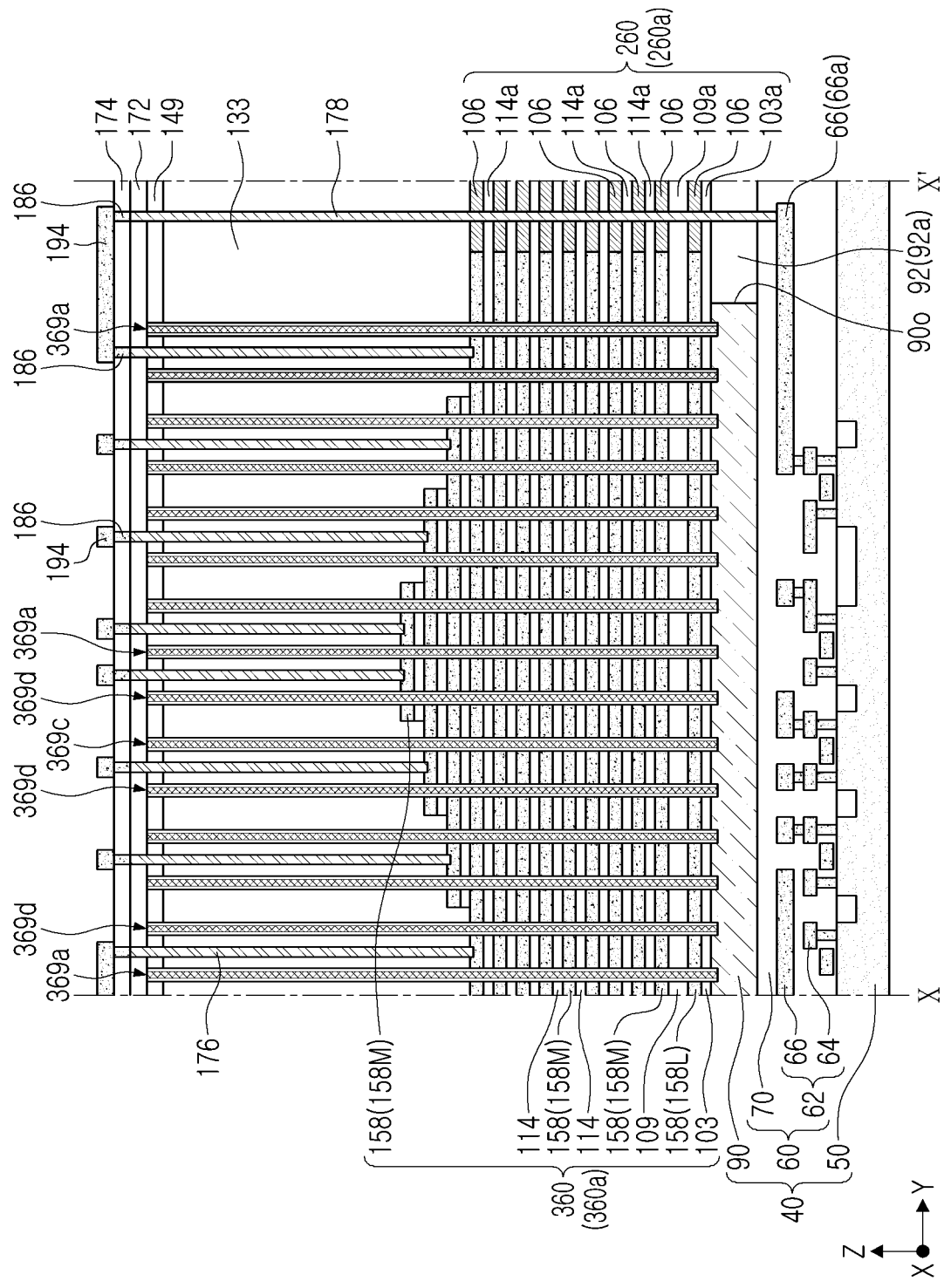

In the example embodiments described with reference to FIGS. 4 to 27, the block separation structures 169a may have the same length. However, the inventive concept is not limited thereto, and may be modified. An example of a semiconductor device including block separation structures which may be modified as described above will be described with reference to FIGS. 28 to 29C. Hereinafter, components the same as or similar to the components, described above, will be described directly or without explanations, or descriptions thereof will be omitted. In FIGS. 28 to 29C, FIG. 28 is a plan view illustrating a modified example of a semiconductor device according to an example embodiment, FIG. 29A is a cross-sectional view illustrating a region taken along line VIII-VIII' of FIG. 28, FIG. 29B is a cross-sectional view illustrating a region taken along line IX-IX' of FIG. 28, and FIG. 29C is a cross-sectional view illustrating a region taken along line X-X' of FIG. 28.

In a modified example, referring to FIGS. 28 to 29C, a stack structure 360 may be disposed on the lower structure 40 described above. The stack structure 360 may include a first stack region 360a and a second stack region 360b.

In the stack structure 360, the second stack region 360b may be disposed in a side region adjacent to a memory array region MA, and the first stack region 360a may be a region other than the second stack region 360b. The side region may be a region, of the first side region SA1 and the second side region SA2, described above.

The first stack region 360a may be formed of material layers the same as that of the first stack region 160a described above, and the second stack region 360b may be formed of material layers the same as that of the second stack region 160b described above. Thus, the first stack region 360a may include the first layers 103, 109, 114, and 116 as well as the second layers 158, repeatedly and alternately stacked as described above, while the second stack region 360b may include the third layers 103a, 109a, and 114a, as well as the fourth layers 106, repeatedly and alternately stacked. The first layers 103, 109, 114, and 116, the second layers 158, the third layers 103a, 109a, and 114a, as well as the fourth layers 106 are described with reference to FIGS. 4 to 8, and a detailed description thereof will be omitted.

The separation structures may be disposed on the lower structure 40. The separation structures may include block separation structures 369a and auxiliary separation structures 369b, 369c, and 369d. Each of the separation structures 369a, 369b, 369c, and 369d may include the separation pattern (168 of FIG. 8) and the separation spacer (167 of FIG. 8) on a side surface of the separation pattern (168 of FIG. 8), described above.

The block separation structures 369a may include a first block separation structure 369a_1 and a second block separation structure 369a_2. For example, the first block separation structure 369a_1 may intersect and separate the memory array region MA and the side region (for example, the first side region SA1). The second block separation structures 369a_2 may be extended into a portion of the side region (for example, the first side region SA1) while intersecting the memory array region MA. Thus, a length of the second block separation structure 369a_2 may be shorter than a length of the first block separation structure 369a_1.

The second stack regions 360b may be spaced apart from each other in the side region (for example, the first side region SA1), and portions of the first stack regions 360a may be disposed between the second stack regions 360b.

In the side region, the second stack regions 360b may oppose end portions of the second block separation structures 369a_2. A dam 335 may be disposed between an end portion of the second block separation structures 369a_2 and the second stack regions 360b. The dam 335 may be formed of silicon oxide.

The second block separation structure 369a_2 may be located between two adjacent first block separation structures 369a_1 located in both sides of the second stack region 360b. The second stack region 360b, the second block separation structure 369a_2, and the dam 335 may be located between the two adjacent first block separation structures 369a_1 located in both sides of a second stack region 360b. Thus, a plurality of memory blocks, for example, two memory blocks (BLK of FIGS. 1 and 2), may be disposed between the two adjacent first block separation structures 369a_1 located in both sides of the second stack region 360b. The peripheral contact structures 178, described above, may pass through the second stack region 360b.

Figure 30:
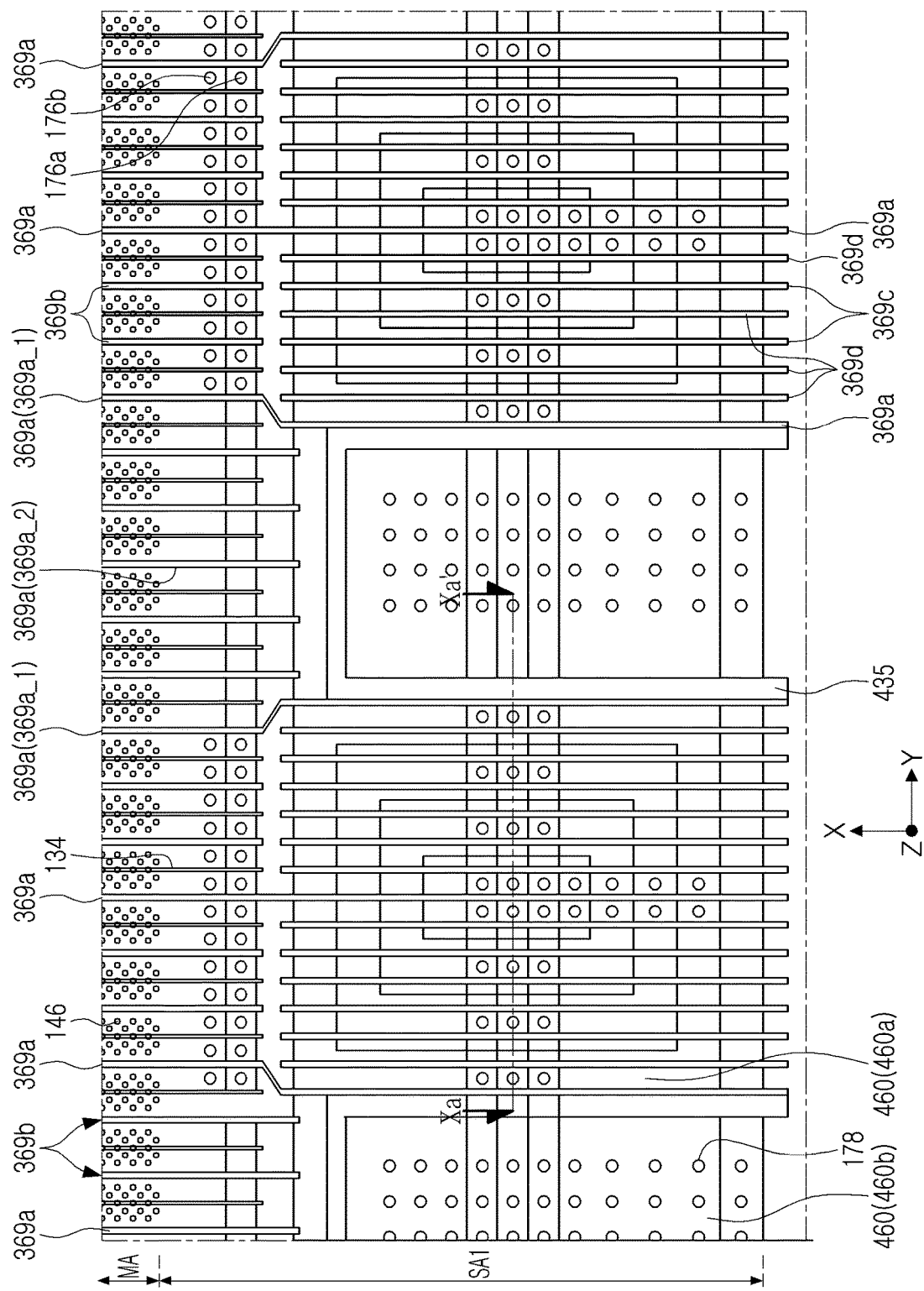
FIGS. 30 and 31 are drawings illustrating a modified example of a semiconductor device according to an example embodiment.
Figure 31:
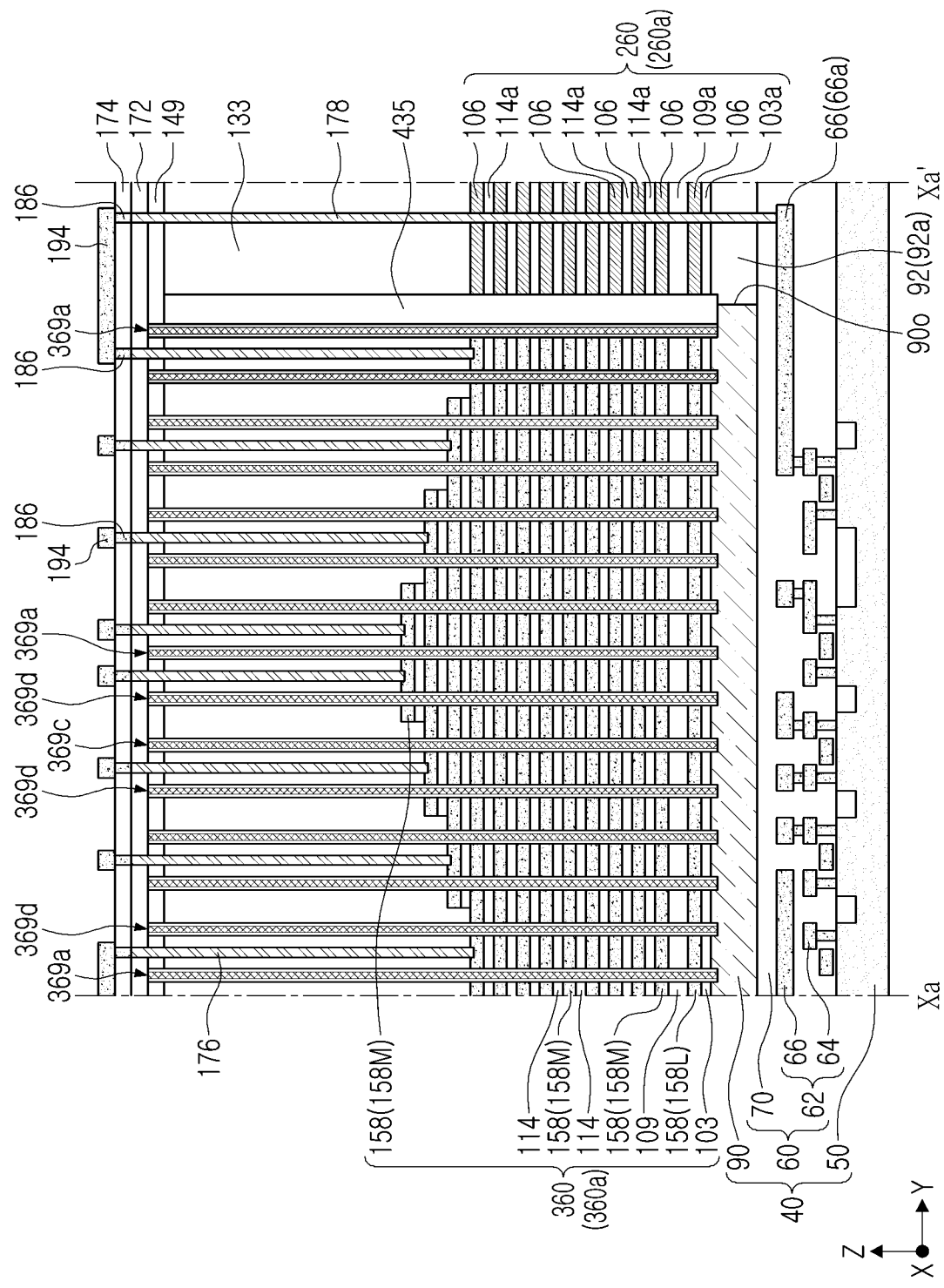

The first stack region 360a and the second stack region 360b may be in contact with each other. However, the inventive concept is not limited thereto. The first stack region 360a and the second stack region 360b may be modified to a first stack region and a second stack region, spaced apart from each other. An example of a semiconductor device including a first stack region and a second stack region which may be modified as described above will be described with reference to FIGS. 30 to 31. FIG. 30 is a plan view illustrating a modified example of a semiconductor device according to an example embodiment, and FIG. 31 is a cross-sectional view illustrating a region taken along line Xa-Xa' of FIG. 30.

In a modified example, referring to FIGS. 30 and 31, the first stack region and the second stack region (360a and 360b of FIGS. 28 to 29C) described with reference to FIGS. 28 to 29C may be modified to a first stack region 460a and a second stack region 460b, separated by a dam 435. The dam 435 is disposed between the first stack region 460a and the second stack region 460b, and may allow the second stack region 460b to be separated from the first stack region 460a and to be separated from the separation structures 369a and 369b.

Figure 32:
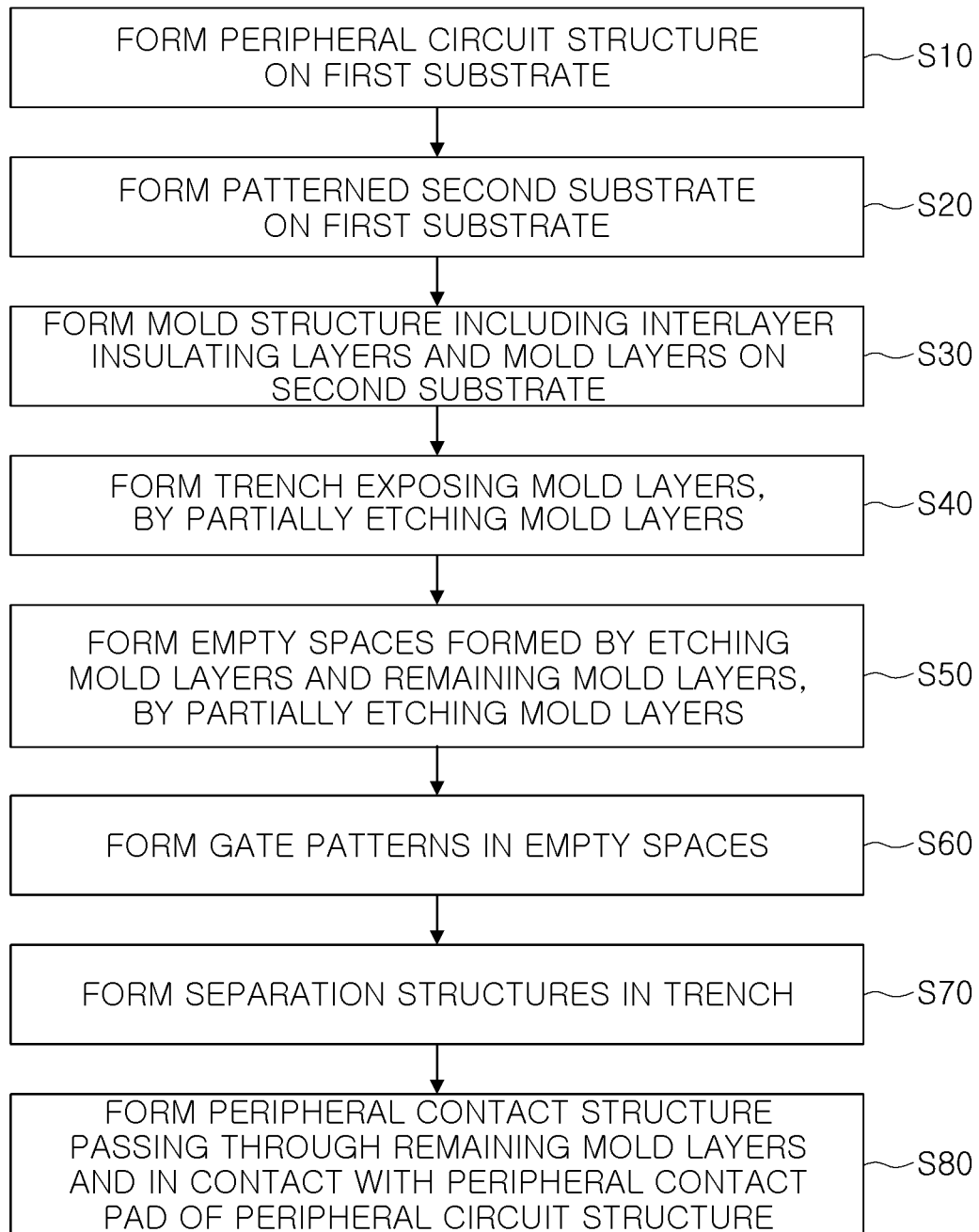
FIGS. 32, 33A and 33B are drawings illustrating an example of a method for forming a semiconductor device according to an example embodiment.
Figure 33A:
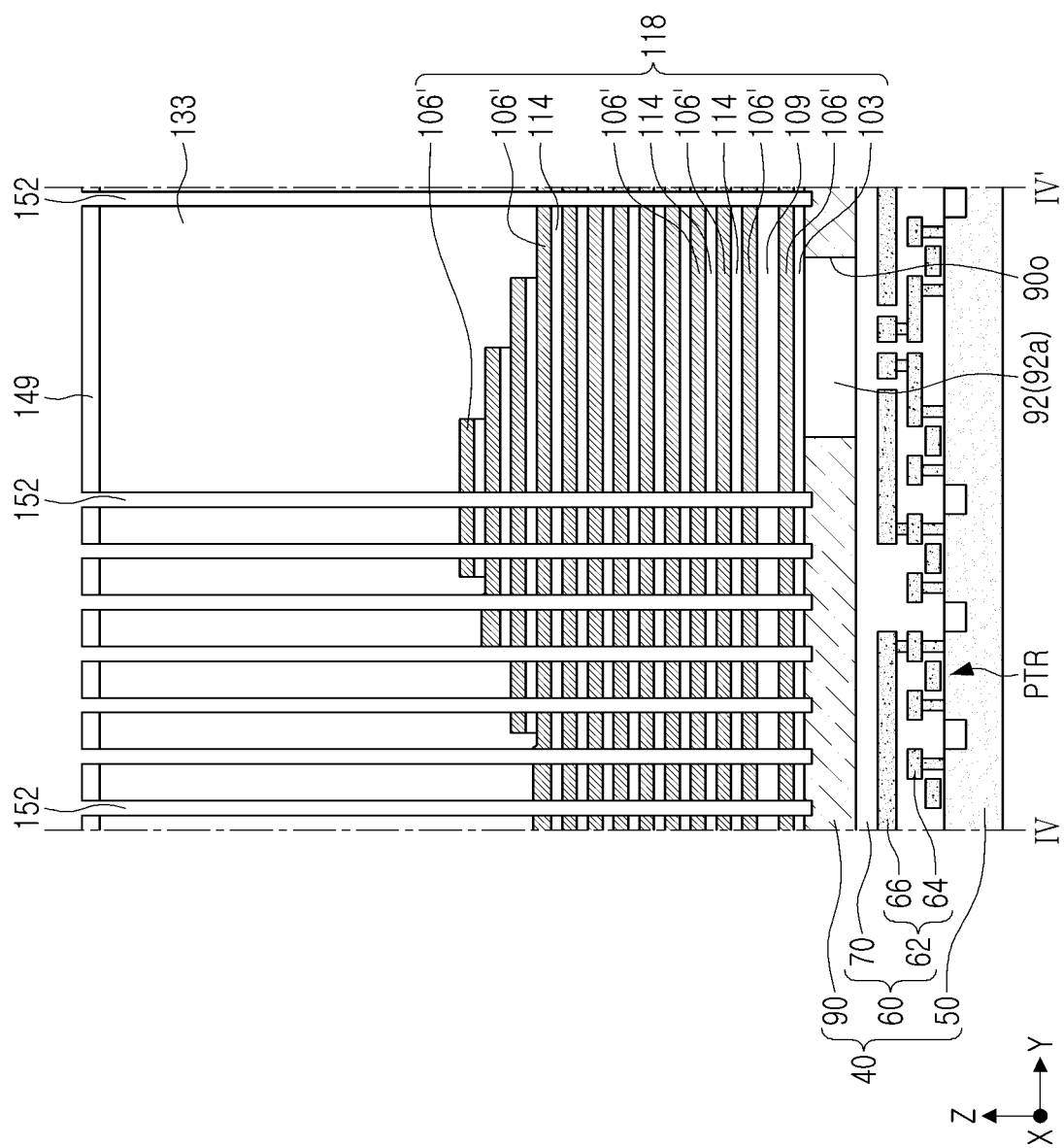
Figure 33B:
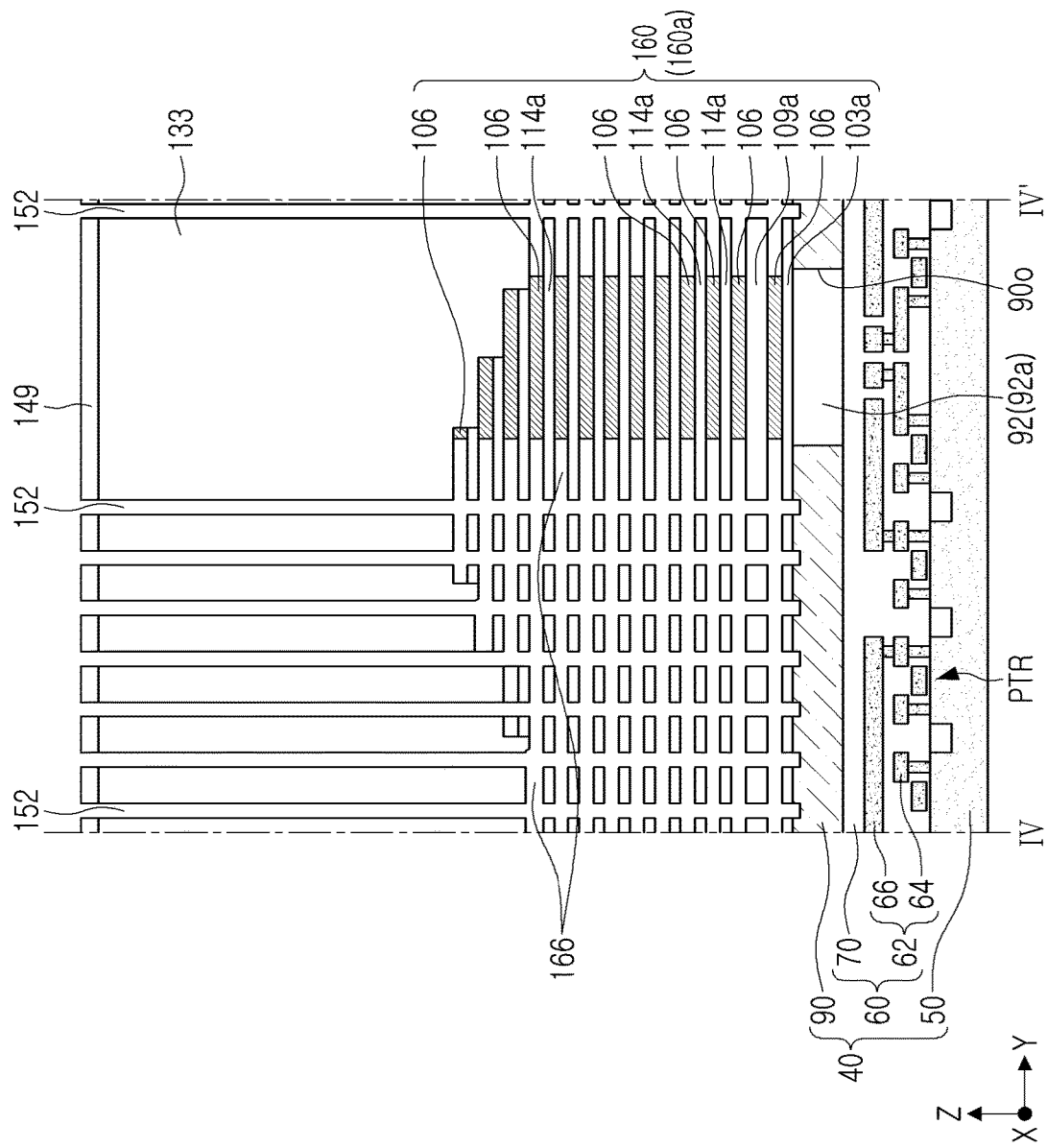

Next, a method of forming a semiconductor device according to an example embodiment will be described. First, with reference to FIGS. 32 to 33B, together with FIGS. 4 to 6, an example of a method of forming a semiconductor device according to an example embodiment will be described. FIG. 32 is a process flow chart illustrating an example of a method of forming a semiconductor device according to an example embodiment, and FIGS. 33A and 33B are cross-sectional views illustrating a region taken along line IV-IV' of FIG. 6 to describe an example of a method of forming a semiconductor device according to an example embodiment.

Referring to FIGS. 4 to 6, and FIGS. 32 and 33A, a peripheral circuit structure 60 may be formed on a first substrate 50 (S10). A second substrate 90, having been patterned, may be formed on the first substrate 50 (S20). The second substrate 90 may be formed on the peripheral circuit structure 60. Thus, the first substrate 50, the peripheral circuit structure 60, and the second substrate 90 may form the lower structure 40 described with reference to FIGS. 4 to 8. The second substrate 90 is patterned, thereby having openings 90o. An intermediate insulating layer 92, filling the openings 90o, may be provided.

A mold structure 118, including interlayer insulating layers 103, 109, and 114, as well as mold layers 106', alternately and repeatedly stacked on the second substrate, may be provided (S30). The mold structure 118 is patterned, thereby having the mold patterns 106 in the form of a staircase described with reference to FIGS. 4 to 8. The form of a staircase may be formed in a first side region and a second side region (SA1 and SA2 of FIG. 4), located in both sides of a memory array region (MA of FIG. 4) as described with reference to FIGS. 4 to 8.

Then, a first capping insulating layer 133, covering a mold structure 118 on the first side region and the second side region (SA1 and SA2 of FIG. 4), may be provided. Then, a second capping insulating layer 149 may be formed on the first capping insulating layer 133. Before the second capping insulating layer 149 is formed, the vertical channel structures (146 of FIGS. 4 to 8), described with reference to FIGS. 4 to 8, may be formed in the memory array region MA.

Trenches 152 may be formed (S40). The trenches extended downwardly may pass through the second capping insulating layer 149, the first capping insulating layer 133 and the mold structure 118, thereby exposing the mold layers 106' through the trenches 152. The trenches 152 may be formed in a position in which separation structures 169, described with reference to FIGS. 4 to 8, is to be formed.

Referring to FIGS. 4 to 6, and FIGS. 32 and 33B, the mold layers 106' are partially etched, and empty spaces 166, formed by etching the mold layers 106', as well as remaining mold layers 106 may be provided (S50).

The remaining mold layers 106 may be referred to as the fourth layers 106 (or mold patterns 106), described with reference to FIGS. 4 to 8, while interlayer insulating layers, overlapping the remaining mold layers 106 in a vertical direction z, may be referred to as the third layers 103a, 109a, and 114a, described with reference to FIGS. 4 to 8.

Then, referring to FIGS. 4 to 8, second layers 158 may be formed in the empty spaces 166 of FIG. 33B (S60). Interlayer insulating layers 103, 109, and 114, overlapping the second layers 158, may be referred to as first layers. Thus, the first layers 103, 109, and 114 as well as the second layers 158 may form the first stack region 160a described previously with reference to FIGS. 4 to 8, while the third layers 103a, 109a, and 114a as well as the fourth layers 106 may form the second stack region 160b described with reference to FIGS. 4 to 8. Thus, the stack structure 160 including the first stack region 160a and the second stack region 160b, described with reference to FIGS. 4 to 8, may be provided.

Then, separation structures 169, filling the trenches (152 of FIG. 33B), may be provided (S70). Then, after the second capping insulating layer 149 is provided, gate contact structures 176 and peripheral contact structures 178, described with reference to FIGS. 4 to 8, may be provided. Then, after the third capping insulating layer 172 is provided, plugs 180, 184, and 186 are provided, and bit lines 190 and peripheral circuit connection wirings 194 may be provided (S80). Thus, a semiconductor device, described with reference to FIGS. 4 to 8, may be provided.

Figure 34:
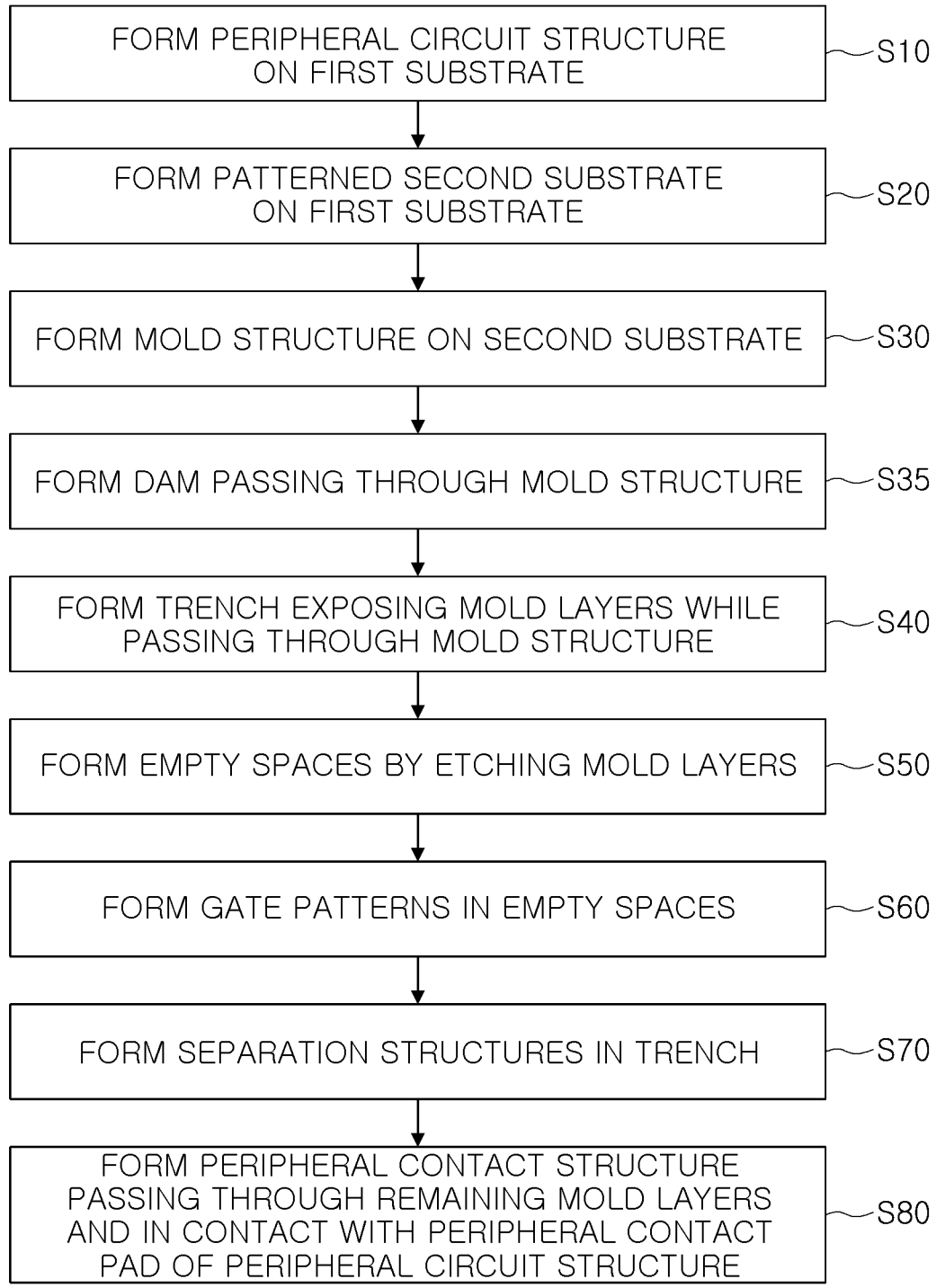
FIG. 34 is a process flow chart illustrating another example of a method for forming a semiconductor device according to an example embodiment.

Then, with reference to FIG. 34, an example of a method of forming a semiconductor device according to an example embodiment will be described. FIG. 34 is a process flow chart illustrating an example of a method for forming a semiconductor device according to an example embodiment.

Referring to FIG. 34, as described with reference to FIGS. 4 to 6, and FIGS. 32 and 33A, the mold structure (118 of FIG. 33A) and the first capping insulating layer 133 may be provided on the lower structure 40, described above. Then, a dam passing through the mold structure (118 of FIG. 33A) may be provided in step S35. The dam may be the dam 235, described with reference to FIGS. 19 to 22B. Then, as operations substantially similar to those described with reference to FIGS. 4 to 6, and FIGS. 32 and 33A are performed, the semiconductor device, described with reference to FIGS. 19 to 22B, may be provided.

According to the example embodiments described above, between two adjacent block separation structures 169a, a lowermost layer 158L, located in a lowermost portion of the second layers 158, may be separated into a plurality of lower select gate lines electrically insulated from each other, that is, ground select lines GSL, an uppermost layer 158U, located in an uppermost portion, may be separated into a plurality of upper select gate lines electrically insulated from each other, that is, string select lines SSL, and an intermediate layer 158M between the lowermost layer 158L and the uppermost layer 158U may be provided as a word line WL. Here, the number of the plurality of upper select gate lines, that is, string select lines SSL may be greater than the number of the plurality of lower select gate lines, that is, ground select lines GSL.

According to example embodiments, the second stack region 160b, through which the peripheral contact structure 178 electrically connected to a peripheral contact pad 66a of a peripheral circuit structure 60 passes, may be disposed in the first side region SA1 and the second side region SA2 provided in both sides of the memory cell array region MA. The second stack region 160b may be formed using an operation for forming the first stack region 160a through which the vertical channel structure 146 passes as described above. Thus, since the time and costs required to form the second stack region 160b are significantly reduced, productivity of the semiconductor device may be improved.

Moreover, since a space or an area occupied by the second stack region 160b through which the peripheral contact structure 178 passes is significantly reduced, an area required for disposing the peripheral contact structure 178 may be significantly reduced. Thus, a degree of integration of a semiconductor device may be improved.

As set forth above, according to example embodiments of the present inventive concept, a stack region through which a peripheral contact structure passes is disposed in a first side region and a second side region formed in both sides of a memory cell region, so a degree of integration of semiconductor devices may be improved.

While example embodiments have been shown and described above, it will be apparent to those skilled in the art that modifications and variations could be made without departing from the scope of the present disclosure, as defined by the appended claims.

What is claimed is:

1. A vertical memory device, comprising:
a substrate;
a plurality of block separation structures on the substrate and each extending in a first horizontal direction;
a plurality of first stack block structures on the substrate and each including a first side region having a plurality of extended regions and a second side region having two extended regions;
a plurality of second stack block structures on the substrate and each including a first side region having two extended regions and a second side region having a plurality of extended regions,
wherein the first stack block structures and the second stack block structures are alternately arranged in a second horizontal direction crossing the first horizontal direction, each of the first stack block structures being disposed between two adjacent block separation structures and each of the second stack block structures being disposed between two adjacent block separation structures;
a plurality of peripheral contact structures disposed between the two extended regions of each of the second stack block structures and between the two extended regions of each of the first stack block structures; and
a plurality of gate contact structures disposed on the second side region of each of the second stack block structures and the first side region of each of the first stack block structures.

2. The vertical memory device of claim 1, wherein the substrate includes a first substrate, a second substrate, a peripheral interconnection structure disposed therebetween, and an intermediate insulating layer positioned at the same height with the second substrate from the first substrate, and
wherein the second substrate includes an opening filled with the intermediate insulating layer.

3. The vertical memory device of claim 1, further comprising:
a plurality of mold patterns being disposed between the two extended regions of each of the first stack block structures and the two extended regions of each of the second stack block structures, the mold patterns being stacked vertically on each other in a staircase structure,
wherein the substrate includes a first substrate, a second substrate, a peripheral interconnection structure disposed therebetween, and an intermediate insulating layer positioned at the same height with the second substrate from the first substrate,
wherein the mold patterns are disposed on the intermediate insulating layer.

4. The vertical memory device of claim 3,
wherein the peripheral contact structures penetrate the mold patterns and the intermediate insulating layer to be connected to the peripheral interconnection structure.

5. The vertical memory device of claim 3,
wherein each of the first stack block structures includes a recessed surface connecting the two extended regions of the first stack block structures, and
wherein each of the first stack block structures includes a plurality of gate patterns stacked on each other, each gate pattern of the gate patterns being in contact with one of the mold patterns at the recessed surface.

6. The vertical memory device of claim 1, further comprising:
a plurality of peripheral circuit connection wirings each extending across one of the block separation structures to connect one of the peripheral contact structures to one of the gate contact structures.

7. The vertical memory device of claim 1, further comprising:
a plurality of vertical channel structures penetrating a memory array region of each of the first stack block structures, wherein the memory array region is disposed between the first side region and the second side region; and a plurality of first auxiliary separation structures penetrating vertically the memory array region of each of the first stack block structures; and
a plurality of second auxiliary separation structures penetrating vertically the first side region of each of the first stack block structures to define the extended regions of each of the first stack block structures.

8. The vertical memory device of claim 7,
wherein each of the first stack block structures is disposed in two adjacent block separation structures spaced apart from each other at a first spacing,
wherein the first auxiliary separation structures are arranged at a second spacing smaller than the first spacing, and
wherein the second auxiliary separation structures are arranged at a third spacing smaller than the second spacing.

9. A vertical memory device, comprising:
a substrate;
a plurality of gate patterns on the substrate and stacked in a vertical direction;
a first block separation structure and a second block separation structure penetrating the gate patterns so that the gate patterns are separated into a plurality of first gate patterns, a plurality of third gate patterns and a plurality of second gate patterns as listed;
a plurality of first gate contact structures each extending vertically to a corresponding first gate pattern of the first gate patterns;
a plurality of second gate contact structures each extending vertically to a corresponding second gate pattern of the second gate patterns;
a plurality of mold patterns on the substrate and stacked in a vertical direction;
a plurality of peripheral contact structures penetrating the mold patterns;
a first peripheral circuit connection wiring extending across the first block separation structure to connect one of the first gate contact structures to one of the peripheral contact structures; and
a second peripheral circuit connection wiring extending across the second block separation structure to connect one of the second gate contact structures to one of the peripheral contact structures,
wherein the third gate patterns and the mold patterns are disposed between the first block separation structure and the second block separation structure.

10. The vertical memory device of claim 9,
wherein the mold patterns each is positioned at the same height from the substrate with a corresponding gate pattern of the gate patterns.

11. The vertical memory device of claim 9,
wherein the third gate patterns include a plurality of first extended regions disposed between the first block separation structure and the mold patterns and a plurality of second extended regions disposed between the second block separation structure and the mold patterns.

12. The vertical memory device of claim 9,
wherein the substrate includes a peripheral circuit structure,
wherein the vertical memory device includes a first side region, a second side region and a memory array region therebetween,
wherein the first gate patterns are stacked on each other in the memory array region and the first side region and the first gate patterns includes a plurality of first gate pad regions that are stacked in the first side region and in a staircase structure,
wherein the second gate patterns are stacked on each other in the memory array region and the first side region and the second gate patterns include a plurality of second gate pad regions that are stacked in the first side region and in a staircase structure,
wherein the third gate patterns are stacked on each other in the memory array region and the second side region,
wherein the mold patterns are stacked in a staircase on each other in the first side region, and
wherein the plurality of peripheral contact structures are electrically connected to the peripheral circuit structure.

13. The vertical memory device of claim 12,
wherein the first block separation structure and the second block separation structure are spaced apart from each other at a first spacing in the first side region and at a second spacing in the memory array region, and
wherein the second spacing is greater than the first spacing.

14. The vertical memory device of claim 13, further comprising:
a third block separation structure disposed between the first block separation structure and the second block separation structure,
wherein the third block separation structure penetrating the third gate patterns, and
wherein the third block separation structure is shorter than the first block separation structure.

15. The vertical memory device of claim 14, further comprising:
a dam disposed between an end portion of the third block separation structure and the mold patterns.

16. The vertical memory device of claim 12, further comprising:
a plurality of first auxiliary separation structures penetrating vertically the third gate patterns between the first block separation structure and the second block separation structure in the memory array region, and
a plurality of second auxiliary separation structures penetrating vertically the third gate patterns between the first block separation structure and the second block separation structure in the second side region.

17. The vertical memory device of claim 16, further comprising:
a plurality of first isolation insulating layers connecting first end portions of the first auxiliary separation structures to end portions of the second auxiliary separation structures; and
a plurality of second isolation insulating layers connecting the first auxiliary separation structures to a lowermost mold pattern of the mold patterns,
wherein the second isolation insulating layers, the first auxiliary separation structures, the first isolation insulating layers and the second auxiliary separation structures connected as listed separate a lowermost gate pattern into a plurality of ground select lines.

18. A vertical memory device, comprising:
a substrate;
a plurality of first gate patterns on the substrate, stacked in a vertical direction, and having a plurality of first gate pad regions;
a plurality of vertical channel structures penetrating the first gate patterns;

a plurality of first gate contact structures each extending vertically to a corresponding first gate pad region of the first gate patterns;

a plurality of mold patterns stacked vertically on each other from the substrate, wherein the mold patterns each is positioned at the same height from the substrate with a corresponding gate pattern of the first gate patterns;

a plurality of peripheral contact structures penetrating the mold patterns;

a first block separation structure disposed between the first gate contact structures and the peripheral contact structures; and a first peripheral circuit connection wiring extending across the first block separation structure to connect one of the first gate contact structures to one of the peripheral contact structures.

19. The vertical memory device of claim 18, further comprising:

a third block separation structure disposed between the first block separation structure and the second block separation structure, wherein the third block separation structure penetrates the gate patterns, and wherein the third block separation structure is shorter than the first block separation structure, wherein the substrate includes a peripheral circuit structure, wherein the plurality of peripheral contact structures are electrically connected to the peripheral circuit structure, wherein the plurality of gate patterns include lower select lines on the substrate and having first pad regions, word lines having second pad regions and stacked vertically on each other from the lower select lines, and upper select lines on the word lines and having third pad regions, wherein the lower select lines are on the same level, wherein the upper select lines are on the same level, wherein a number of the upper select lines is greater than a number of the lower select lines, and wherein a single word line among the word lines vertically overlaps the lower select lines and the upper select lines.

20. The vertical memory device of claim 18, further comprising:

a dam disposed between an end portion of the third block separation structure and a portion of the mold patterns, wherein the dam is at a lower level than a lowermost word line among the word lines.

* * * * *